(12) United States Patent
Fujita et al.

(10) Patent No.: US 9,147,744 B2
(45) Date of Patent: Sep. 29, 2015

(54) SEMICONDUCTOR DEVICE AND MANUFACTURING METHOD OF SEMICONDUCTOR DEVICE

(71) Applicant: FUJITSU SEMICONDUCTOR LIMITED, Yokohama, Kanagawa (JP)

(72) Inventors: Kazushi Fujita, Kuwana (JP); Taiji Ema, Inabe (JP); Mitsuaki Hori, Kuwana (JP); Yasunobu Torii, Kuwana (JP)

(73) Assignee: FUJITSU SEMICONDUCTOR LIMITED, Yokohama (JP)

( * ) Notice: Subject to any disclaimer, the term of this patent is extended or adjusted under 35 U.S.C. 154(b) by 0 days.

(21) Appl. No.: 13/935,160

(22) Filed: Jul. 3, 2013

(65) Prior Publication Data
US 2014/0035046 A1 Feb. 6, 2014

(30) Foreign Application Priority Data

Aug. 3, 2012 (JP) .................................. 2012-172696

(51) Int. Cl.
| | |
|---|---|
| *H01L 21/70* | (2006.01) |
| *H01L 29/66* | (2006.01) |
| *H01L 27/088* | (2006.01) |
| *H01L 21/8234* | (2006.01) |
| *H01L 29/78* | (2006.01) |
| *H01L 21/8238* | (2006.01) |
| *H01L 27/092* | (2006.01) |

(52) U.S. Cl.
CPC .. *H01L 29/66477* (2013.01); *H01L 21/823412* (2013.01); *H01L 21/823462* (2013.01); *H01L 27/088* (2013.01); *H01L 29/6659* (2013.01); *H01L 29/7833* (2013.01); *H01L 21/823807* (2013.01); *H01L 21/823857* (2013.01); *H01L 27/0922* (2013.01)

(58) Field of Classification Search
USPC .......................................................... 438/514
See application file for complete search history.

(56) References Cited

U.S. PATENT DOCUMENTS

| 8,294,217 B2 | 10/2012 | Ema et al. | |
|---|---|---|---|
| 2004/0053456 A1* | 3/2004 | Jang ............................. | 438/197 |
| 2007/0059908 A1* | 3/2007 | Marshall et al. .............. | 438/585 |
| 2009/0011580 A1* | 1/2009 | Choi ............................. | 438/524 |
| 2009/0134468 A1* | 5/2009 | Tsuchiya et al. ............. | 257/368 |

(Continued)

FOREIGN PATENT DOCUMENTS

| JP | 63-169059 A | 7/1988 |
|---|---|---|
| JP | 2002-009170 A | 1/2002 |
| JP | 2012-079743 A | 4/2012 |

*Primary Examiner* — Cuong Q Nguyen
*Assistant Examiner* — Nishath Yasmeen
(74) *Attorney, Agent, or Firm* — Westerman, Hattori, Daniels & Adrian, LLP

(57) ABSTRACT

A manufacturing method of a semiconductor device according to a disclosed embodiment includes: implanting a first impurity into a first region of a semiconductor substrate, forming a semiconductor layer on the semiconductor substrate, forming a trench in the semiconductor layer and the semiconductor substrate, forming an isolation insulating film in the trench, implanting a second impurity into a second region of the semiconductor layer, forming a first gate insulating film and a first gate electrode in the first region, forming a second gate insulating film and a second gate electrode in the second region, forming a first source region and a first drain region at both sides of the first gate electrode, and forming a second source region and a second drain region at both sides of the second gate electrode.

10 Claims, 54 Drawing Sheets

(56) References Cited

U.S. PATENT DOCUMENTS

2011/0042730 A1* 2/2011 Tajiri et al. .................... 257/288
2011/0248352 A1* 10/2011 Shifren et al. ................ 257/369
2013/0020650 A1 1/2013 Ema et al.

* cited by examiner

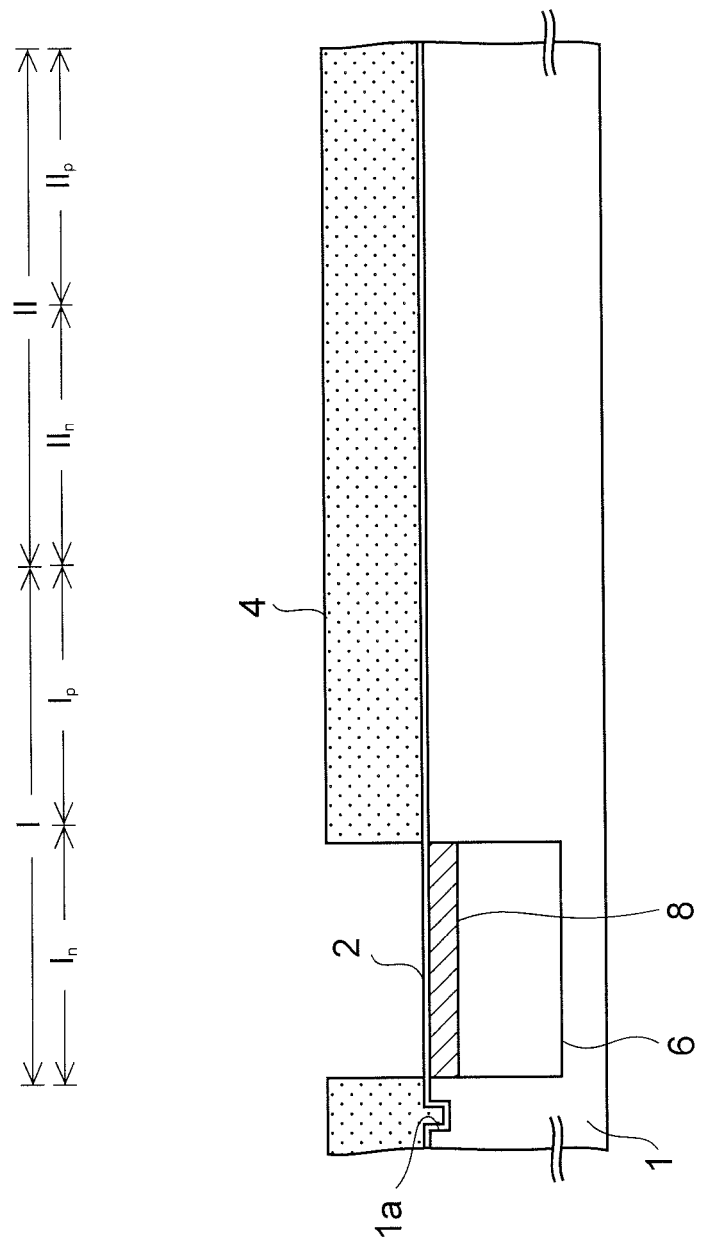

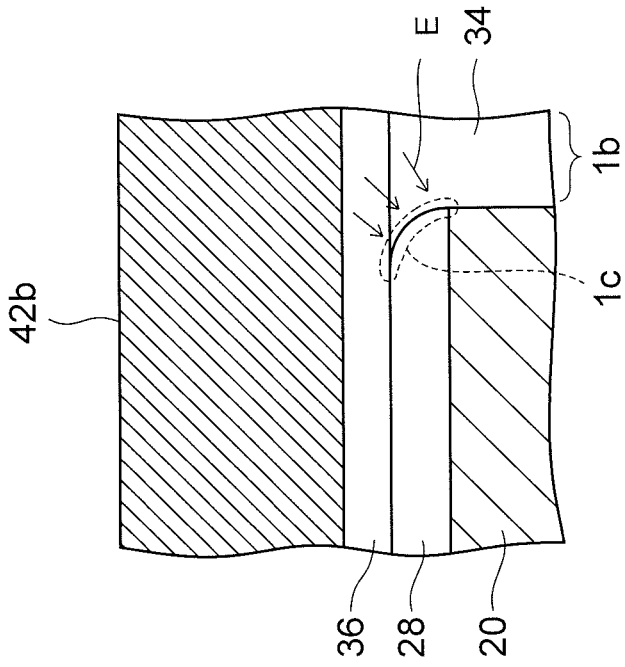
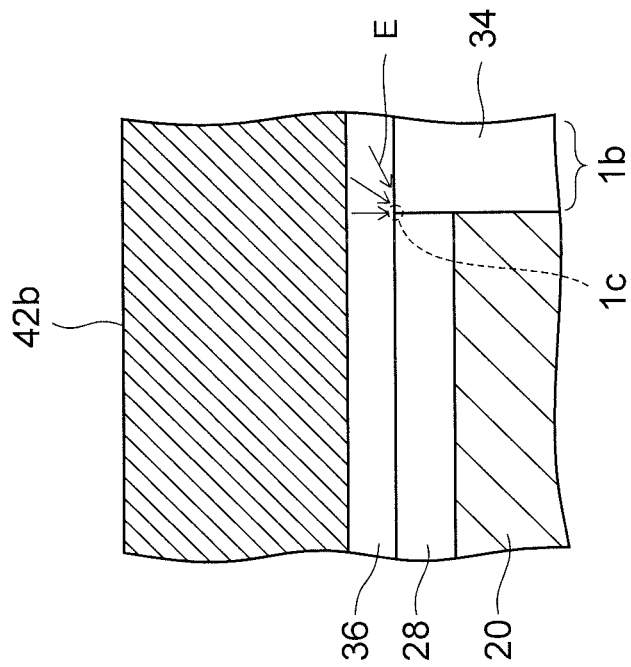

SEMICONDUCTOR DEVICE AND MANUFACTURING METHOD OF SEMICONDUCTOR DEVICE

CROSS-REFERENCE TO RELATED APPLICATION

This application is based upon and claims the benefit of priority of the prior Japanese Patent Application No. 2012-172696, filed on Aug. 3, 2012, the entire contents of which are incorporated herein by reference.

FIELD

The embodiments discussed herein are related to a semiconductor device and a manufacturing method of a semiconductor device.

BACKGROUND

A semiconductor device such as an LSI includes various MOS (Metal oxide Semiconductor) transistors. Impurities for adjusting the threshold voltage are implanted into channels of these MOS transistors. However, the impurities are not homogeneously distributed in the channels. This causes a positional variation of the impurities. Such a variation is called RDF (Random Dopant Fluctuation).

In the generation having a long gate length, the RDF has a small influence on the threshold voltage. However, the threshold voltage becomes more sensitive to the RDF as the gate length becomes shorter. The threshold voltage easily varies due to the RDF.

In order to suppress the variation of the threshold voltage due to the RDF, it is effective to use as a channel a non-doped epitaxial silicon layer with the low impurity concentration.

Further, the MOS transistor which uses such a non-doped epitaxial silicon layer still has room for improvement in the performance. Note that, the technologies related to the present application are disclosed in Japanese Laid-open Patent Publications Nos. 2012-79743, 2002-9170, and S63-169059.

SUMMARY

According to one aspect of the embodiments below, there is provided a manufacturing method of a semiconductor device, including implanting a first impurity into a first region of a semiconductor substrate including the first region and a second region, forming a semiconductor layer on the upper surface of the semiconductor substrate, forming a trench in the semiconductor layer and the semiconductor substrate, forming an isolation insulating film in the trench, implanting a second impurity into the semiconductor layer in the second region, forming a first gate insulating film on the semiconductor layer in the first region, forming a second gate insulating film on the semiconductor layer in the second region, forming a first gate electrode on the first gate insulating film, forming a second gate electrode on the second gate insulating film, forming a first source region and a first drain region in the semiconductor layer at both sides of the first gate electrode, the first source region and the first drain region having a conductivity type opposite to a conductivity type of the first impurity, and forming a second source region and a second drain region in the semiconductor layer at both sides of the second gate electrode, the second source region and the second drain region having a conductivity type opposite to a conductivity type of the second impurity.

The object and advantages of the invention will be realized and attained by means of the elements and combinations particularly pointed out in the claims.

It is to be understood that both the foregoing general description and the following detailed description are exemplary and explanatory and are not restrictive of the invention.

BRIEF DESCRIPTION OF THE DRAWINGS

FIG. 5A is a cross-sectional view along a Y-Y line in FIG. 4, and FIG. 5B is a cross-sectional view of an element isolation trench with a rounded shoulder portion;

DESCRIPTION OF EMBODIMENTS

Prior to explanation for the present embodiments, evaluation results performed by the inventor of the present application will be explained.

Figure 1A:
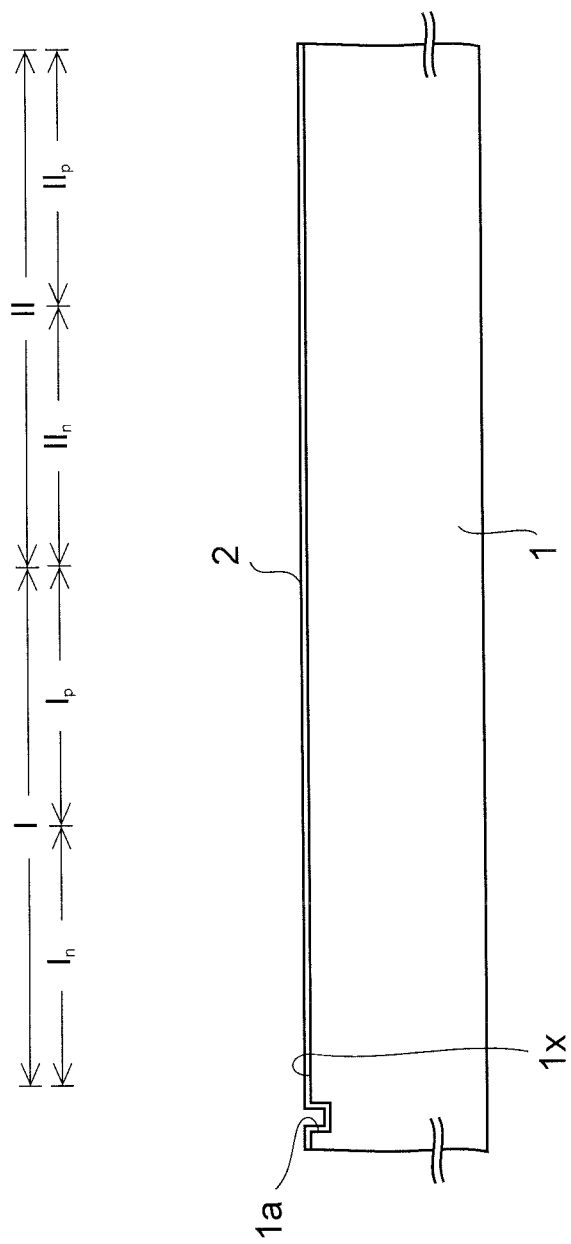
FIGS. 1A to 1R are cross-sectional views of semiconductor devices used for evaluation in the course of manufacturing semiconductor devices.
Figure 1C:
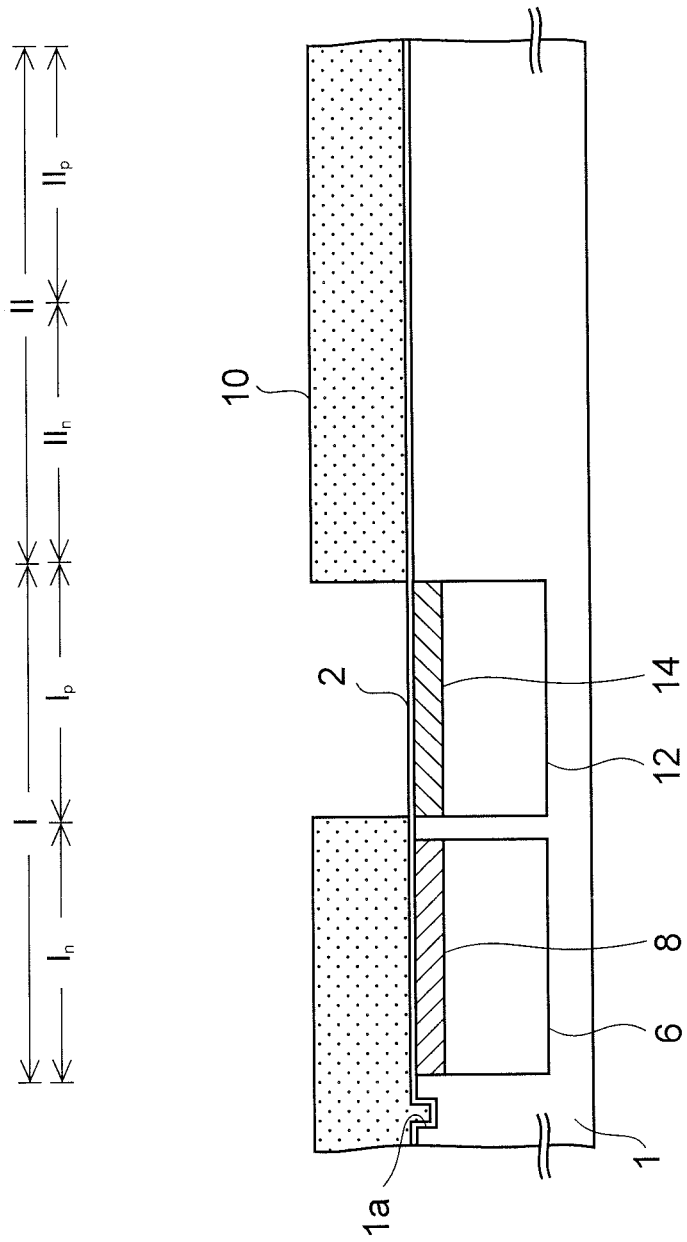
Figure 1D:
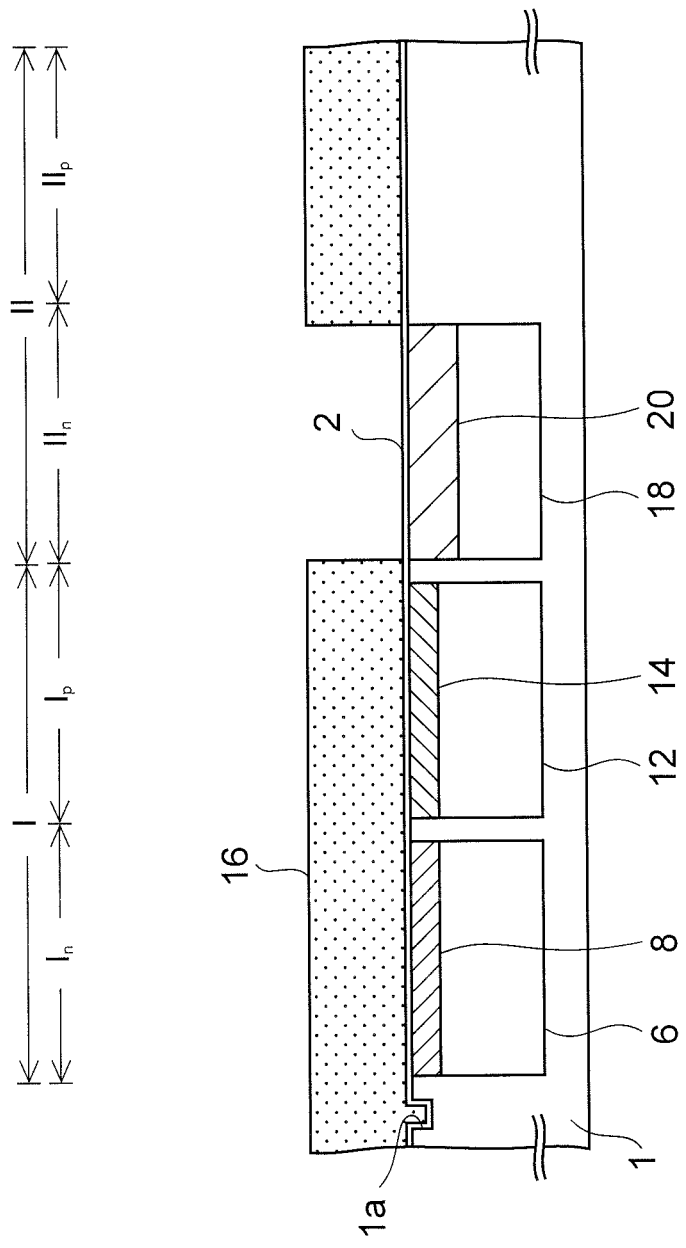
Figure 1E:
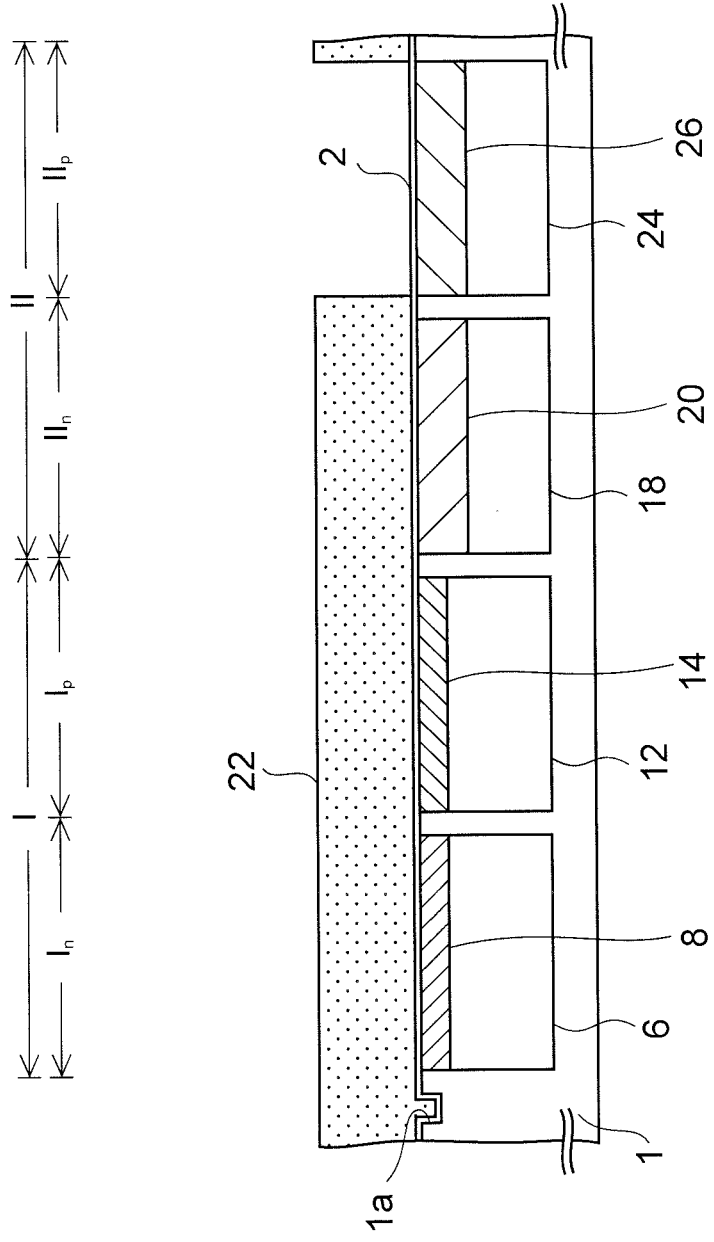
Figure 1F:
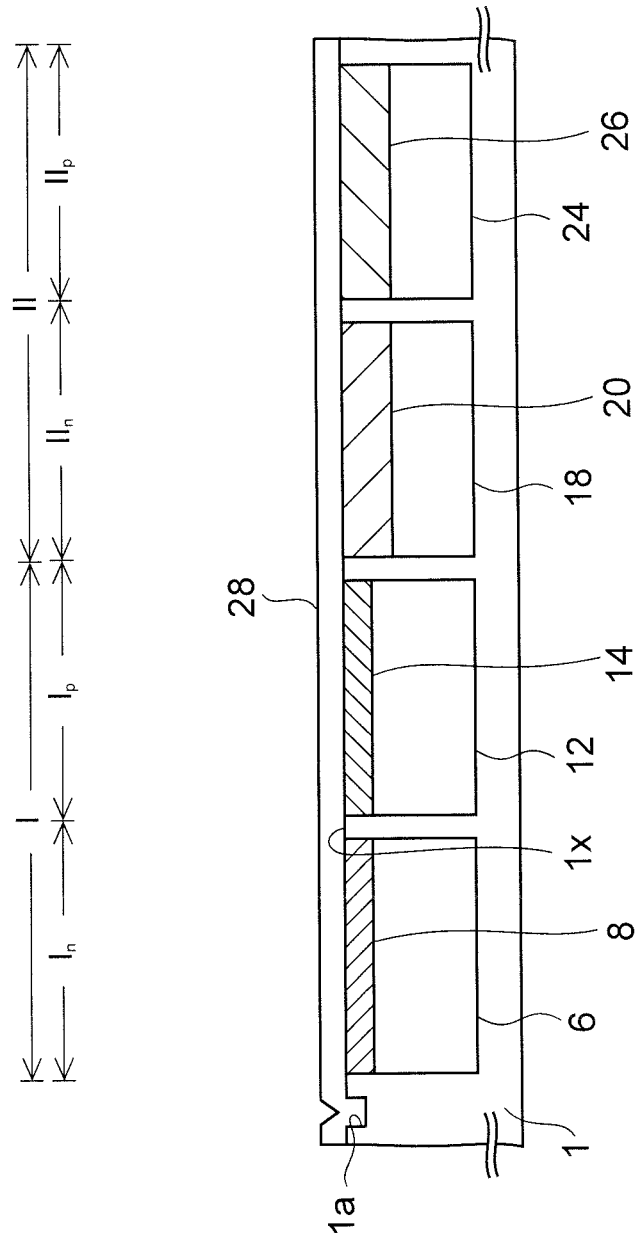
Figure 1G:
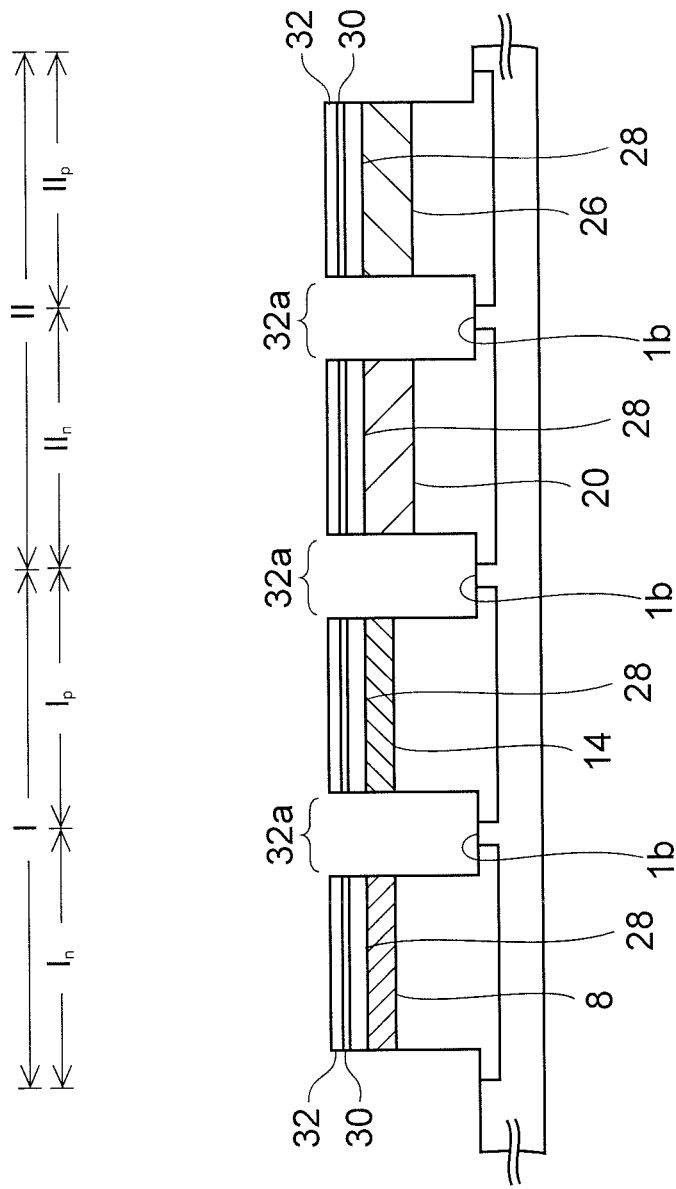
Figure 1H:
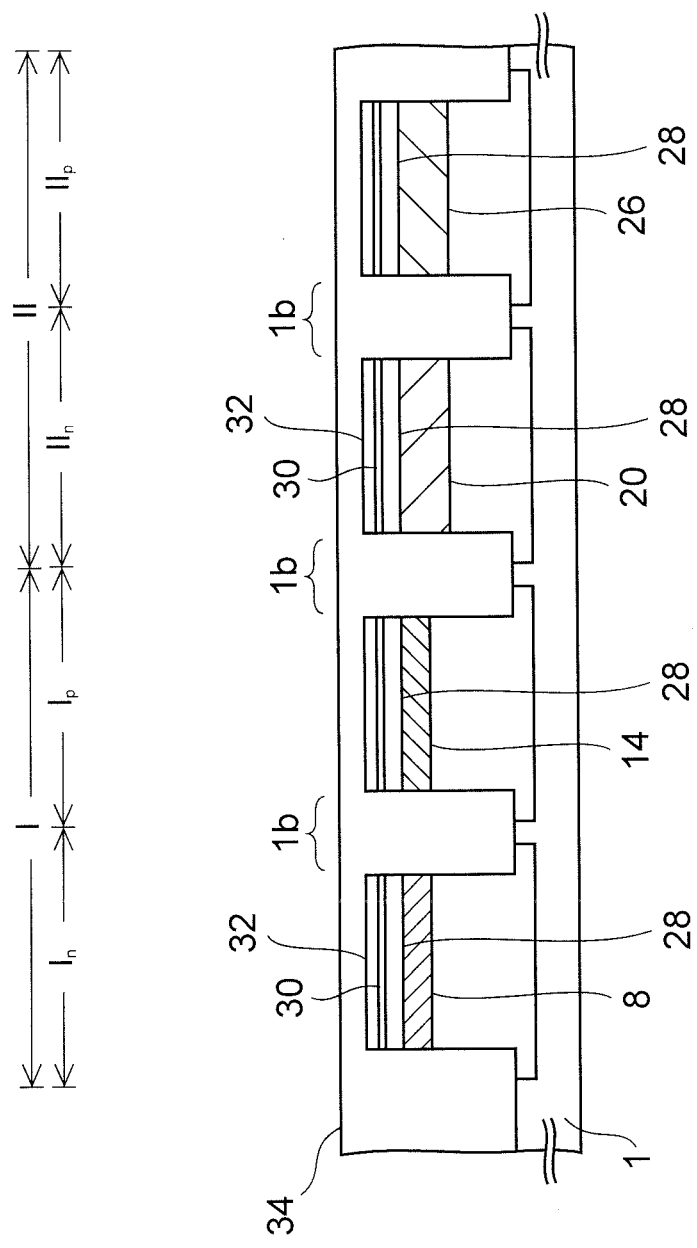
Figure 1I:
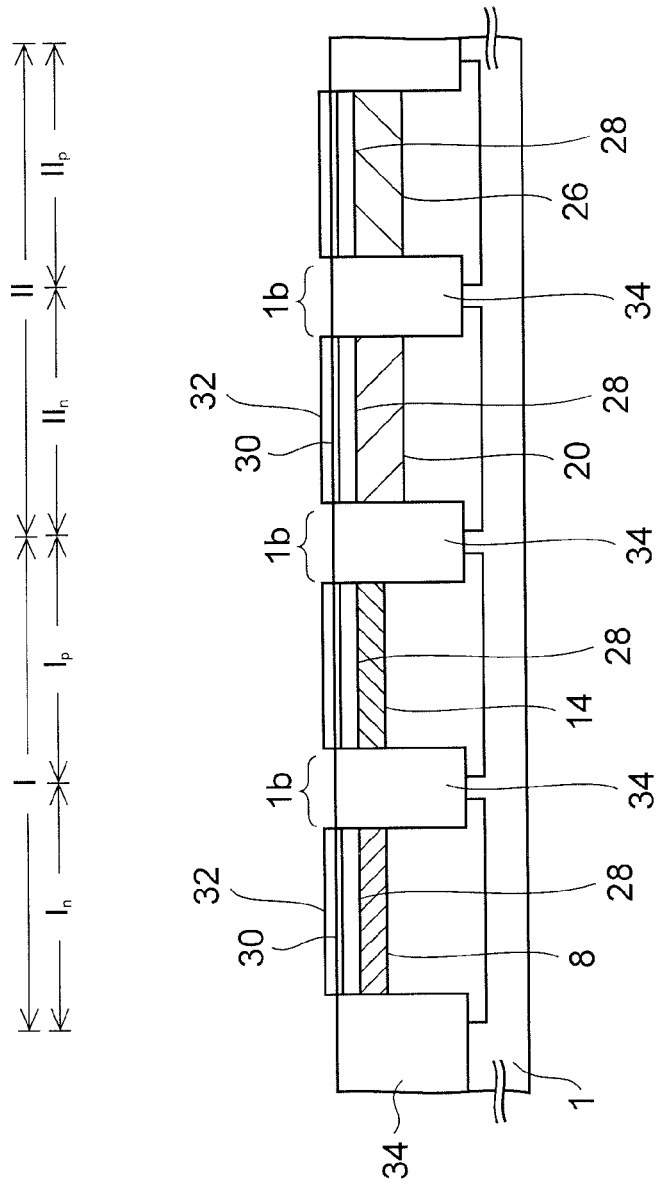
Figure 1J:
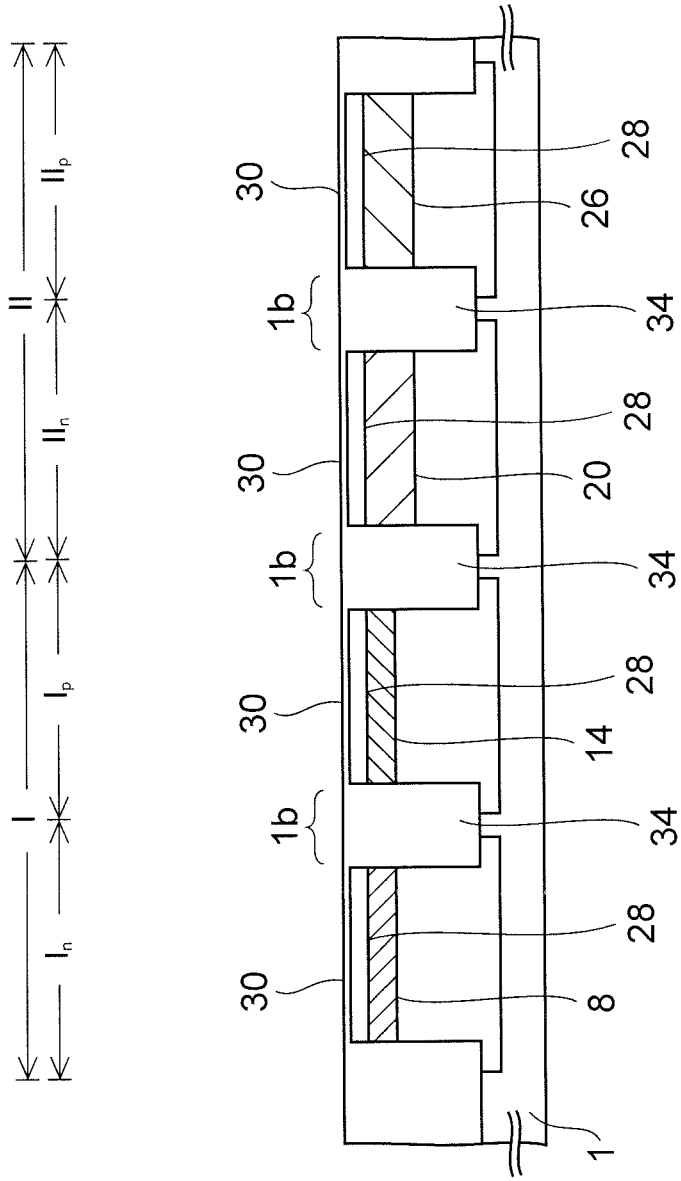
Figure 1K:
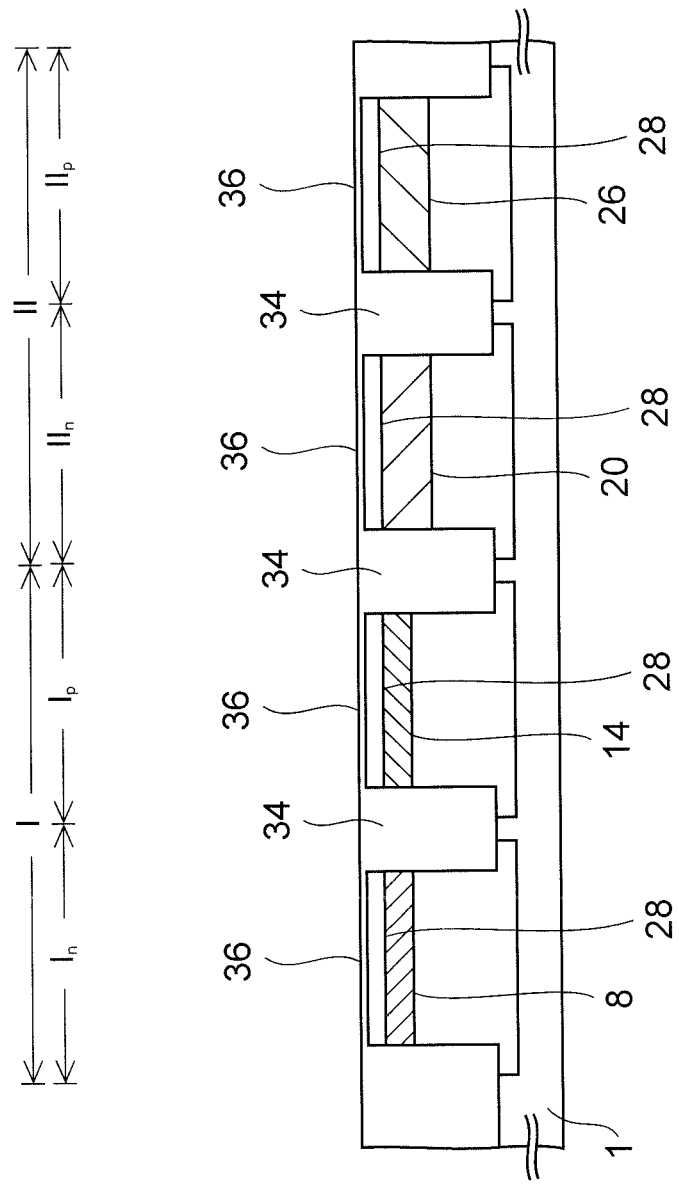
Figure 1L:
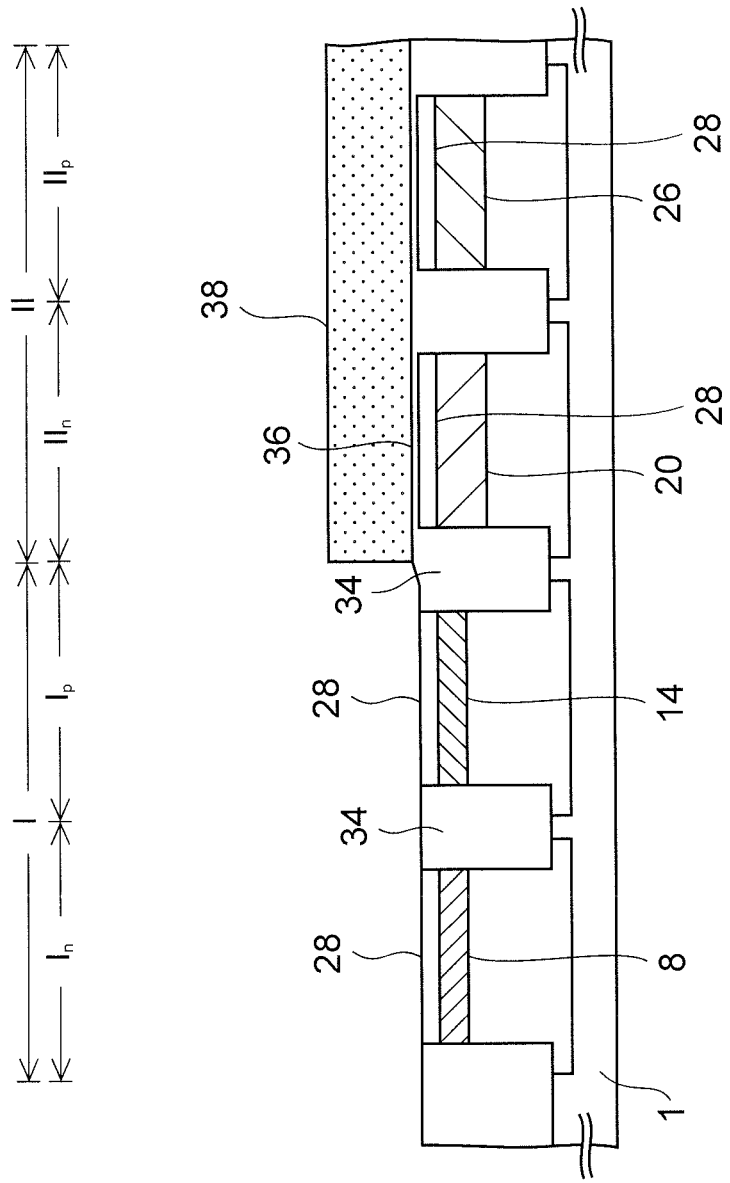
Figure 1M:
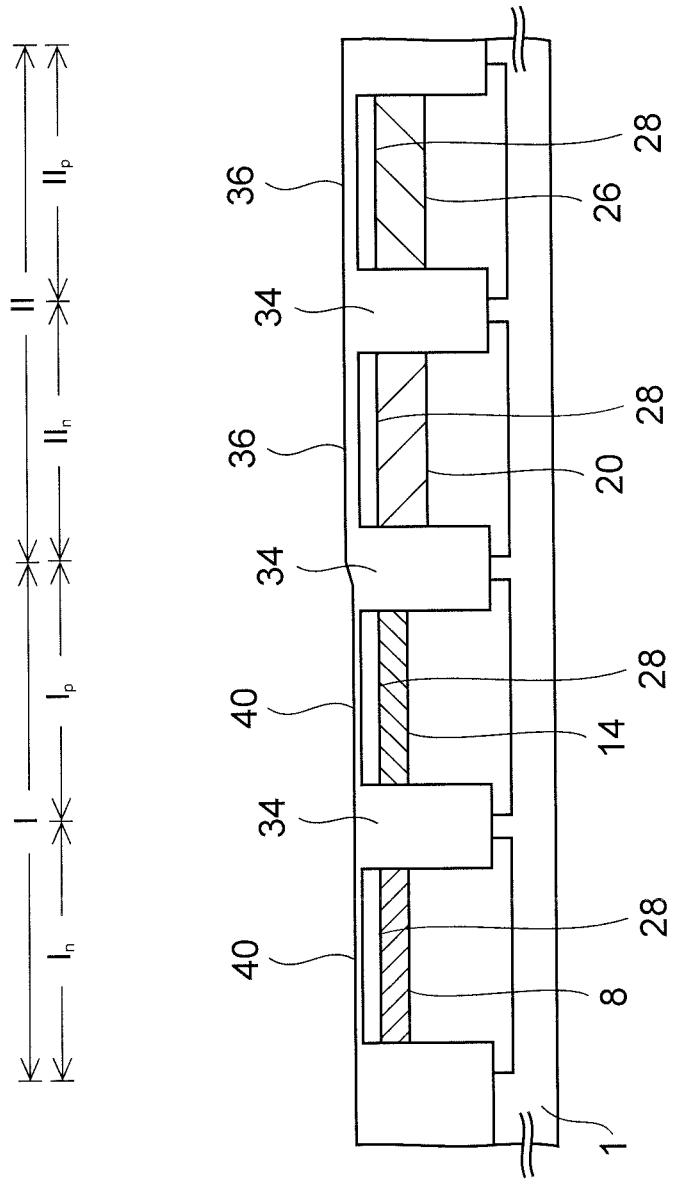
Figure 1N:
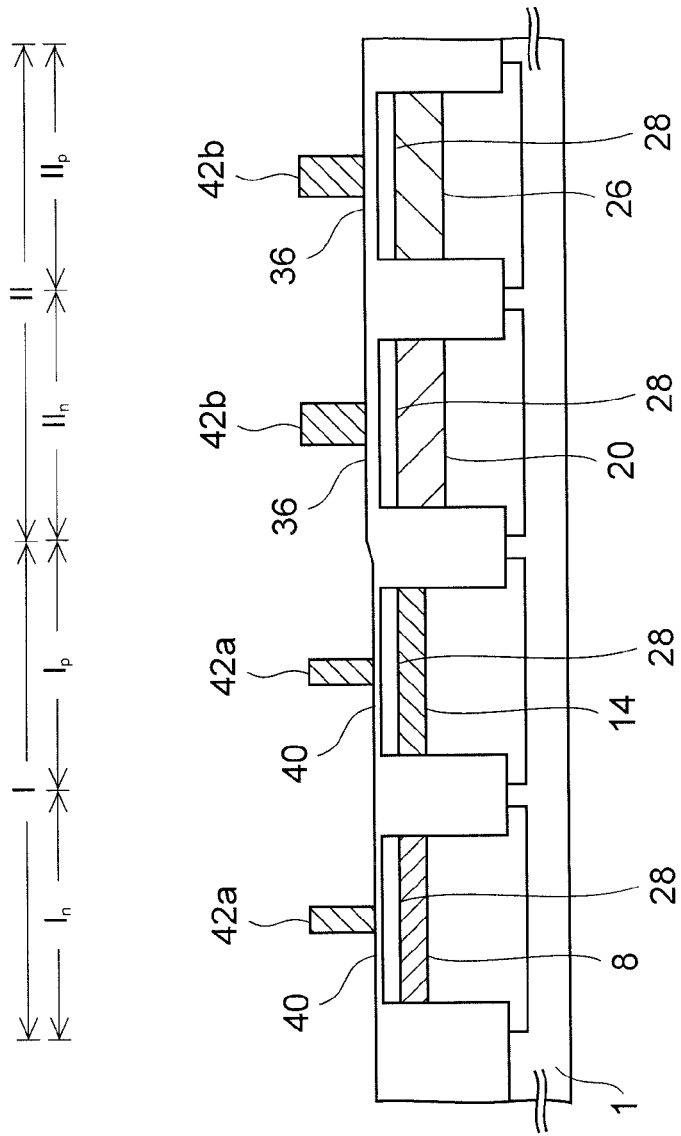
Figure 10:
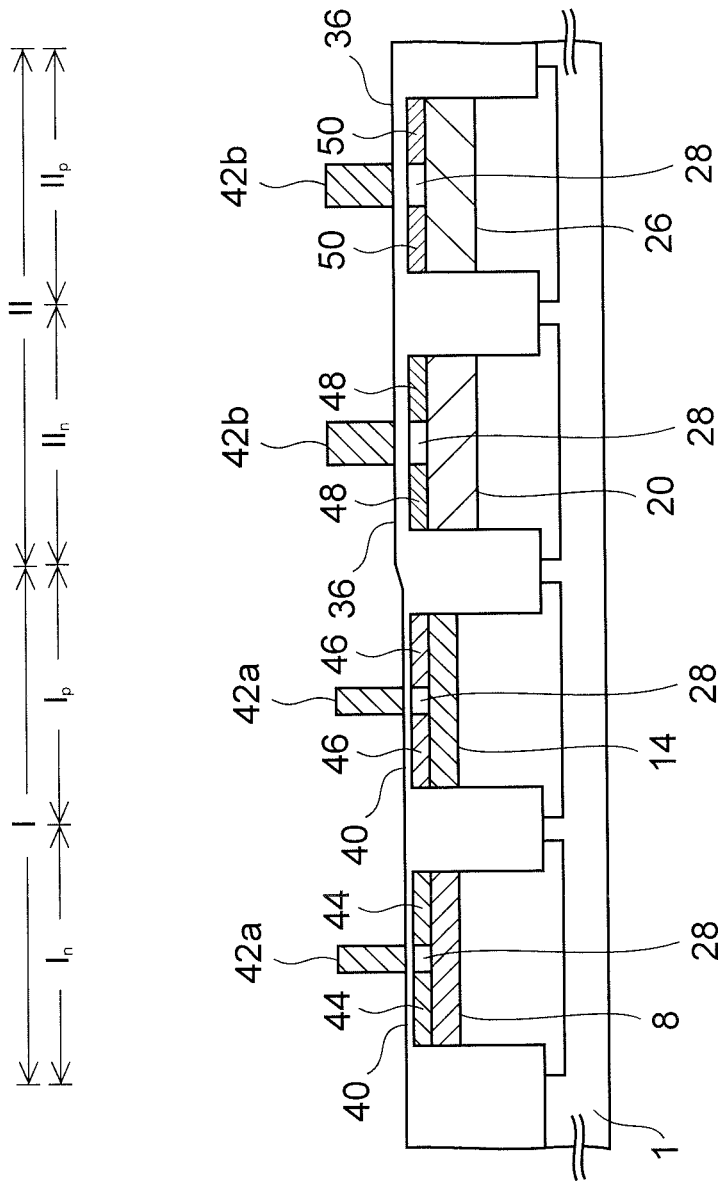
FIGS. 10A to 10C are graphs obtained as a result of examination of how a Vg-Id curve of a first MOS transistor changes depending on the dose amount of carbon which is ion implanted into a first p-type impurity region in the first embodiment.
Figure 1P:
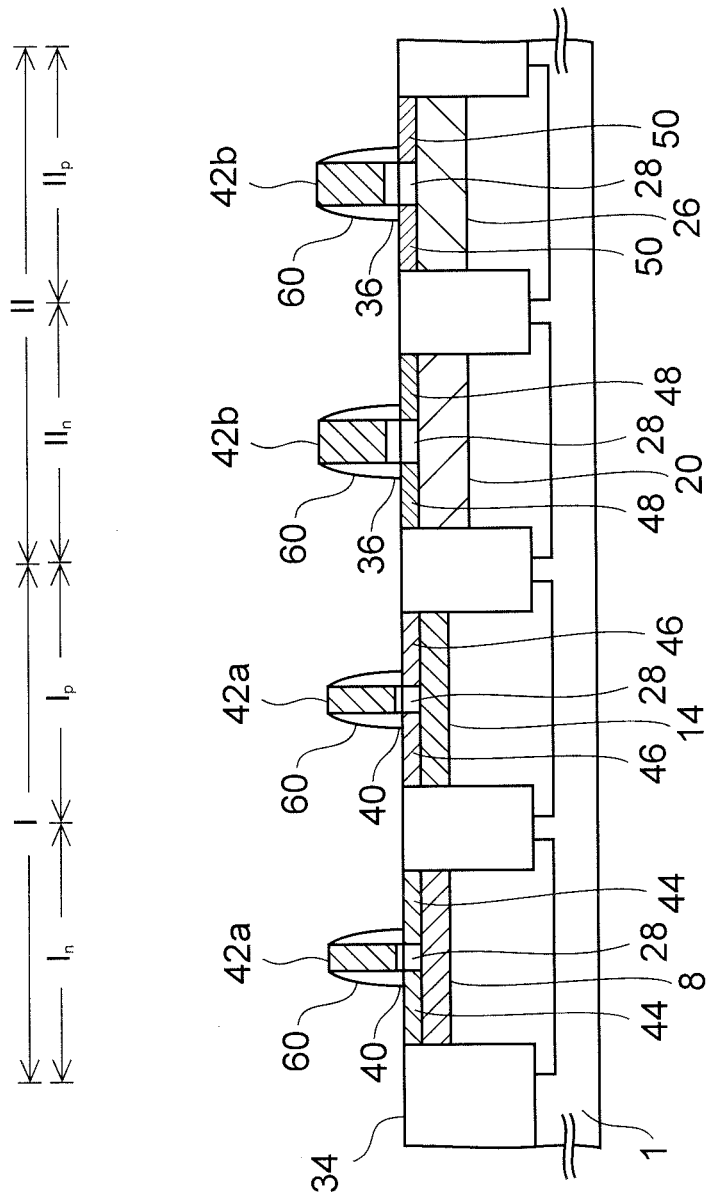
Figure 1Q:
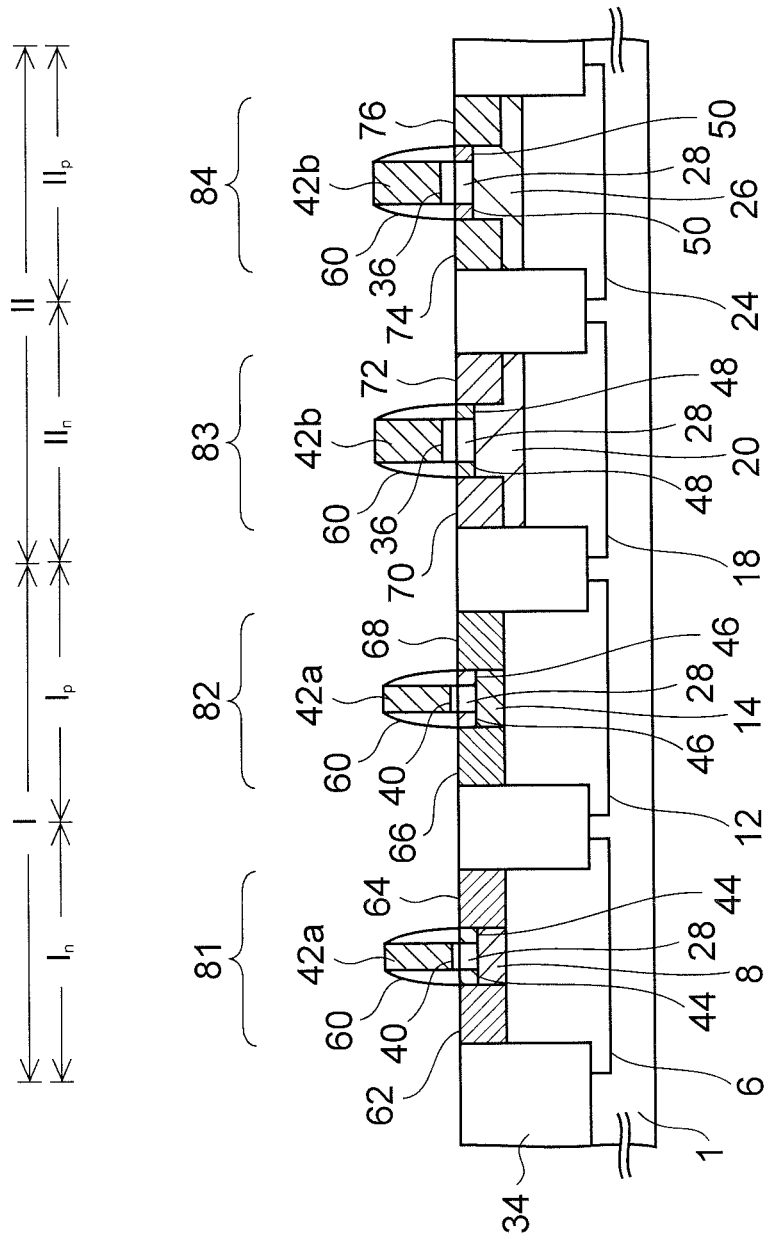
Figure 1R:
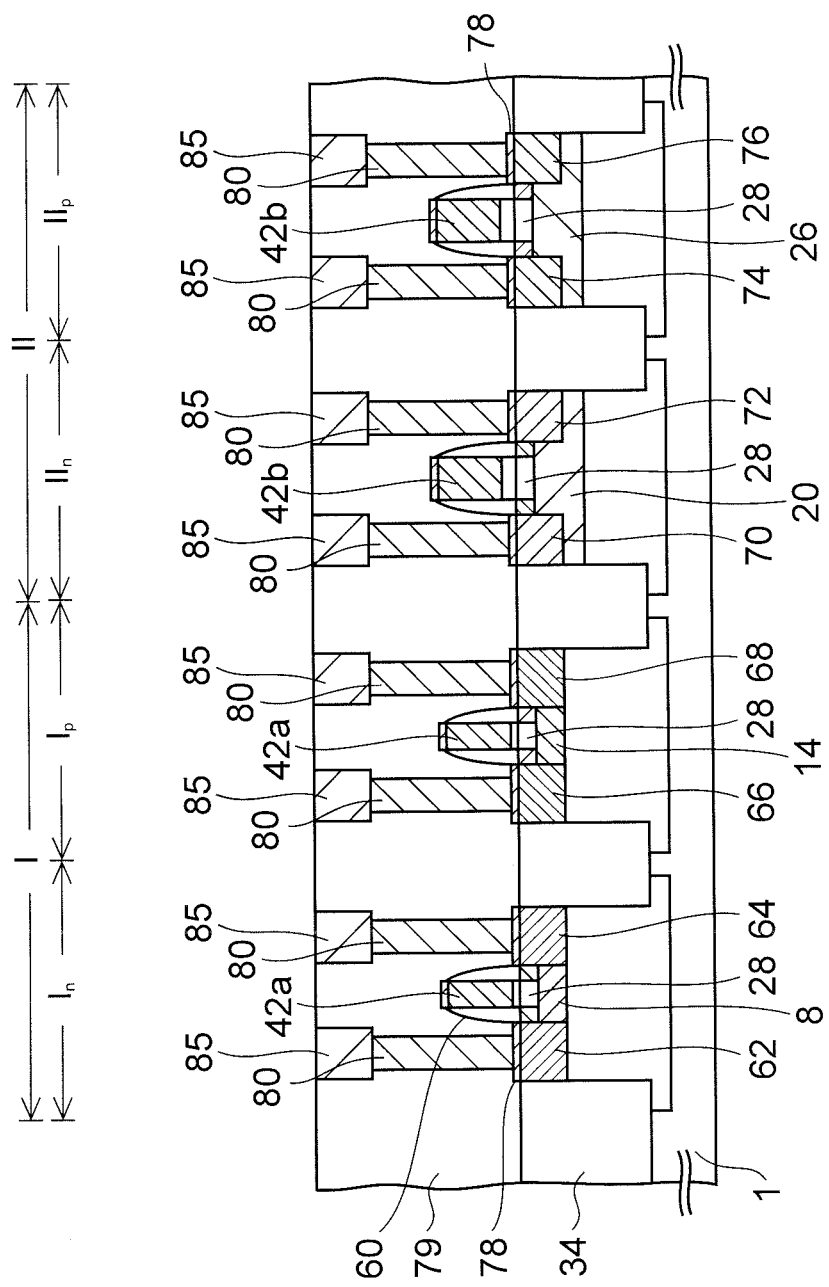

FIGS. 1A to 1R are cross-sectional views of semiconductor devices used for the evaluation in the course of manufacturing semiconductor devices. The semiconductor device uses a semiconductor layer formed by an epitaxial growth method as a channel, and is manufactured as follows.

Firstly, as illustrated in FIG. 1A, a silicon substrate provided with a first region I and a second region II is prepared as a semiconductor substrate 1.

Of these regions, the first region I is a region where a low-voltage transistor is to be formed, and is subdivided into a first p-type transistor formation region $I_p$ and a first n-type transistor formation region $I_n$. Meanwhile, the second region II is a region where a high-voltage transistor is to be formed, and is subdivided into a second p-type transistor formation region $II_p$ and a second n-type transistor formation region $II_n$.

Further, an upper surface $1x$ of the semiconductor substrate 1 is patterned to form an alignment mark $1a$. The alignment mark $1a$ is used in each photolithography process, which is described later, for alignment between an exposure device and the semiconductor substrate 1.

Thereafter, the upper surface $1x$ of the semiconductor substrate 1 is thermally oxidized or is immersed into a solution containing an oxidizing agent to form an oxide film 2 having a thickness of about 0.5 nm to 10 nm.

Next, as illustrated in FIG. 1B, a first resist film 4 is formed on the oxide film 2 by photolithography. Further, a first p well 6 and a first p-type impurity region 8 are formed in the first n-type transistor formation region $I_n$ by ion implantation using the first resist film 4 as a mask.

The first p well 6 is formed by ion implantation of boron as a p-type impurity into the semiconductor substrate 1 from the four directions tilted with respect to the substrate normal direction under the condition where the acceleration energy is 150 keV and the dose amount is $7.5 \times 10^{12}$ cm$^{-2}$.

Moreover, the first p-type impurity region 8 functions to adjust the threshold voltage of a transistor to be formed later in the first n-type transistor formation region $I_n$, and is formed by ion implantation of germanium, carbon, and a p-type impurity in this order.

Among them, the ion implantation of germanium is performed under the condition where the acceleration energy is 50 keV and the dose amount is $5 \times 10^{14}$ cm$^{-2}$, and the ion implantation of carbon is performed under the condition where the acceleration energy is 5 keV and the dose amount is $5 \times 10^{14}$ cm$^{-2}$. Further, the ion implantation of the p-type impurity is performed such that boron is implanted under the condition where the acceleration energy is 20 keV and the dose amount is $1 \times 10^{13}$ cm$^{-2}$ and boron is implanted under the condition where the acceleration energy is 10 keV and the dose amount is $1 \times 10^{13}$ cm$^{-2}$. In addition, boron difluoride ($BF_2$) as a p-type impurity is ion implanted under the condition where the acceleration energy is 10 keV and the dose amount is $1 \times 10^{13}$ cm$^{-2}$.

Performing the ion implantation of germanium firstly in this manner results in an amorphous surface layer of the semiconductor substrate 1. This prevents channeling of boron, and makes it more likely that carbon is arranged in lattice points of the semiconductor substrate 1. Then, the carbon arranged in the lattice points functions to suppress diffusion of boron.

Moreover, the first p-type impurity region 8 formed in this manner also functions to prevent punch through, in addition to the function of adjusting the threshold voltage of the transistor.

Thereafter, the first resist film 4 is removed.

Next, as illustrated in FIG. 1C, a second resist film 10 is formed on the oxide film 2 by photolithography, and a first n well 12 and a first n-type impurity region 14 are formed in the first p-type transistor formation region $I_p$ by ion implantation using the second resist film 10 as a mask.

The first n well 12 is formed by ion implantation of phosphorus as an n-type impurity into the semiconductor substrate 1 from the four directions tilted with respect to the substrate normal direction under the condition where the acceleration energy is 360 keV and the dose amount is $7.5 \times 10^{12}$ cm$^{-2}$.

Moreover, the first n-type impurity region 14 functions to adjust the threshold voltage of a transistor to be formed later in the first p-type transistor formation region $I_p$, and is formed by ion implantation of antimony as an n-type impurity. The antimony is implanted at a plurality of times under the following conditions. The first condition is that the acceleration energy is 130 keV and the dose amount is $0.6 \times 10^{13}$ cm$^{-2}$, the second condition is that the acceleration energy is 80 keV and the dose amount is $0.9 \times 10^{13}$ cm$^{-2}$, and the third condition is that the acceleration energy is 20 keV and the dose amount is $1 \times 10^{13}$ cm$^{-2}$.

Thereafter, the second resist film 10 is removed.

Subsequently, as illustrated in FIG. 1D, a third resist film 16 is formed on the oxide film 2 by photolithography. Further, a second p well 18 and a second p-type impurity region 20 are formed in the second n-type transistor formation region $II_n$ by ion implantation using the third resist film 16 as a mask.

The second p well 18 is formed by ion implantation of boron as a p-type impurity into the semiconductor substrate 1 from the four directions tilted with respect to the substrate normal direction under the condition where the acceleration energy is 150 keV and the dose amount is $7.5 \times 10^{12}$ cm$^{-2}$.

Meanwhile, the second p-type impurity region 20 functions to adjust the threshold voltage of a transistor to be formed later in the second n-type transistor formation region $II_n$, and is formed by ion implantation of boron under the condition where the acceleration energy is 10 keV and the dose amount is $2 \times 10^{12}$ cm$^{-2}$.

Thereafter, the third resist film 16 is removed.

Next, as illustrated in FIG. 1E, a fourth resist film 22 is formed on the oxide film 2 by photolithography, and a second n well 24 and a second n-type impurity region 26 are formed in the second p-type transistor formation region $II_p$ by ion implantation using the fourth resist film 22 as a mask.

The second n well 24 is formed by ion implantation of phosphorus as an n-type impurity into the semiconductor substrate 1 from the four directions tilted with respect to the substrate normal direction under the condition where the acceleration energy is 360 keV and the dose amount is $7.5 \times 10^{12}$ cm$^{-2}$.

Moreover, the second n-type impurity region 26 functions to adjust the threshold voltage of a transistor to be formed later in the second p-type transistor formation region $II_p$, and is formed by ion implantation of arsenic as an n-type impurity. The implantation condition of the arsenic is that the acceleration energy is 100 keV and the dose amount is $1 \times 10^{12}$ cm$^{-2}$.

Moreover, phosphorus may be used as an n-type impurity.

Thereafter, the fourth resist film 22 is removed.

Next, steps to obtain a cross-sectional structure illustrated in FIG. 1F will be explained.

Firstly, thermal treatment is performed with respect to the semiconductor substrate 1 in an inert atmosphere to recrystallize the amorphous layer generated in the semiconductor substrate 1 by the ion implantation of the germanium described above. For example, in a nitrogen atmosphere, thermal treatment is performed at 600° C. for 150 seconds, and then thermal treatment is performed at 1000° C. for 0.1 second.

Next, the oxide film 2 having been damaged by each ion implantation in FIGS. 1B to 1E is removed by wet etching with a hydrofluoric acid solution.

Further, on the upper surface $1x$ of the semiconductor substrate 1, a non-doped silicon layer serving as a semiconductor layer 28 is formed in such a manner to have a thickness of about 25 nm by an epitaxial growth method using a mixed gas of a silane ($SiH_4$) gas and a hydrogen gas as a deposition gas.

Subsequently, as illustrated in FIG. 1G, the surface of the semiconductor layer 28 is oxidized to form an oxide film 30 having a thickness of approximately 3 nm. In addition, a silicon nitride film 32 is formed in such a manner to have a thickness of approximately 70 nm on the oxide film 30 by a CVD method.

Further, openings 32a are formed in the oxide film 30 and the silicon nitride film 32 by the photolithography method, and in addition, the semiconductor layer 28 and the semiconductor substrate 1 are dry-etched to form element isolation trenches 1b between the regions $I_n$, $I_p$, $II_n$, and $II_p$.

Next, as illustrated in FIG. 1H, an oxidized silicon film serving as an element isolation insulating film 34 is formed in the element isolation trenches 1b and on the silicon nitride film 32 by a high-density plasma CVD method, and the element isolation trenches 1b are entirely filled with the element isolation insulating film 34.

Subsequently, as illustrated in FIG. 1I, the redundant element isolation insulating film 34 on the silicon nitride films 32 is polished and removed by a CMP (Chemical Mechanical Polishing) method to leave the element isolation insulating film 34 only in the element isolation trenches 1b.

Thereafter, the upper surface of the element isolation insulating film 34 is lowered by wet etching using a hydrofluoric acid solution.

The first p-type transistor formation region $I_p$, the first n-type transistor formation region $I_n$, the second p-type transistor formation region $II_p$, and the second n-type transistor formation region $II_n$ described above are electrically isolated from one another by the element isolation insulating film 34.

Next, as illustrated in FIG. 1J, the silicon nitride film 32 is removed by wet etching with a hot phosphoric acid.

Next, as illustrated in FIG. 1K, after the oxide film 30 described above is wet etched with the hydrofluoric acid solution, the surface of the semiconductor layer 28 is thermally oxidized to form a first thermal oxide film 36 having a thickness of approximately 7 nm. The first thermal oxide film 36 is an example of a second gate insulating film, and is formed under the condition where the substrate temperature is at 750° C. and the thermal treatment time is for 52 minutes.

Next, as illustrated in FIG. 1L, a fifth resist film 38 which covers the second region II is formed on the first thermal oxide film 36. Further, the fifth resist film 38 is used as a mask to remove the first thermal oxide film 36 in the first region I by wet etching with a hydrofluoric acid solution.

After completion of the wet etching, the fifth resist film 38 is removed.

Thereafter, as illustrated in FIG. 1M, the surface of the semiconductor layer 28 is thermally oxidized again by RTO (Rapid Thermal Oxidation) to form a second thermal oxide film 40 having a thickness of about 2 nm in the first region I. The second thermal oxide film 40 is an example of a first gate insulating film.

Moreover, the condition where the substrate temperature is at 810° C. and the thermal treatment time is for eight seconds is employed as the deposition condition of the second thermal oxide film 40.

At this step, the thermal oxidation increases the thickness of the first thermal oxide film 36. Thus, the first thermal oxide film 36 having a film thickness thicker than the second thermal oxide film 40 is obtained.

Thereafter, as illustrated in FIG. 1N, each polycrystalline silicon film having a film thickness of about 100 nm is formed on each of the first thermal oxide film 36 and the second thermal oxide film 40 by the CVD method. Further, the polycrystalline silicon films are patterned to form first gate electrodes 42a in the first region I, and to simultaneously form second gate electrodes 42b in the second region II.

Next, steps to obtain a cross-sectional structure illustrated in FIG. 1O will be explained.

Firstly, phosphorus as an n-type impurity is ion implanted into the second n-type transistor formation region $II_n$ to form second n-type extensions 48 at both sides of the second gate electrode 42b in the semiconductor layer 28. The condition of the ion implantation is that, for example, the acceleration energy is 35 keV and the dose amount is $3 \times 10^{13}$ $cm^{-2}$.

Next, arsenic as an n-type impurity is ion implanted into the first n-type transistor formation region $I_n$ to form first n-type extensions 44 at both sides of the first gate electrode 42a in the semiconductor layer 28. The condition of the ion implantation is that, for example, the acceleration energy is 1 keV and the dose amount is $8 \times 10^{14}$ $cm^{-2}$.

Subsequently, under the condition where the acceleration energy is 0.3 keV and the dose amount is $4 \times 10^{14}$ $cm^{-2}$, boron as a p-type impurity is ion implanted into the first p-type transistor formation region $I_p$ and the second p-type transistor formation region $II_p$. Therefore, first p-type extensions 46 are formed at both sides of the first gate electrode 42a in the semiconductor layer 28, and second p-type extensions 50 are simultaneously formed at both sides of the second gate electrode 42b in the semiconductor layer 28.

Note that, the p-type impurity and the n-type impurity described above are separately ion implanted using resist films which are not illustrated.

Next, as illustrated in FIG. 1P, an insulating film is formed in each of the first region I and the second region II, and the insulating film is etched back by RIE (Reactive Ion Etching) leaving the insulating film on sides of each of the first gate electrode 42a and the second gate electrode 42b as insulating side walls 60. As the insulating film, an oxidized silicon film having a film thickness of approximately 80 nm and formed under the condition where the substrate temperature is at 520° C. is employed.

Moreover, in the etching back described above, portions of the first thermal oxide film 36 and the second thermal oxide film 40 which are not covered by the gate electrodes 42a and 42b and the insulating side walls 60 are also etched. Accordingly, after the completion of the etching back, the surface of the semiconductor layer 28 is exposed.

Next, steps to obtain a cross-sectional structure illustrated in FIG. 1Q will be explained.

Firstly, phosphorus as an n-type impurity is ion implanted into each of the first n-type transistor formation region $I_n$ and the second n-type transistor formation region $II_n$.

With this, a first n-type source region 62 and a first n-type drain region 64 are formed at both sides of the first gate electrode 42a in the semiconductor layer 28 in the first n-type transistor formation region I. Further, simultaneously with this, a second n-type source region 70 and a second n-type drain region 72 are formed at both sides of the second gate electrode 42b in the semiconductor layer 28 in the second n-type transistor formation region $II_n$.

As for the condition of the ion implantation, for example, the condition where the acceleration energy is 8 keV and the dose amount is $1.2 \times 10^{16}$ $cm^{-2}$ may be employed.

Next, boron as a p-type impurity is ion implanted into each of the first p-type transistor formation region $I_p$ and the second p-type transistor formation region $II_p$.

With the ion implantation, a first p-type source region 66 and a first p-type drain region 68 are formed at both sides of the first gate electrode 42a in the semiconductor layer 28 in the first p-type transistor formation region $I_p$. Further, simultaneously with this, a second p-type source region 74 and a second p-type drain region 76 are formed at both sides of the second gate electrode 42b in the semiconductor layer 28 in the second p-type transistor formation region $II_p$.

As for the condition of the ion implantation, for example, the condition where the acceleration energy is 4 keV and the dose amount is $6 \times 10^{15}$ cm$^{-2}$ may be employed.

Note that, the p-type impurity and the n-type impurity described above are separately ion implanted using resist films which are not illustrated.

Thereafter, under the condition where the substrate temperature is at 1025° C., the semiconductor substrate 1 is subjected to RTA (Rapid Thermal Anneal) to activate all the impurities described above.

With the foregoing steps, the basic structures of first to fourth MOS transistors 81 to 84 have been completed. Among these transistors, the first MOS transistor 81 and the third MOS transistor 83 are NMOS transistors, and the second MOS transistor 82 and the fourth MOS transistor 84 are PMOS transistors.

Moreover, the third and fourth MOS transistors 83 and 84 are driven by the voltage higher than that of the first and second MOS transistors 81 and 82. Accordingly, the first thermal oxide films 36 provided as gate insulating films for these third and fourth MOS transistors 83 and 84 have a film thickness thicker than the second thermal oxide film 40.

Next, steps to obtain a cross-sectional structure illustrated in FIG. 1R will be explained.

Firstly, a high-melting point metal layer such as a cobalt layer is formed in each of the first region I and the second region II by a sputtering method. Further, the high-melting point metal layers are heated to be reacted with silicon to form metal silicide layers 78 at the sides of each first gate electrode 42a and each second gate electrode 42b on the semiconductor layer 28.

Thereafter, the unreacted high-melting point metal layers on the insulating side walls 60 and the like are removed by wet etching.

Next, in each of the first region I and the second region II, a silicon nitride film having a thickness of approximately 50 nm and an oxidized silicon film having a thickness of approximately 50 nm are formed in this order, and these laminate films serve as an interlayer insulating film 79.

The silicon nitride film in the interlayer insulating film 79 is formed by the CVD method, for example, under the condition where the substrate temperature is at 600° C. Further, the oxidized silicon film on the silicon nitride film is formed by a high-density plasma CVD method, for example.

Thereafter, the upper surface of the interlayer insulating film 79 is polished by a CMP method to be planarized.

Further, contact holes are formed in the interlayer insulating film 79 using a photolithography method, and contact plugs 80 are embedded in the contact holes. In addition, a copper wiring 85 connected to each contact plug 80 is formed to complete the basic structure of the semiconductor device.

According to the example explained above, all the first to fourth MOS transistors 81 to 84 (see FIG. 1Q) use the semiconductor layer 28 as a channel.

The semiconductor layer 28 is non-doped when being formed. However, boron in the second p-type impurity region 20 diffuses into the semiconductor layer 28 included in the third MOS transistor 83 due to the heat in the steps after the semiconductor layer 28 has been formed. Therefore, the third MOS transistor 83 uses the semiconductor layer 28 having a p-type conductivity by the diffused boron as a channel.

The structure of using a p-type semiconductor as a channel in this manner is the same as an MOS transistor which uses a portion of a surface layer on the semiconductor substrate 1 as a channel, the surface layer being p-type doped, without the semiconductor layer 28 being formed. Such MOS transistors are widely used. Therefore, an advantage of capable of using the third MOS transistor 83 in an existing circuit without the design of the circuit being changed may be obtained in this example.

Meanwhile, although the first MOS transistor 81 is also provided with the first p-type impurity region 8, carbon to suppress diffusion of boron is also ion implanted when the first p-type impurity region 8 is formed. Accordingly, the slightly small amount of boron is diffused into the first p-type impurity region 8.

In addition, in the first region I, the step of ion implanting the impurity into the semiconductor layer 28 is not performed between the period after the semiconductor layer 28 is formed and before the first gate electrodes 42a are formed. Accordingly, the first MOS transistor 81 in the first region I uses the semiconductor layer 28 with an upper surface 28x in which boron is not substantially included and with the low impurity concentration, as a channel.

Because the channel has a low impurity concentration in this manner, it is possible to prevent the threshold voltage of the first MOS transistor 81 from varying due to the positional variation of the impurities (RDF).

In particular, having a gate length smaller than the third MOS transistor 83, the first MOS transistor 81 receives an influence on the threshold voltage by the RDF. Accordingly, the first MOS transistor 81 is effective, in particular, in preventing variation of the threshold voltage by forming the semiconductor layer 28 at a low impurity concentration as described above.

Meanwhile, one of the characteristics of the MOS transistor is a hump. The hump indicates a small crest appeared on a Vg (gate voltage)-Id (drain current) curve of an MOS transistor.

The inventor of the present application examined the Vg-Id curve of the third MOS transistor 83 made in accordance with FIGS. 1A to 1R described above.

Figure 2:
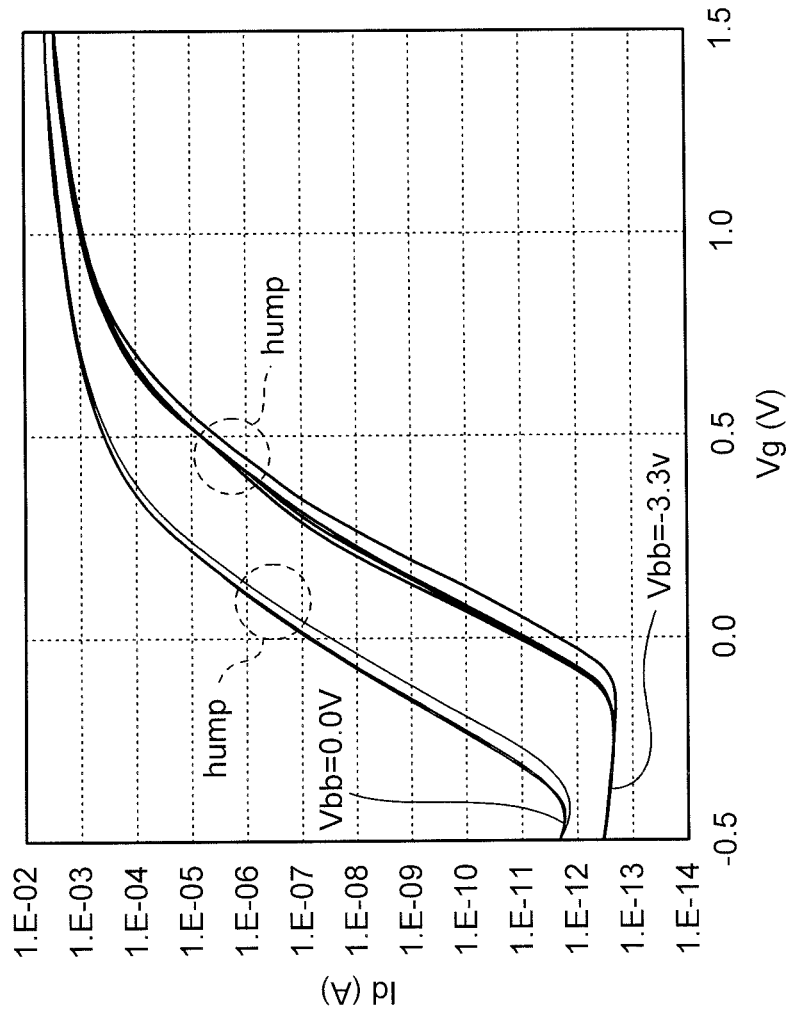
FIG. 2 illustrates Vg-Id curves of an NMOS transistor included in a semiconductor device used for evaluation.

FIG. 2 illustrates a result of the examination. In the examination, the Vg-Id curves of a plurality of the third MOS transistors 83 are examined in both cases where the voltage Vbb applied to the second p well 18 (see FIG. 1Q) is 0.0 V and −3.3 V.

As illustrated in FIG. 2, humps appear on the Vg-Id curves of the third MOS transistors 83.

The appearance of the humps in this manner causes the Vg-Id curves of the plurality of the third MOS transistors 83 to vary from each other. This results in variation of a threshold voltage Vth or an off-state-current Ioff among the third MOS transistors 83.

As described earlier, although the third MOS transistor 83 is an NMOS transistor, the inventor of the present application further examined whether such a hump is generated in the fourth MOS transistor 84 serving as a PMOS transistor.

Figure 3:
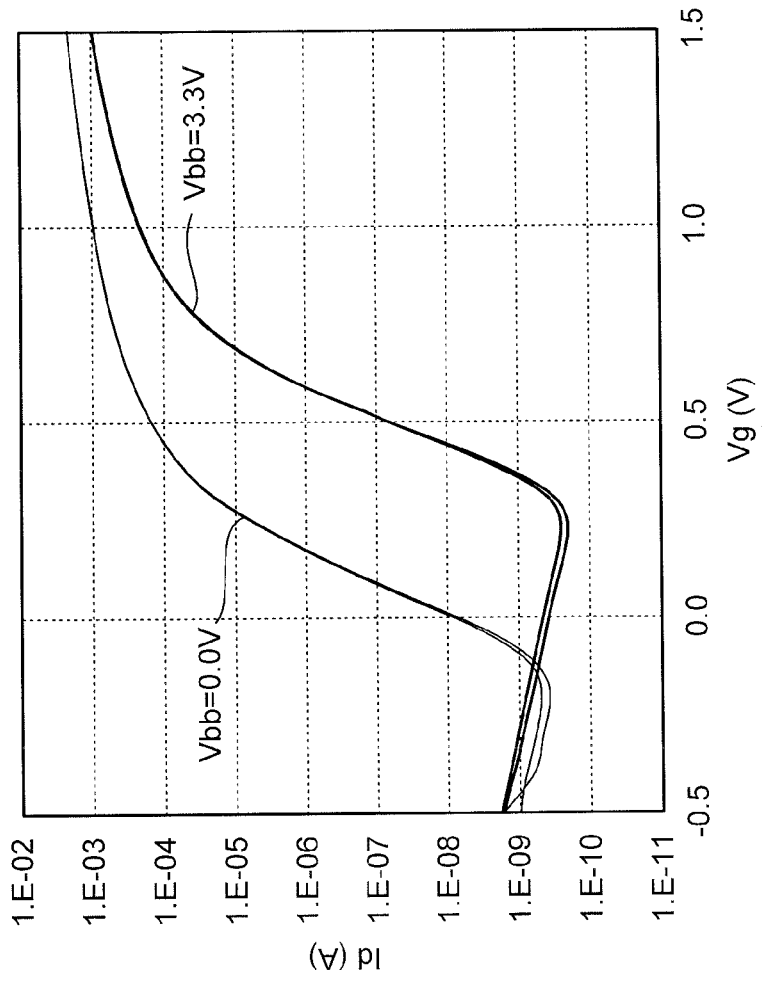
FIG. 3 illustrates Vg-Id curves of an PMOS transistor included in the semiconductor device used for evaluation.

FIG. 3 illustrates a result of the examination. In the examination, the Vg-Id curves of a plurality of the fourth MOS transistors 84 are examined in both cases where the voltage Vbb applied to the second n well 24 is 0.0 V and +3.3 V.

As illustrated in FIG. 3, no hump such as that in FIG. 2 is generated in the fourth MOS transistor 84 serving as a PMOS transistor.

The inventor of the present application studied the reason why a hump is generated only in the NMOS transistor and no hump is generated in the PMOS transistor in this manner as follows.

Firstly, a concept of segregation of impurities will be explained. In an interface between Si and SiO, the concentration distribution of impurity such as B or As/P is discontinuous. In a case of B, the concentration of B in Si becomes smaller than the concentration of B in SiO. In a case of As/P, the concentration of As/P in Si becomes larger. This is referred as segregation. It is understood the segregation is caused by the difference of free energies between the cases where B is present in Si and in SiO. As a result, the concentration of B in Si is lowered toward the interface with SiO.

The semiconductor layer 28 of the third MOS transistor 83 is doped with boron (B) as described above. Boron has a property of easily being incorporated into the element isolation insulating film 34 and the first thermal oxide film 36 due to the segregation. Accordingly, the concentration of boron in a portion in the vicinity of the element isolation insulating film 34 is lowered, lowering the threshold voltage in the portion. This causes a current to be flown in the portion even at the low gate voltage. Therefore, it is considered that a hump is generated in the third MOS transistor 83.

Meanwhile, the semiconductor layer 28 of the fourth MOS transistor 84 includes arsenic (As) or phosphorus (P) diffused from the second n-type impurity region 26 below the semiconductor layer 28. On the contrary to boron, the concentration of phosphorus in Si in the vicinity of the oxide film interface becomes larger. This results in a higher threshold voltage in the vicinity of the element isolation insulating film 34 than other portions. Therefore, it is considered that no hump is generated in the fourth MOS transistor 84.

In this manner, although it is considered that deviation of the impurity concentration in the semiconductor layer 28 causes a hump, it is also considered that concentration of electric fields on a shoulder portion of the element isolation trenches 1b causes a hump to be generated as described below.

Figure 4:
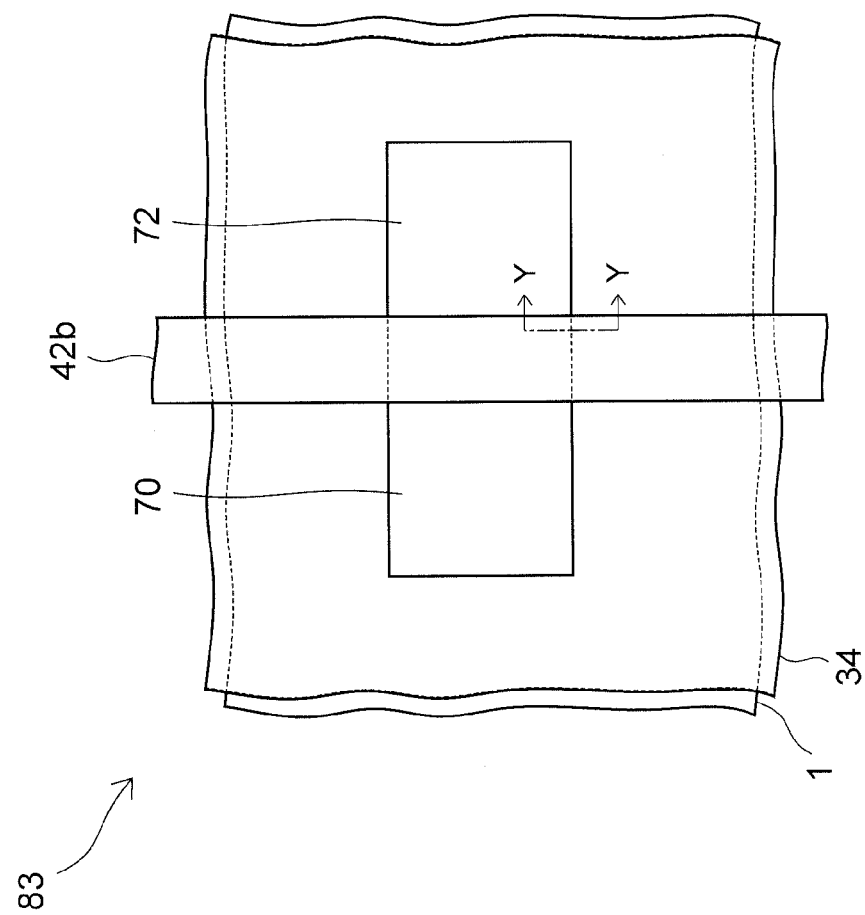
FIG. 4 is a plan view of the NMOS transistor included in the semiconductor device used for evaluation.

FIG. 4 is a plan view of the third MOS transistor 83, and FIG. 5A is a cross-sectional view along a Y-Y line in FIG. 4.

As illustrated in FIG. 5A, the element isolation trench 1b has a right angle shoulder portion 1c. This causes an electric field E to concentrate on the semiconductor layer 28 from the second gate electrode 42b. It is considered that this may cause a hump to be generated.

Therefore, as illustrated in FIG. 5B, it is considered that the shoulder portion 1c is rounded off to ease the concentration of the electric field E. The shoulder portion 1c may be rounded off, for example, such that the shoulder portion 1c of the element isolation trench 1b is thermally oxidized at a high temperature of about 1000° C. before the element isolation insulating film 34 is formed.

However, the thermal treatment at the high temperature on the semiconductor substrate 1 in this manner causes boron in the first p-type impurity region 8 of the first MOS transistor 81 (see FIG. 1Q) to be diffused into the semiconductor layer 28. This increases the impurity concentration in the semiconductor layer 28. Therefore, it is difficult to prevent the variation in the threshold voltage of the first MOS transistor 81 by using the semiconductor layer 28 having a low concentration.

Hereinafter, a manufacturing method of a semiconductor device capable of preventing a hump to be generated such that that the shoulder portion 1c is not necessary to be rounded off by the thermal oxidization at such a high temperature will be explained.

First Embodiment

FIGS. 6A to 6G are cross-sectional views of semiconductor devices in the course of manufacturing semiconductor devices according to the present embodiment. Note that, In FIGS. 6A to 6G, like numerals refer to like components which have been explained in FIGS. 1A to 1R, and explanations are omitted below.

Figure 6A:
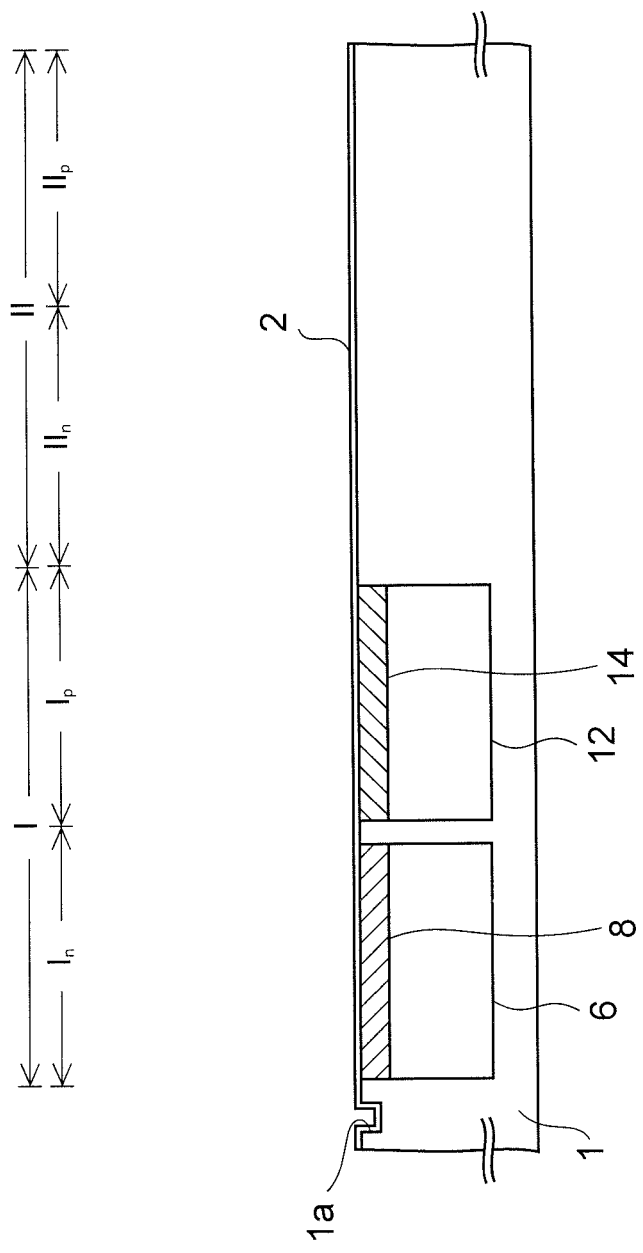
FIGS. 6A to 6G are cross-sectional views of semiconductor devices in the course of manufacturing semiconductor devices according to a first embodiment.

Firstly, the same steps as FIGS. 1A to 1C described above are performed to obtain a cross-sectional structure illustrated in FIG. 6A.

In the state as illustrated in FIG. 6A, the first p well 6 and the first p-type impurity region 8 stated above are formed in the semiconductor substrate 1 in the first n-type transistor formation region $I_n$. As having explained with reference to FIG. 1B, when the first p-type impurity region 8 is formed, carbon is also ion implanted into the semiconductor substrate 1. The carbon may suppress diffusion of boron into the first p-type impurity region 8.

Moreover, the first n well 12 and the first n-type impurity region 14 are formed in the semiconductor substrate 1 in the first p-type transistor formation region $I_p$.

Figure 6B:
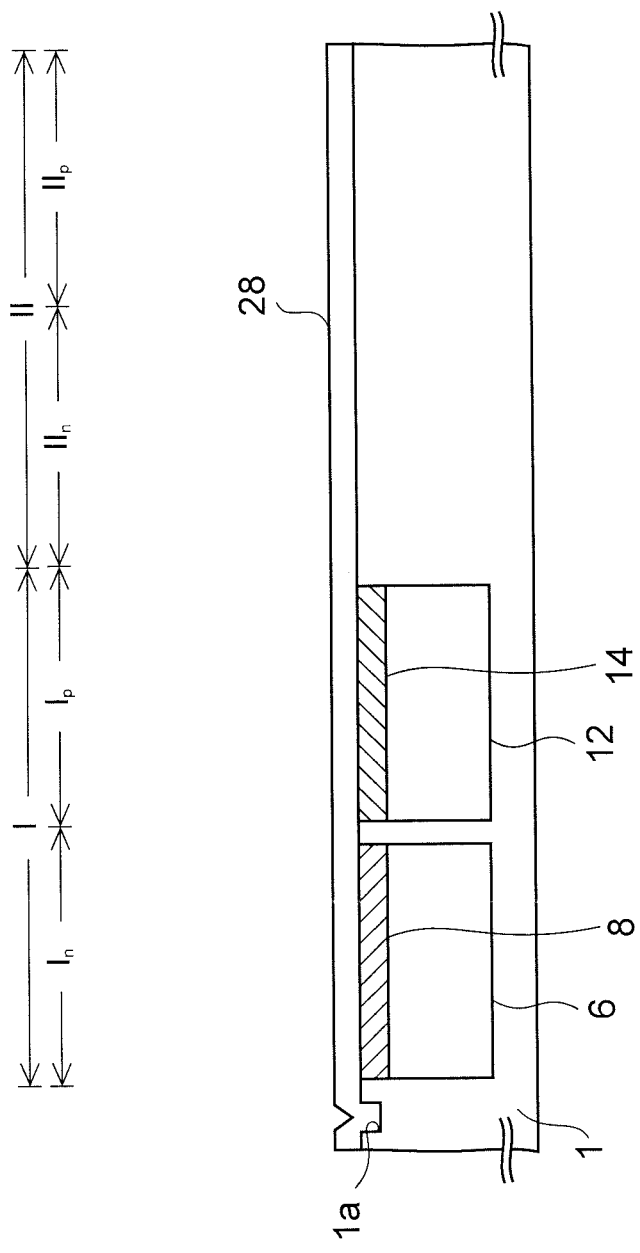

Next, as illustrated in FIG. 6B, the thermal oxide film 2 damaged during the formation of the first p well 6 or the first n well 12 is removed by wet etching with a hydrofluoric acid solution.

Further, in a state where no impurity is implanted into each of the second p-type transistor formation region $II_p$ and the second n-type transistor formation region $II_n$, a silicon layer serving as the semiconductor layer 28 is formed on the upper surface 1x of the semiconductor substrate 1.

The silicon layer is formed in such a manner to have a thickness of about 25 nm by the epitaxial growth method using a mixed gas of a silane gas and a hydrogen gas as a deposition gas, similar to the step of FIG. 1F.

Figure 6C:
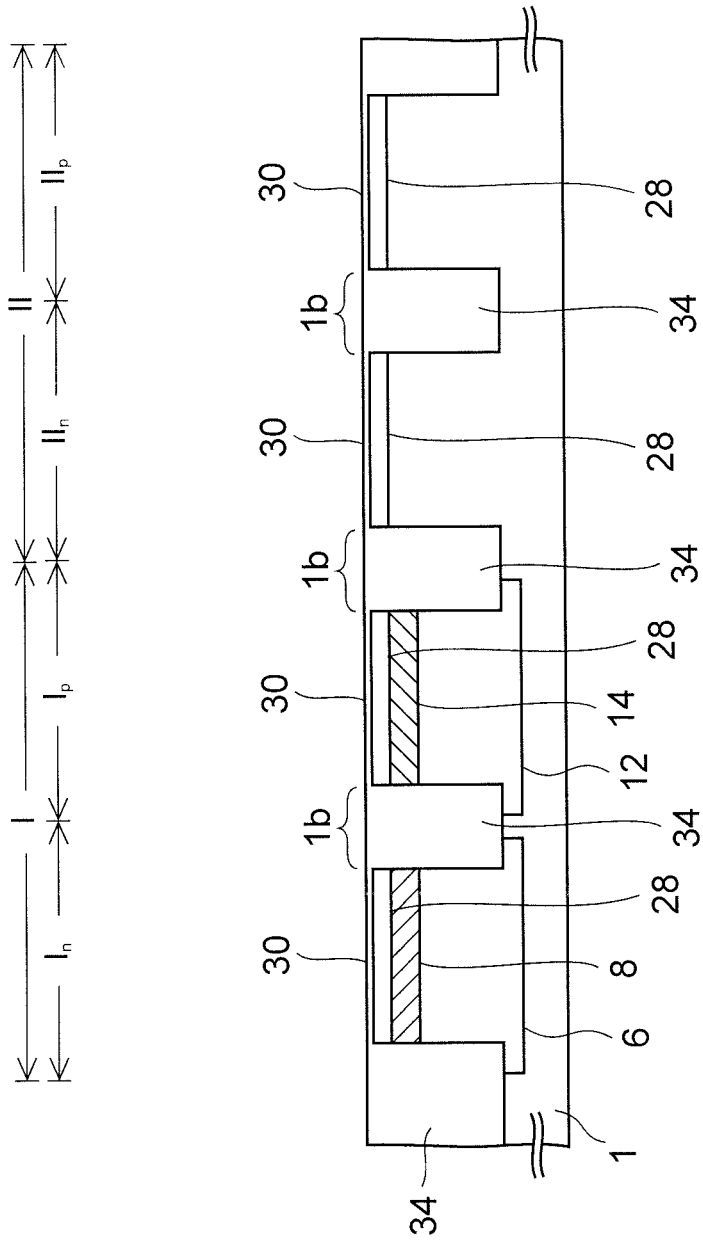

Next, as illustrated in FIG. 6C, the same steps as FIGS. 1G to 1J stated above are performed to form an oxidized silicon film serving as the element isolation insulating film 34 in the element isolation trenches 1b of the semiconductor substrate 1, and to be in a state where the oxide film 30 having a thickness about 3 nm is remained on the semiconductor layer 28.

Figure 6D:
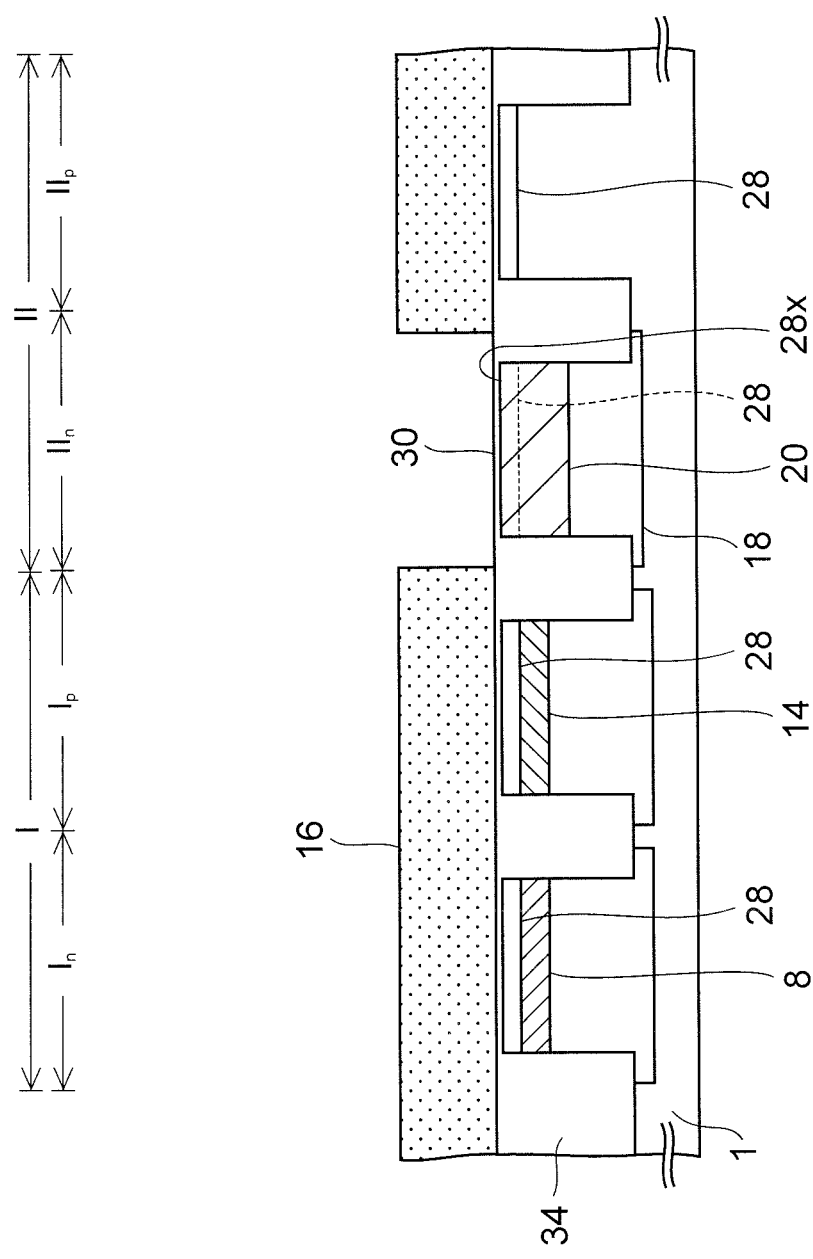

Subsequently, as illustrated in FIG. 6D, the third resist film 16 is formed on the oxide film 30 by photolithography. Further, the second p well 18 and the second p-type impurity region 20 are formed in the second n-type transistor formation region $II_n$ by ion implantation using the third resist film 16 as a mask.

The second p well 18 is formed by ion implantation of boron as a p-type impurity into the semiconductor substrate 1 from the four directions tilted with respect to the substrate normal direction under the condition where the acceleration energy is 150 keV and the dose amount is $7.5 \times 10^{12}$ cm$^{-2}$.

Meanwhile, the second p-type impurity region 20 functions to adjust the threshold voltage of a transistor to be formed later in the second n-type transistor formation region $II_n$, and is formed by ion implantation of boron into the semiconductor layer 28. The condition of the ion implantation is that, for example, the acceleration energy is 10 keV and the dose amount is $2 \times 10^{12}$ cm$^{-2}$.

Here, in order to suppress segregation of boron in the upper surface 28x of the semiconductor layer 28, it is preferable that the concentration of boron in the upper surface 28x be set as high as possible by positioning the concentration peak of boron as close as possible to the upper surface 28x of the semiconductor layer 28.

In the present embodiment, different from the step of FIG. 1D, after the semiconductor layer 28 is formed, the second p-type impurity region 20 is formed in this semiconductor layer 28. Accordingly, the condition of ion implantation into the second p-type impurity region 20 is adjusted to easily set the concentration peak of boron in the vicinity of the upper surface 28x.

Moreover, the second p-type impurity region 20 is formed after the element isolation trenches 1b are formed. Accordingly, boron in the second p-type impurity region 20 may not be diffused due to the heat during the formation of the element isolation trenches 1b, for example, the heat during the formation of the oxide film 30. Therefore, it is possible to maintain a state where the concentration peak of boron is positioned in the upper surface 28x of the semiconductor layer 28.

Thereafter, the third resist film 16 is removed.

Figure 6E:
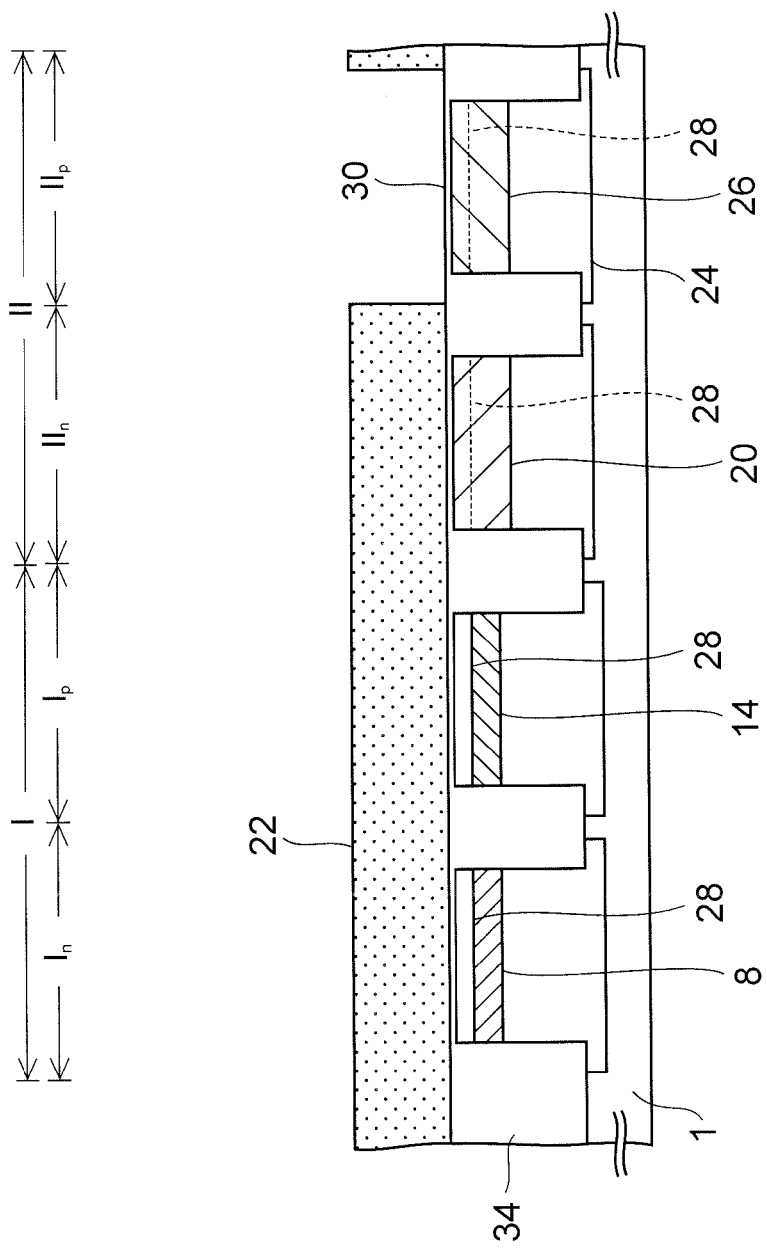

Next, as illustrated in FIG. 6E, the fourth resist film 22 is formed on the oxide film 30 by photolithography. Thereafter, the second n well 24 and the second n-type impurity region 26 are formed in the second p-type transistor formation region $II_p$ by ion implantation using the fourth resist film 22 as a mask.

The second n well 24 is formed by ion implantation of phosphorus as an n-type impurity into the semiconductor substrate 1 from the four directions tilted with respect to the substrate normal direction under the condition where the acceleration energy is 360 keV and the dose amount is $7.5 \times 10^{12}$ cm$^{-2}$.

Moreover, the second n-type impurity region 26 functions to adjust the threshold voltage of a transistor to be formed later in the second p-type transistor formation region $II_p$, and is formed by ion implantation of arsenic as an n-type impurity into the semiconductor layer 28. The implantation condition of the arsenic is that, for example, the acceleration energy is 100 keV and the dose amount is $1 \times 10^{12}$ cm$^{-2}$.

Thereafter, the fourth resist film 22 is removed.

Figure 6F:
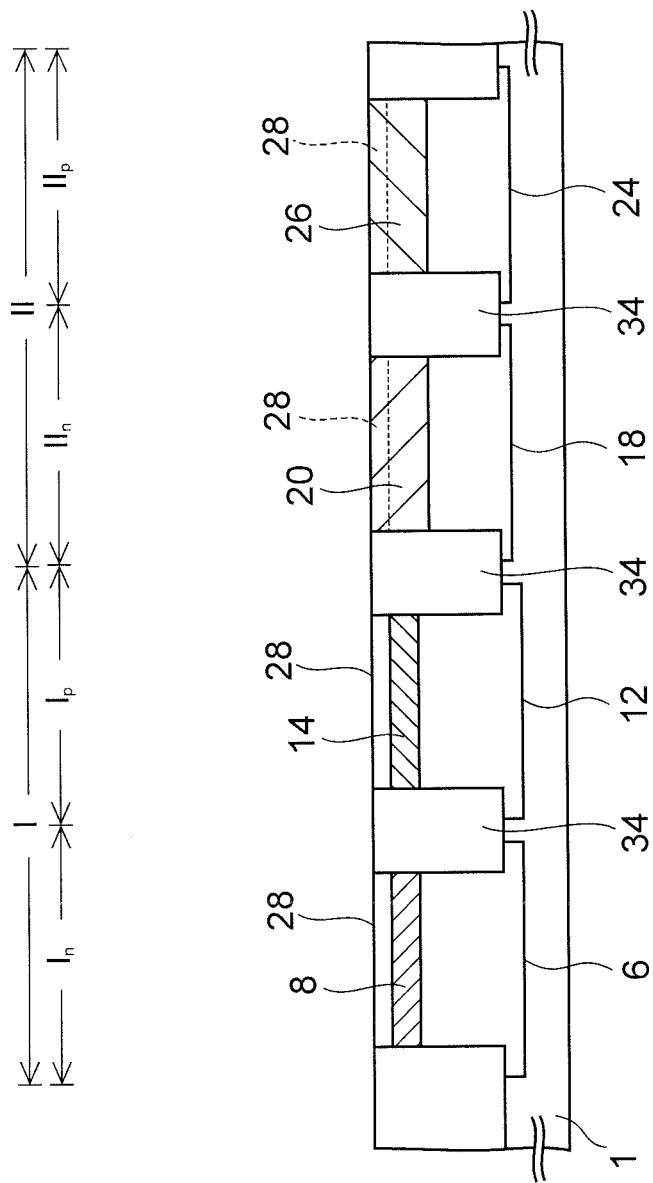

Next, as illustrated in FIG. 6F, the oxide film 30 remaining on the semiconductor layer 28 is removed by wet etching with a hydrofluoric acid solution.

Figure 6G:
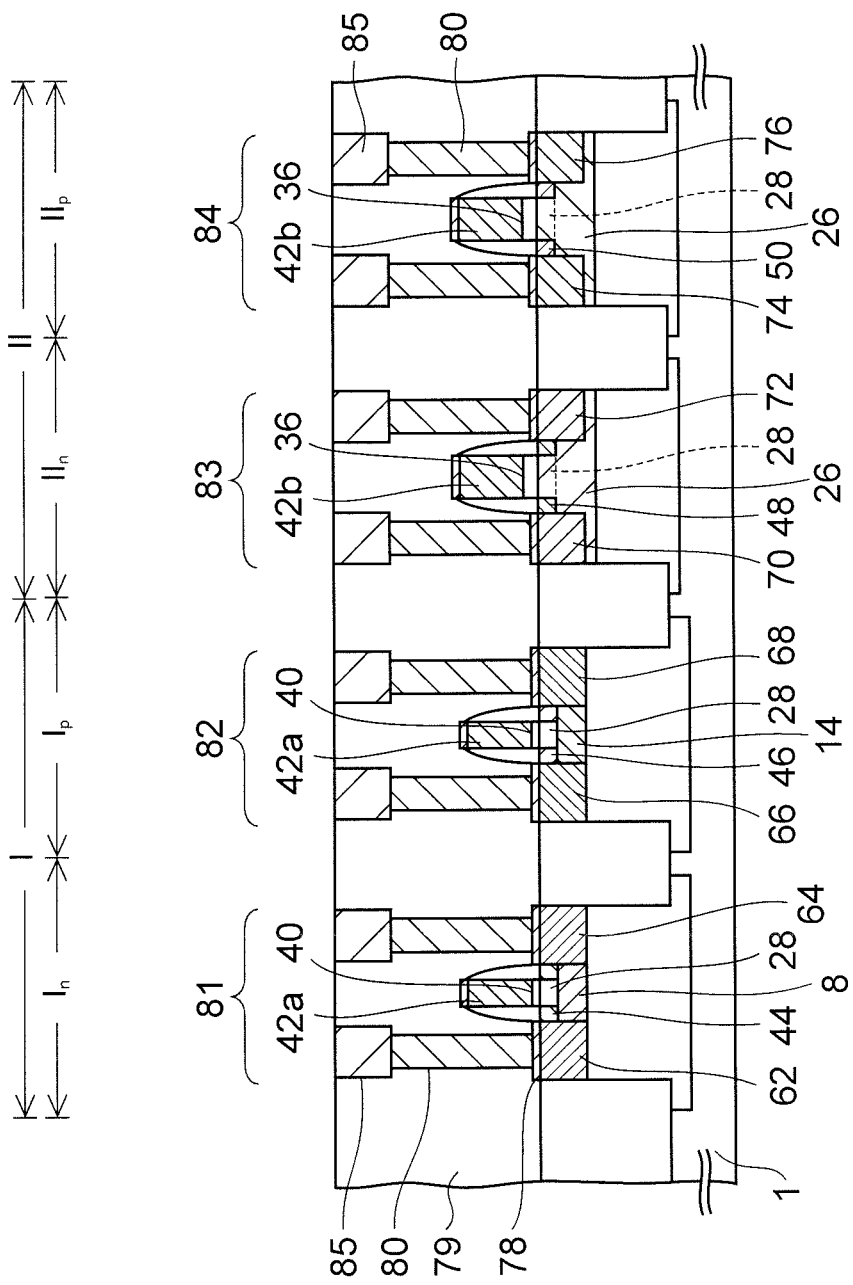

Then, the same steps as FIGS. 1K to 1R stated above are performed to complete the basic structure of the semiconductor device according to the present embodiment illustrated in FIG. 6G.

According to the present embodiment explained above, as having explained with reference to FIG. 6D, after the semiconductor layer 28 is formed, the second p-type impurity region 20 is formed by ion implantation of boron into this semiconductor layer 28.

Next, examination performed the inventor of the present application in order to confirm effects by the present embodiment will be explained.

In the examination, the third MOS transistor 83 made in accordance with FIGS. 1A to 1R stated above was used as a comparative example, and Vg-Id curves of the third MOS transistors 83 according to the comparative example and Vg-Id curves of the third MOS transistors 83 according to the present embodiment were examined.

Figure 7A:
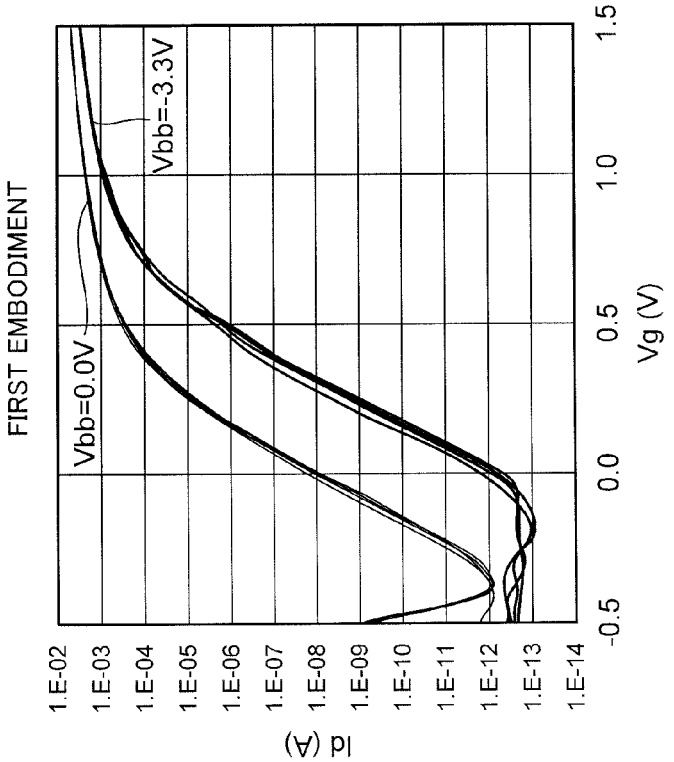
FIG. 7A illustrates Vg-Id curves of a third MOS transistor according to a comparative example.
Figure 7B:
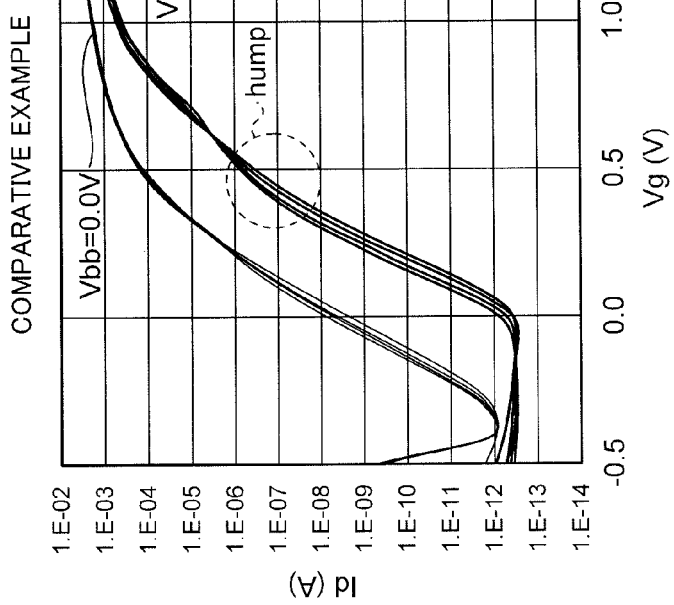
FIG. 7B illustrates Vg-Id curves of the third MOS transistor according to the first embodiment.

FIGS. 7A and 7B illustrate results of the examination.

FIG. 7A illustrates the Vg-Id curves in the comparative example, and FIG. 7B illustrates the Vg-Id curves in the present embodiment.

Note that, in both of the comparative example and the present embodiment, the third MOS transistor 83 has a gate length of 0.34 μm and a gate width of 20 μm.

Moreover, the Vg-Id curves of a plurality of the third MOS transistors 83 in both cases where the voltage Vbb applied to the second p well 18 is 0.0 V and −3.3 V are acquired.

In addition, in both of the comparative example and the present embodiment, the acceleration energy of boron in forming the second p-type impurity region 20 is set to 10 keV.

As illustrated in FIG. 7A, a hump appears in the comparative example.

In contrast, in the present embodiment, as illustrated in FIG. 7B, the height of a crest on the Vg-Id curve is reduced. A hump is more suppressed than that in the comparative example.

From this, it is confirmed that forming the second p-type impurity region 20 after the semiconductor layer 28 and the element isolation trenches 1b are formed as in the present embodiment is effective for suppressing a hump of the third MOS transistor 83 serving as a PMOS transistor.

Here, a possible reason why a hump can be suppressed in this manner is that the peak of the concentration of boron in the second p-type impurity region 20 is positioned in the vicinity of the upper surface 28x of the semiconductor layer 28, and therefore the concentration of boron is high in the upper surface 28x.

In order to increase the concentration of boron in the upper surface 28x, it is considered effective to reduce the acceleration energy of the p-type impurity in forming the second p-type impurity region 20, thereby to make the concentration peak of the p-type impurity much closer to the upper surface 28x.

In the present embodiment of FIG. 7B, the acceleration energy of boron in forming the second p-type impurity region 20 is set to 10 keV. Accordingly, the acceleration energy of boron is set to 10 keV or less to allow the concentration peak of the p-type impurity to be made to be further closer to the upper surface 28x.

Moreover, examples of a p-type impurity for forming a second p-type impurity region 20 include $BF_2$ in addition to boron described above.

Figure 8:
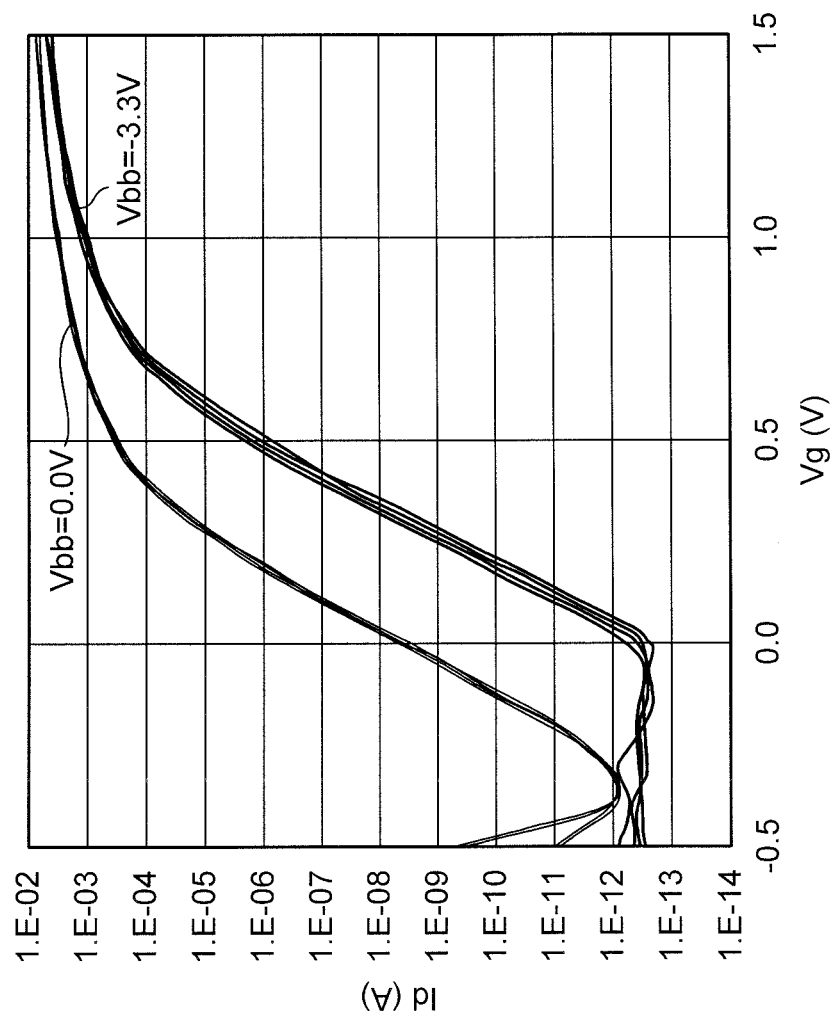
FIG. 8 illustrates Vg-Id curves of the third MOS transistor in a case where $BF_2$ is used as a p-type impurity in formation of a second p-type impurity region in the first embodiment.

FIG. 8 illustrates Vg-Id curves of the third MOS transistors 83 in a case where $BF_2$ is used as a p-type impurity in forming the second p-type impurity region 20 and the acceleration energy of the $BF_2$ is set to 15 keV in the present embodiment.

Note that, the Vg-Id curves of a plurality of the third MOS transistors 83 in both cases where the voltage Vbb applied to the second p well 18 is 0.0 V and −3.3 V are acquired. In addition, the gate length and the gate width of each of the third MOS transistors 83 are set to 0.34 μm and 30 μm, respectively.

Because $BF_2$ has a larger mass than boron, the depth at which $BF_2$ is implanted at the acceleration energy described above (15 keV) is shallower than the depth at which boron is implanted at the same acceleration energy, and is substantially equivalent to the depth at which boron is implanted at the energy of 10 keV or less.

As illustrated in FIG. 8, in this case, a crest appeared on the Vg-Id curve becomes further lower than the case of FIG. 7B. Accordingly, no hump is generated.

From this, in a case where $BF_2$ is used as a p-type impurity in forming the second p-type impurity region 20, it is revealed that the acceleration energy of the $BF_2$ set to 15 keV or less enables suppression of a hump.

Figure 9:
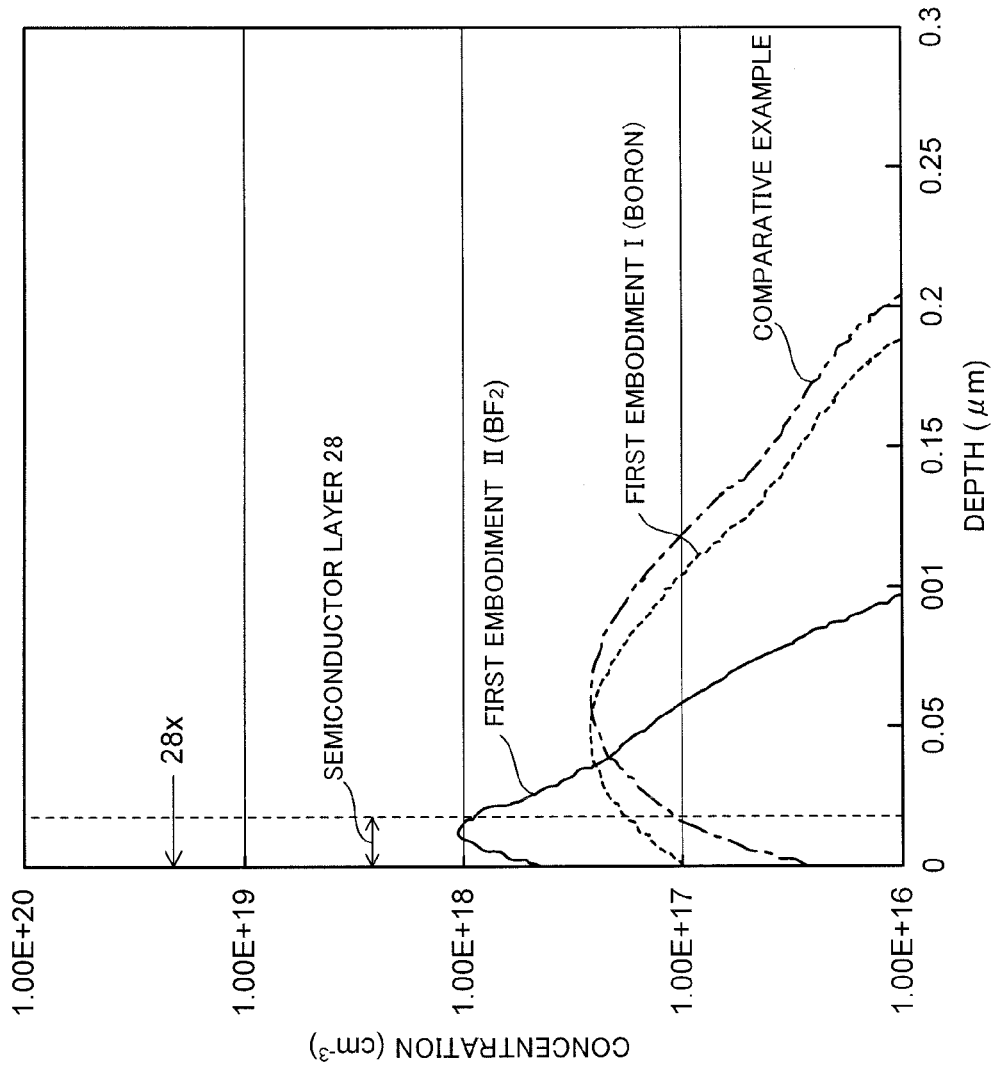
FIG. 9 illustrates a concentration profile of impurity of a semiconductor layer in a second n-type transistor formation region.

FIG. 9 illustrates a concentration profile of impurity of the semiconductor layer 28 in the second n-type transistor formation region $II_n$, and is a graph indicating a relation between the depth from the upper surface 28x and the concentration of a p-type impurity.

In FIG. 9, a first embodiment I indicates a concentration profile of boron in a case where the boron is ion implanted at the acceleration energy of 10 keV in order to form the second p-type impurity region 20. Further, a first embodiment II indicates a concentration profile of $BF_2$ in a case where the $BF_2$ is ion implanted at the acceleration energy of 15 keV in order to form the second p-type impurity region 20. In addition, the comparative example indicates a concentration profile of boron in the comparative example of FIG. 7A.

As illustrated in FIG. 9, the profile of the comparative example has the lowest impurity concentration in the upper surface 28x among the three profiles.

Meanwhile, in order to obtain a further higher-performance semiconductor device, not only a hump of the third MOS transistor 83 which is driven at a high voltage but also a hump of the first MOS transistor 81 which is driven at a low voltage is preferably suppressed.

Therefore, a method of suppressing a hump of the first MOS transistor 81 made in accordance with the present embodiment will be explained below.

As described earlier, the first MOS transistor 81 is a PMOS transistor, and the threshold voltage is adjusted in the first p-type impurity region 8 (see FIG. 1Q). Further, carbon is also ion implanted into the semiconductor substrate 1 when the first p-type impurity region 8 is formed, and the carbon can suppress diffusion of boron in the first p-type impurity region 8.

The inventor of the present application examined how the Vg-Id curve of the first MOS transistor 81 is changed depending on the dose amount of carbon ion-implanted in this manner.

Figure 10A:
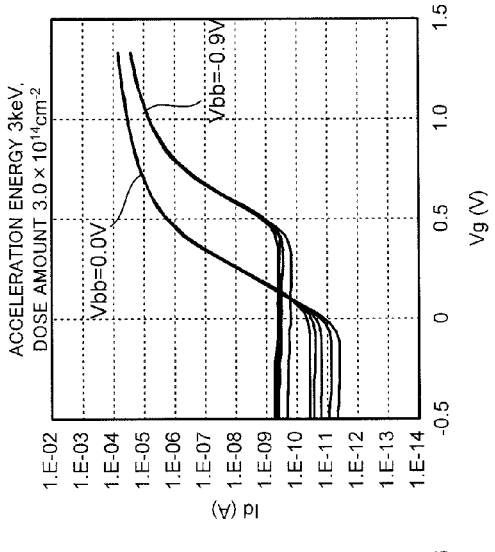
Figure 10B:
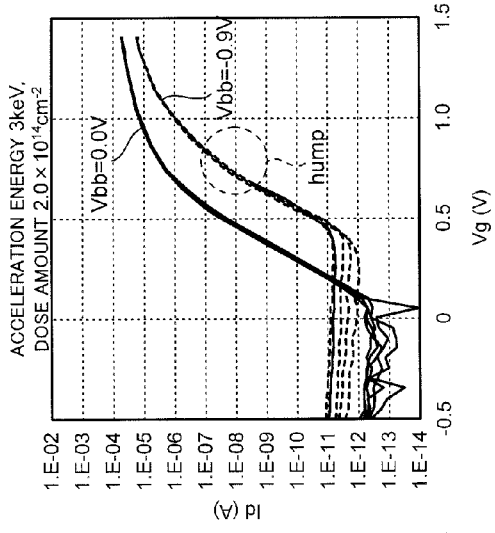
Figure 10C:
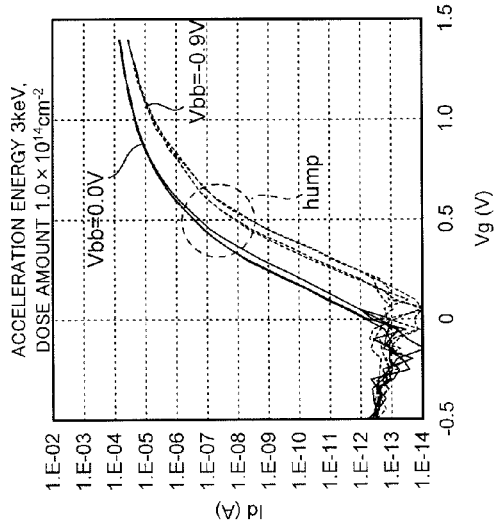

FIGS. 10A to 10C illustrate results of the examination.

Among them, FIG. 10A illustrates Vg-Id curves in a case where the acceleration energy of carbon is set to 3 keV and the dose amount is set to $1.0 \times 10^{14}$ cm$^{-2}$ in the formation of the first p-type impurity region 8.

Moreover, FIG. 10B illustrates Vg-Id curves in a case where the acceleration energy of carbon is set to 3 keV and the dose amount is set to $2.0 \times 10^{14}$ cm$^{-2}$, and FIG. 10C illustrates Vg-Id curves in a case where the acceleration energy of carbon is set to 3 keV and the dose amount is set to $3.0 \times 10^{14}$ cm$^{-2}$.

Note that, in any of FIGS. 10A to 10C, the gate length of the first MOS transistor 81 is set to 1.03 μm and the gate width is set to 1 μm. In addition, the Vg-Id curves of a plurality of the first MOS transistors 81 in both cases where the voltage Vbb applied to the first p well 6 (see FIG. 1Q) is 0.0 V and −0.9 V are acquired.

As illustrated in FIG. 10A, a hump appears in the case where the dose amount of carbon is $1.0 \times 10^{14}$ cm$^{-2}$.

Meanwhile, as illustrated in FIG. 10B, if the dose amount of carbon is increased to $2.0 \times 10^{14}$ cm$^{-2}$, a hump is reduced. In addition, as illustrated in FIG. 10C, if the dose amount of carbon is increased to $3.0 \times 10^{14}$ cm$^{-2}$, a hump is almost dissolved.

Figure 11:
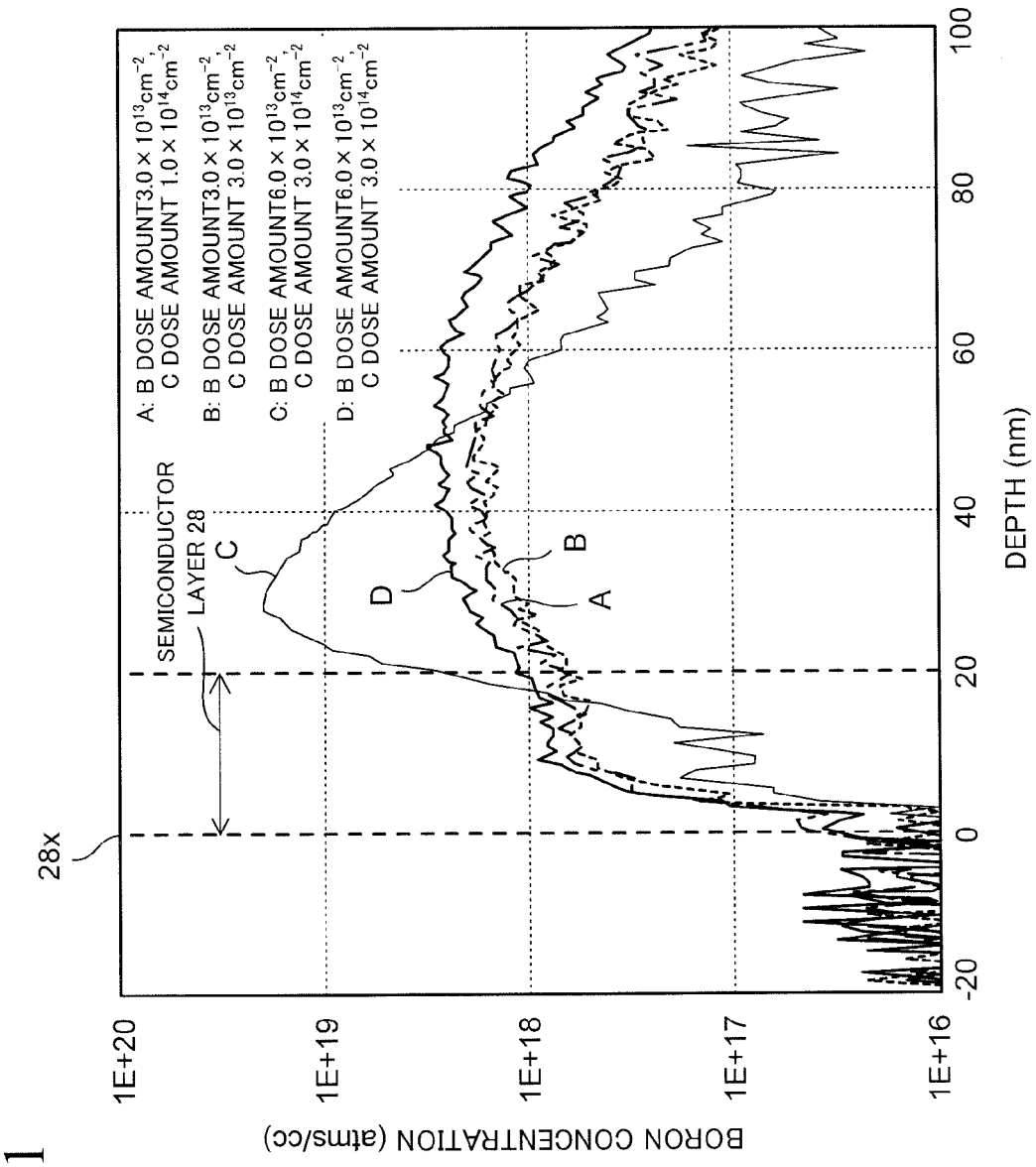
FIG. 11 is a graph obtained as a result of examination of how the concentration profile of boron in the first p-type impurity region depends on the condition of ion implantation of carbon in the first embodiment.

FIG. 11 is a graph obtained as a result of examination of how the concentration profile of boron in the first p-type impurity region 8 depends on the condition of ion implantation of carbon described above.

Note that, in the examination, as the dose amount of boron (B) in forming the first p-type impurity region 8, two different dose amounts of $3.0 \times 10^{13}$ cm$^{-2}$ and $6.0 \times 10^{13}$ cm$^{-2}$ are used. Further, different dose amounts of carbon (C) are used with each of these two different dose amounts.

As illustrated in FIG. 11, in a case (C) where carbon is ion implanted at the high dose amount of $3.0 \times 10^{14}$ cm$^{-2}$, the carbon suppresses diffusion of boron to keep the concentration of boron in the upper surface 28x of the semiconductor layer 28 low at about $1 \times 10^{17}$ atms/cc.

In particular, in this case (C), the concentration of boron of the semiconductor layer 28 from the upper surface 28x of the semiconductor layer 28 to at least a portion having a depth of half of the film thickness of the semiconductor layer 28 may be kept low at $3 \times 10^{17}$ atms/cc or less.

Meanwhile, in the remaining three cases (A), (B), and (D) where the dose amount of carbon is lower than $3.0 \times 10^{14}$ cm$^{-2}$ described above, boron is diffused to cause the concentration of boron in the upper surface 28x to be increased to about $1 \times 10^{18}$ atms/cc.

These results revealed that, in order to dissolve a hump of the first MOS transistor 81, it is effective to increase the dose amount of carbon in forming the first p-type impurity region 8 as much as possible.

Note that, instead of increasing the dose amount of carbon in this manner, boron may be prevented from being diffused from the first p-type impurity region 8 into the upper surface 28x of the semiconductor layer 28 by forming the semiconductor layer 28 in such a manner to have a thicker film thickness as described below.

FIGS. 12A to 12D are graphs indicating Vg-Id curves of the first MOS transistors 81 obtained by varying the film thickness of the semiconductor layer 28.

Note that, the first MOS transistor 81 used for acquiring the Vg-Id curves has a gate length of 1.01 μm and a gate width of 1 μm. Moreover, the Vg-Id curves of a plurality of the first MOS transistors 81 in both cases where the voltage Vbb applied to the first p well 6 (see FIG. 1Q) is 0.0 V and 0.9 V are acquired.

Figure 12A:
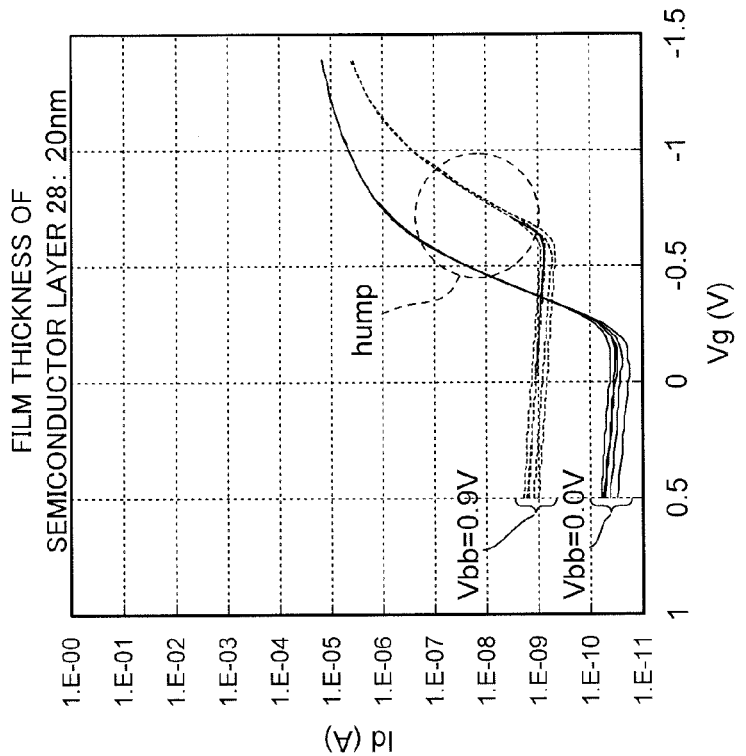
FIGS. 12A to 12D are graphs indicating Vg-Id curves of the first MOS transistor obtained by varying the film thickness of the semiconductor layer in the first embodiment.

FIG. 12A is a graph indicating Vg-Id curves in a case where the film thickness of the semiconductor layer 28 is set to 15 nm. In this case, a hump appears on the Vg-Id curves.

Figure 12B:
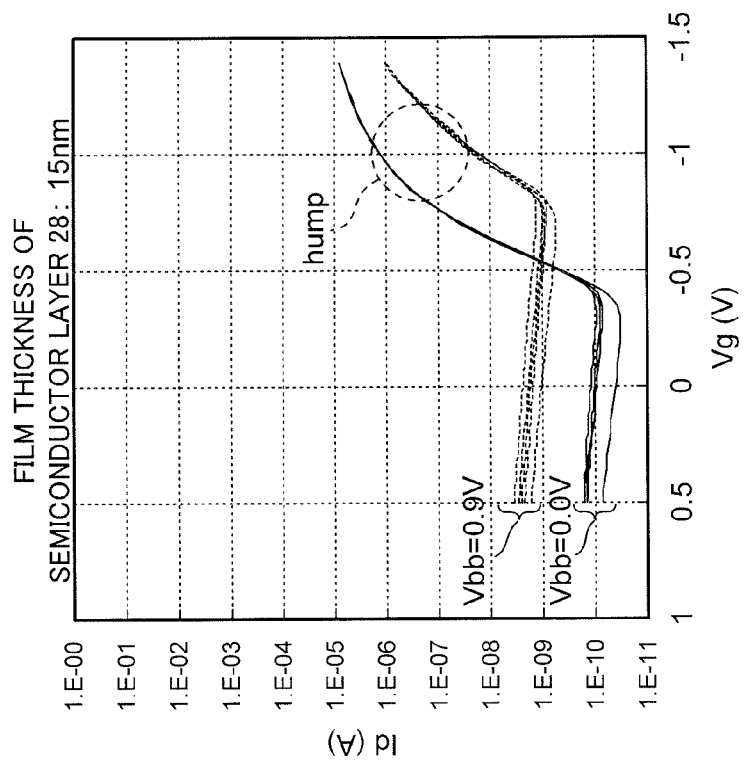

FIG. 12B is a graph indicating Vg-Id curves in a case where the film thickness of the semiconductor layer 28 is set to 20 nm. Also in this case, a hump appears on the Vg-Id curves.

Figure 12D:
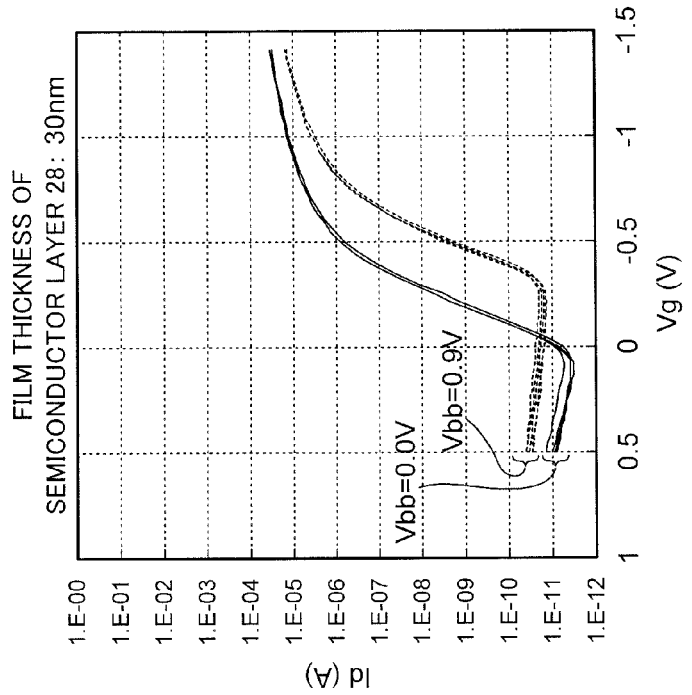
Figure 12C:
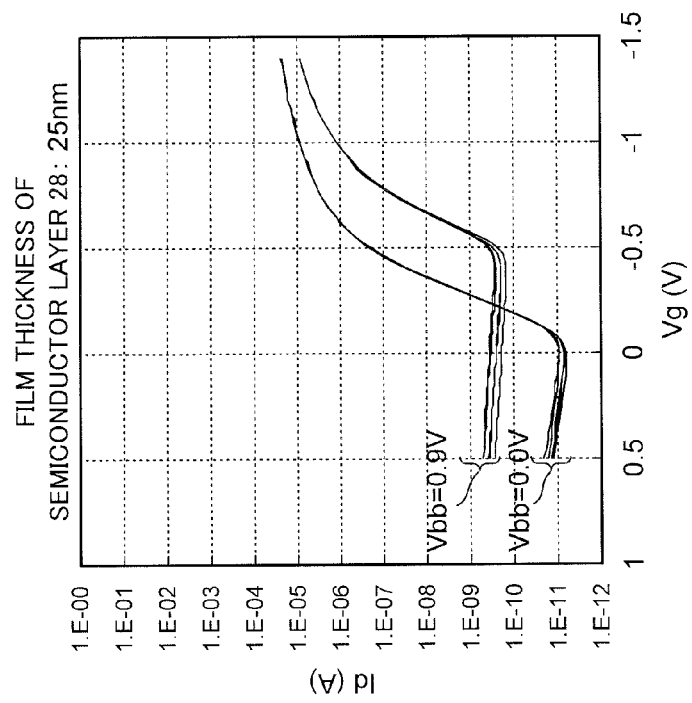

Meanwhile, FIG. 12C is a graph indicating Vg-Id curves in a case where the film thickness of the semiconductor layer 28 is set to 25 nm. In this case, a hump is disappeared from the Vg-Id curves.

Moreover, FIG. 12D is a graph indicating Vg-Id curves in a case where the film thickness of the semiconductor layer 28 is set to 30 nm. Also in this case, a hump is disappeared.

These results revealed that, a hump of the first MOS transistor 81 is further suppressed as the film thickness of the semiconductor layer 28 increases, and setting the film thickness of the semiconductor layer 28 to 25 nm or more to cause a hump to be almost completely disappeared.

Second Embodiment

In the first embodiment, as illustrated in FIG. 6D and FIG. 6E, the impurity such as boron, phosphorus, or the like is introduced into the semiconductor layer 28 of the third MOS transistor 83 or the fourth MOS transistor 84 which is driven at a high voltage.

In the present embodiment, an MOS transistor which is provided with a non-doped semiconductor layer 28 and driven at a high voltage is also mounted together, in addition to the MOS transistor provided with the semiconductor layer 28 with which the impurity is doped in this manner.

Figure 13A:
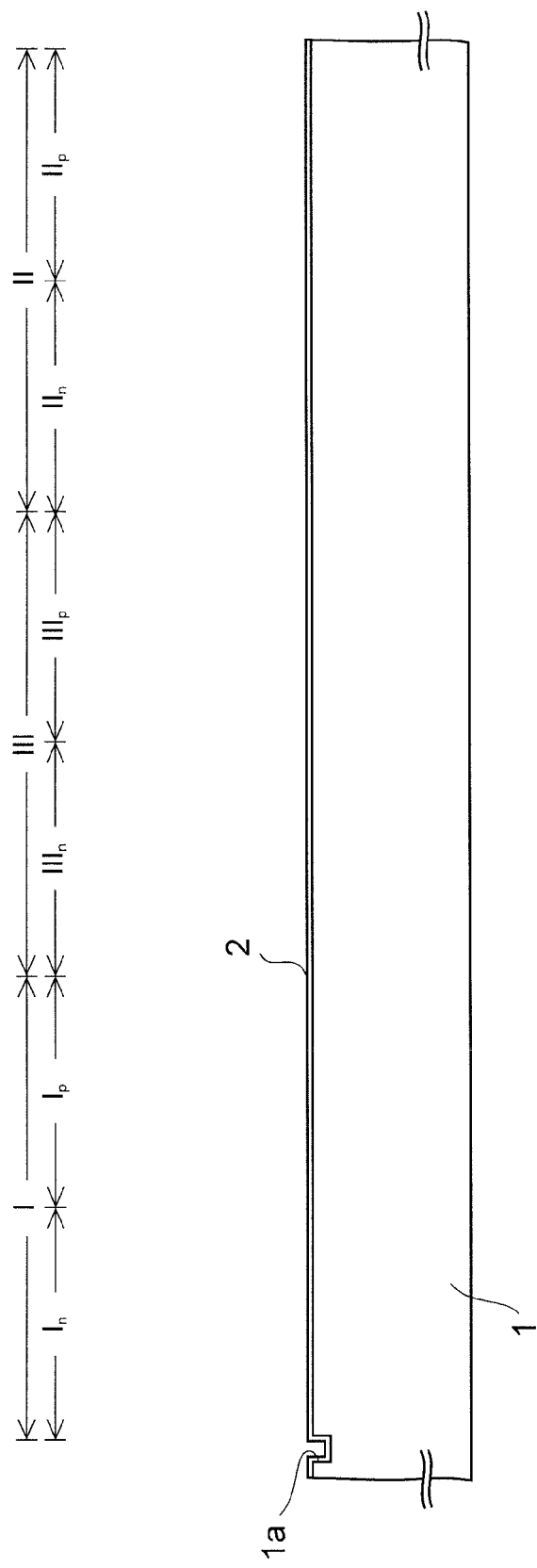
FIG. 13A to 13Q are cross-sectional views of semiconductor devices in the course of manufacturing semiconductor devices according to a second embodiment.
Figure 13B:
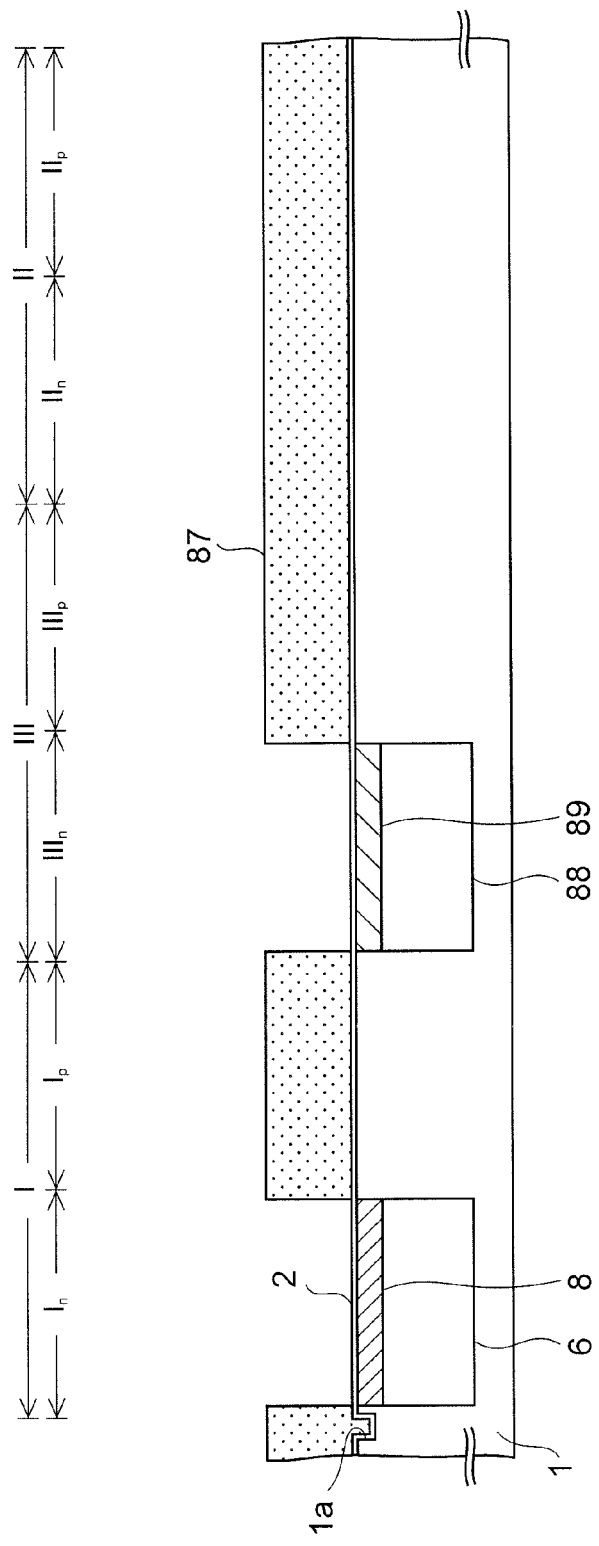
Figure 13C:
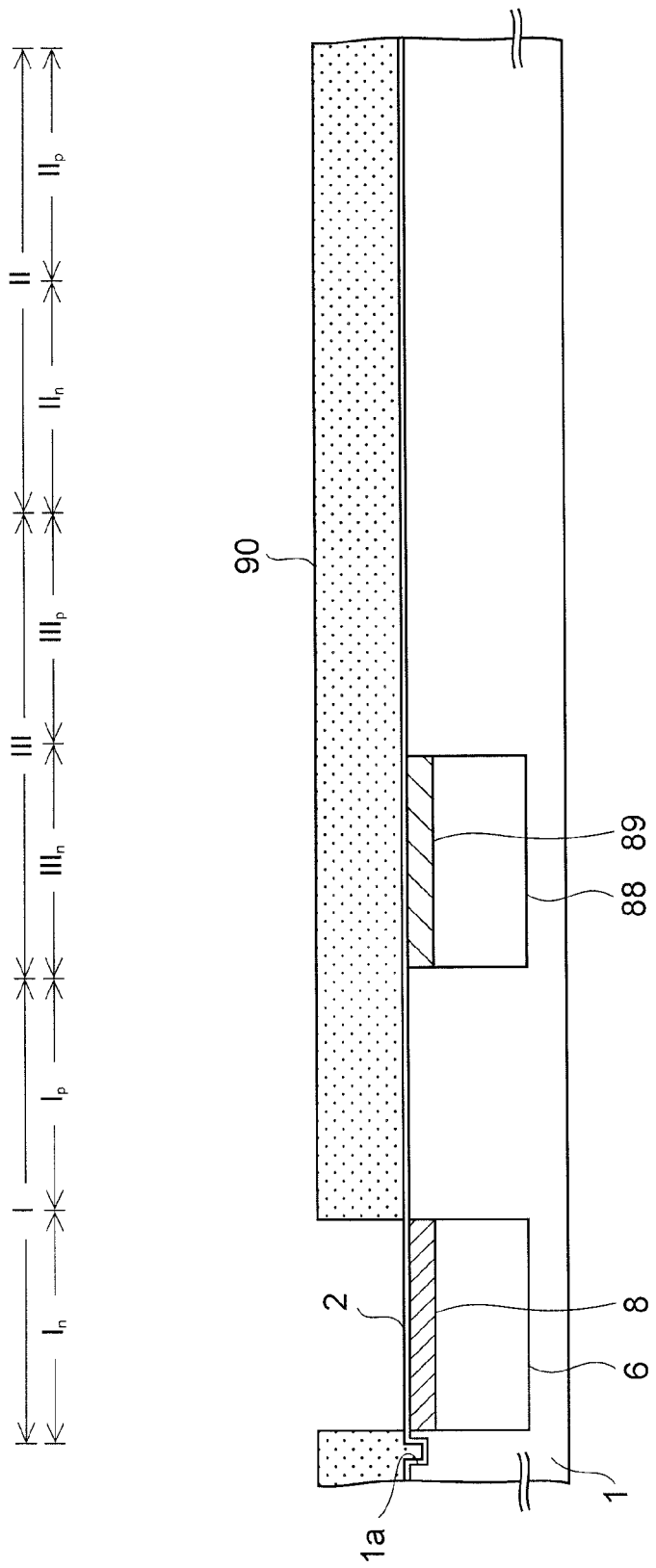
Figure 13D:
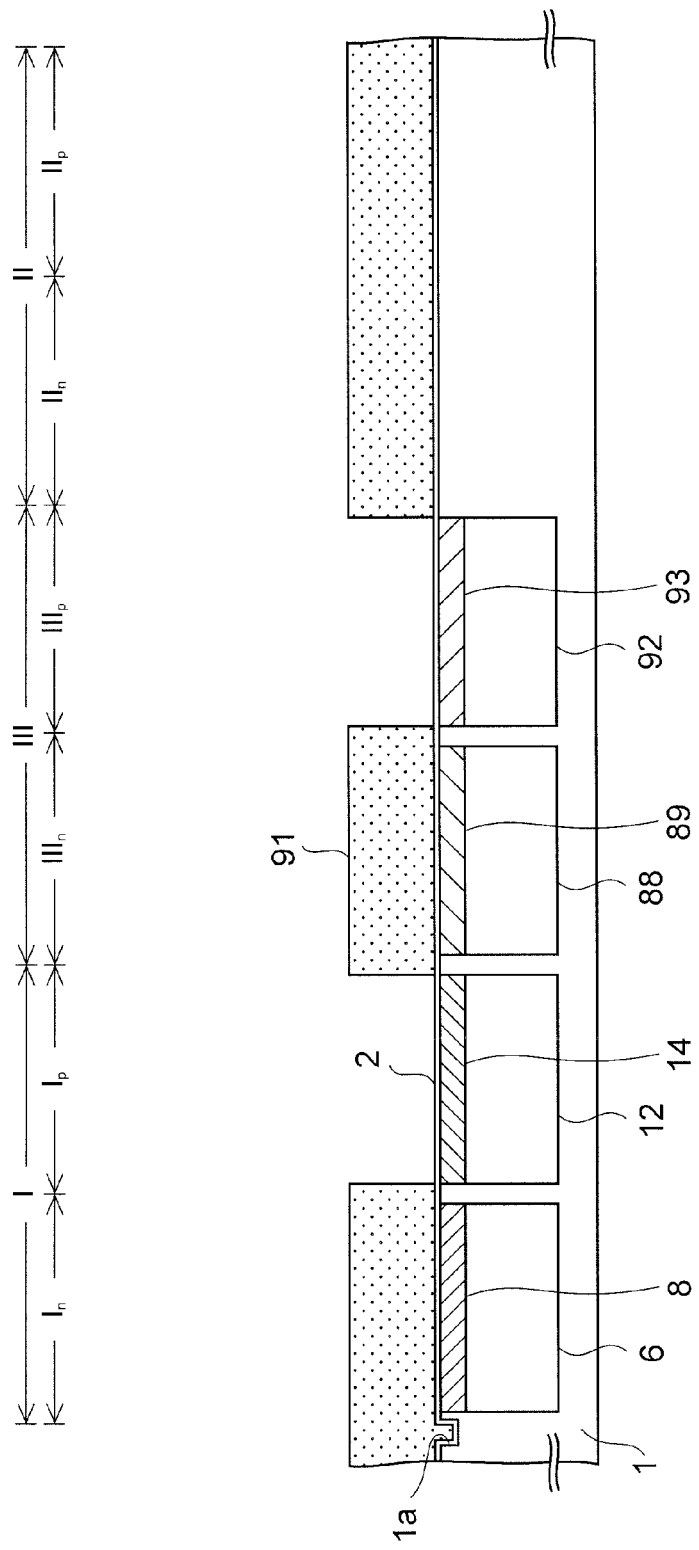
Figure 13E:
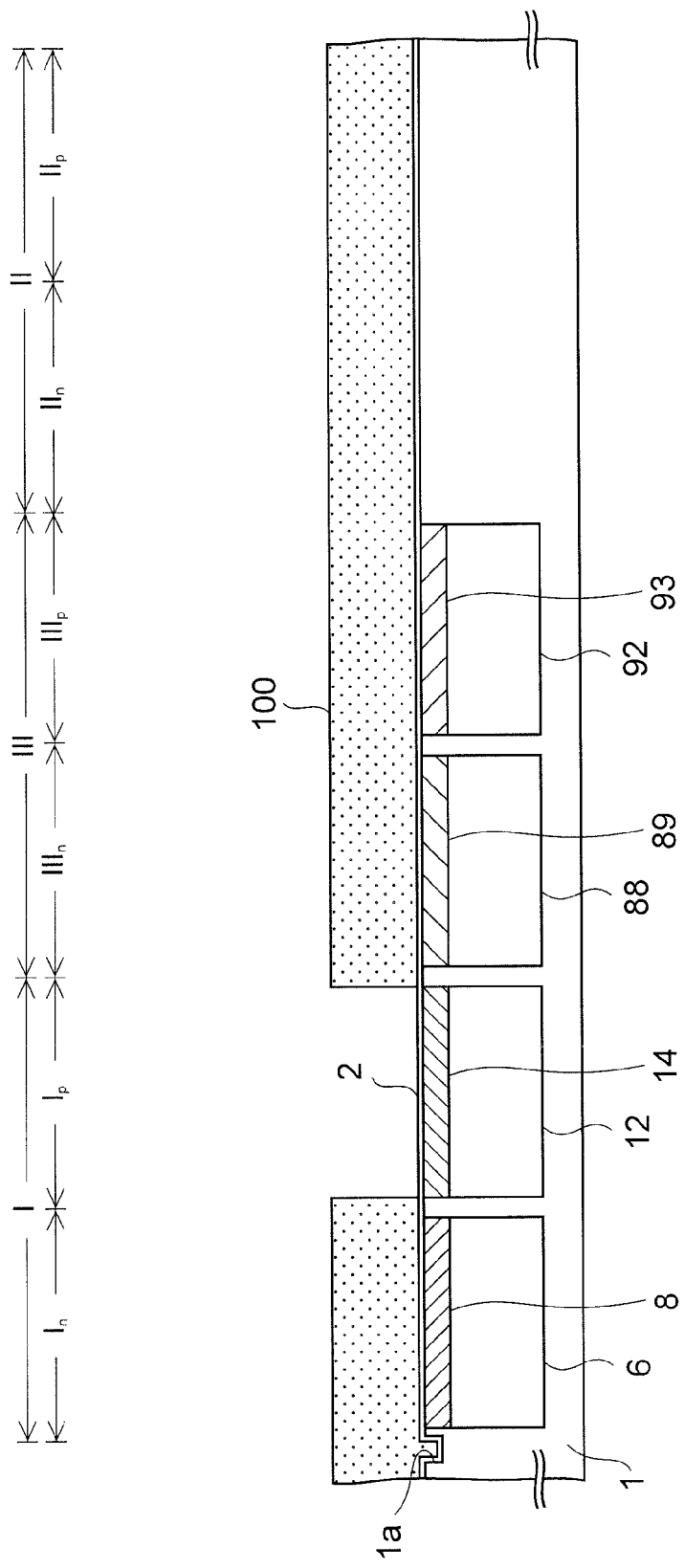
Figure 13F:
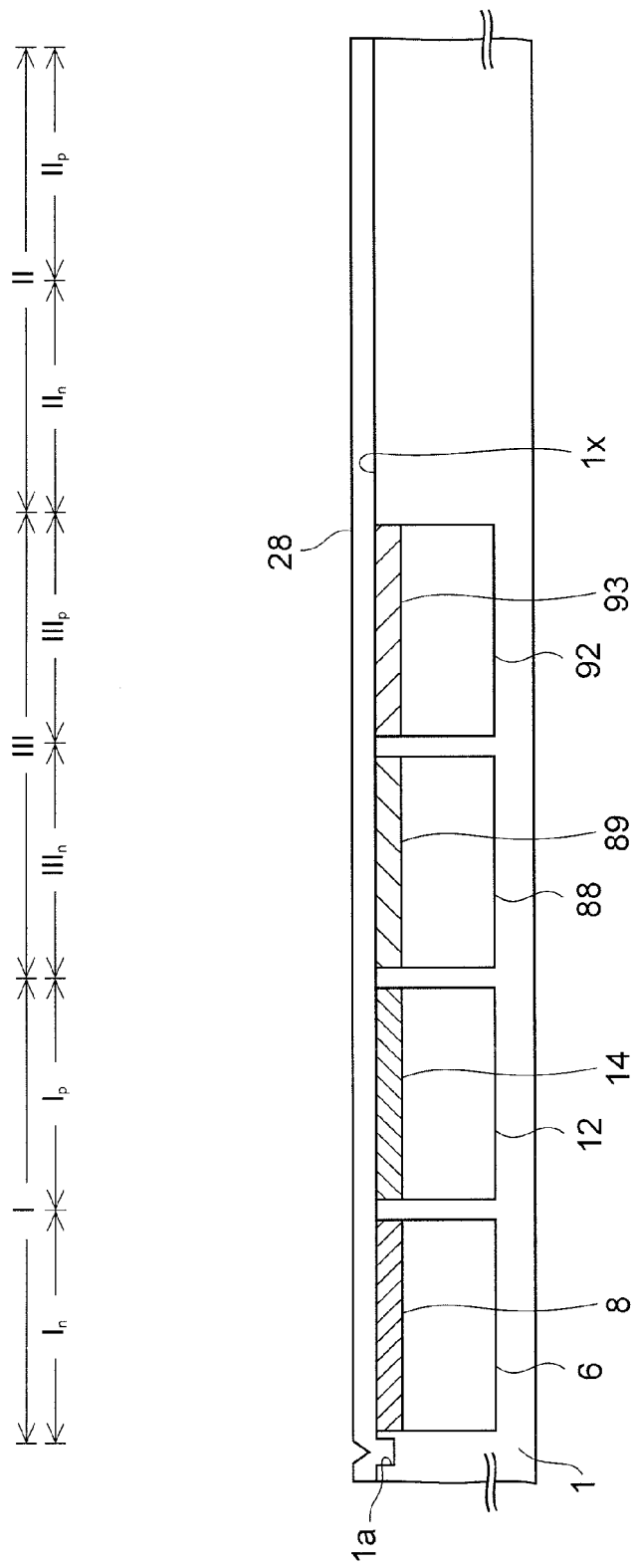
Figure 13G:
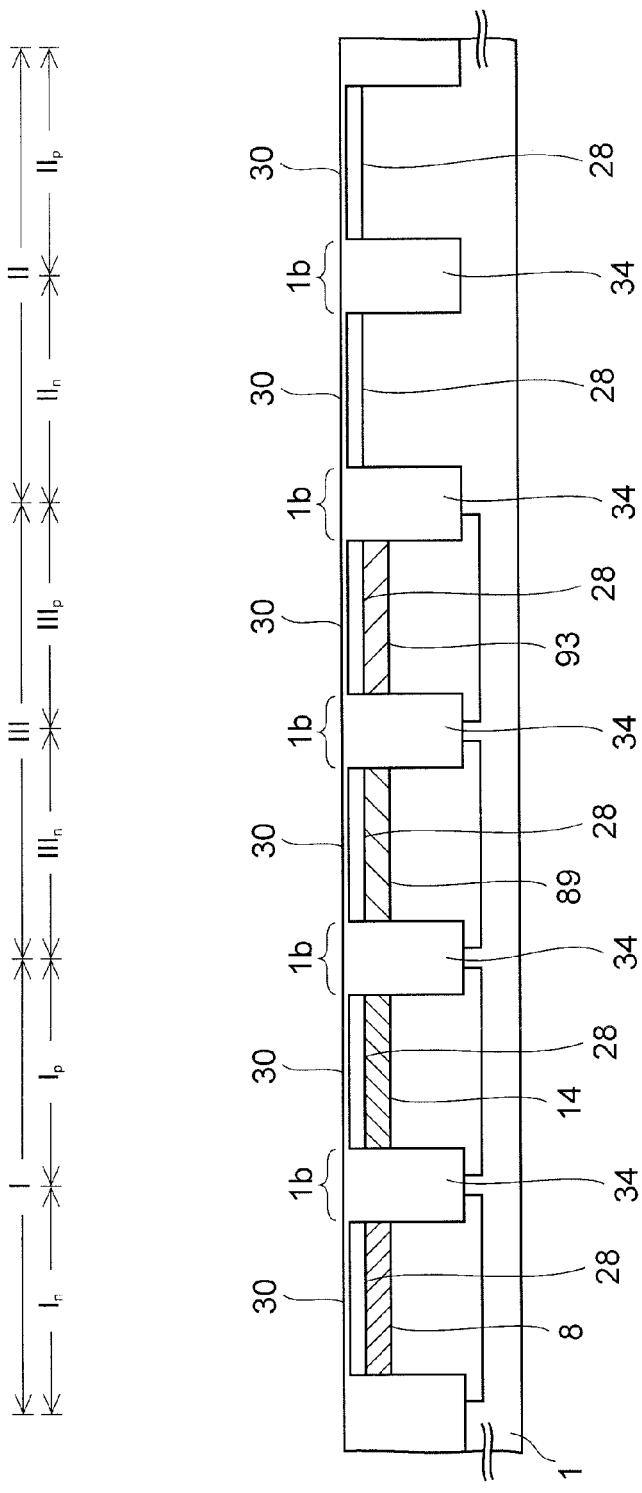
Figure 13H:
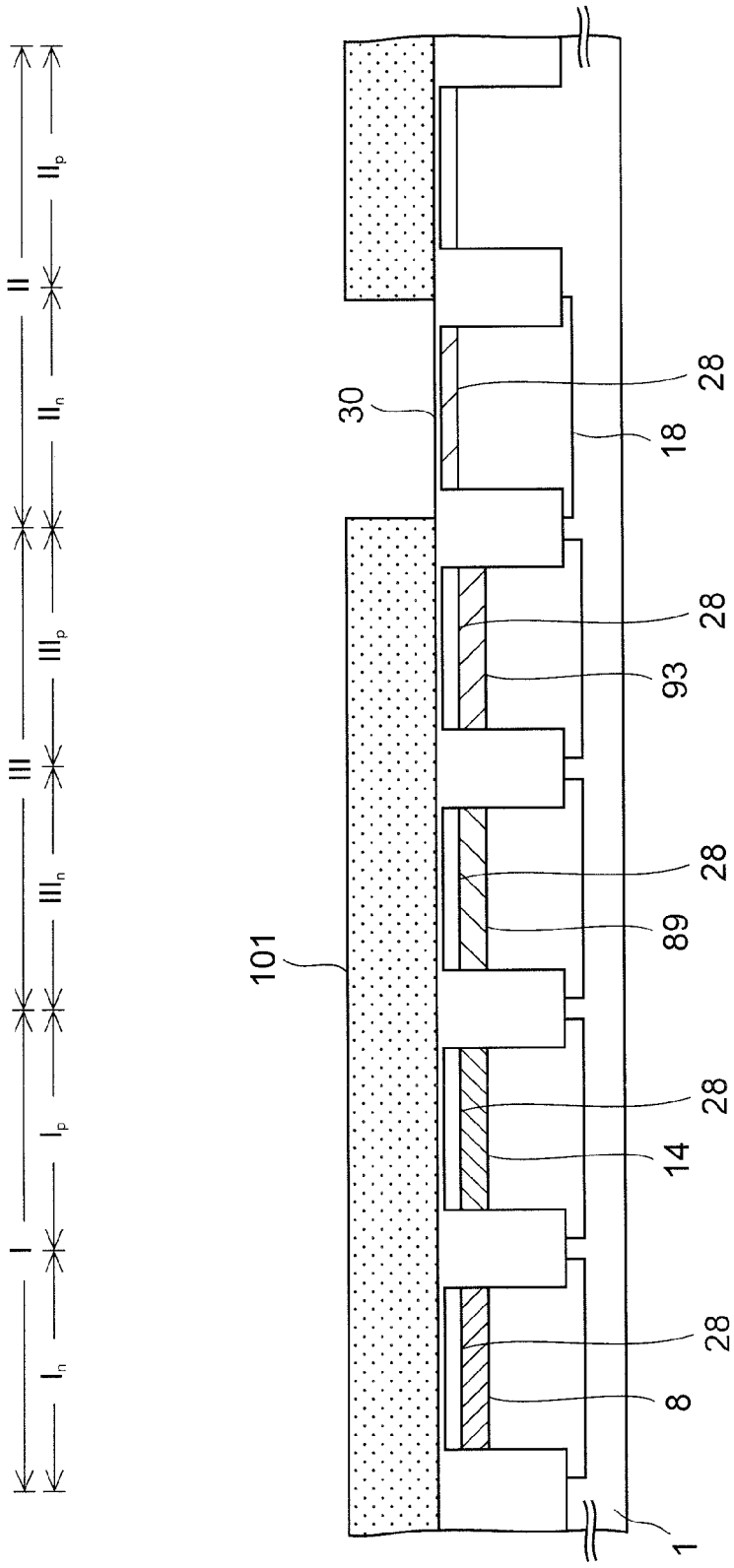
Figure 13I:
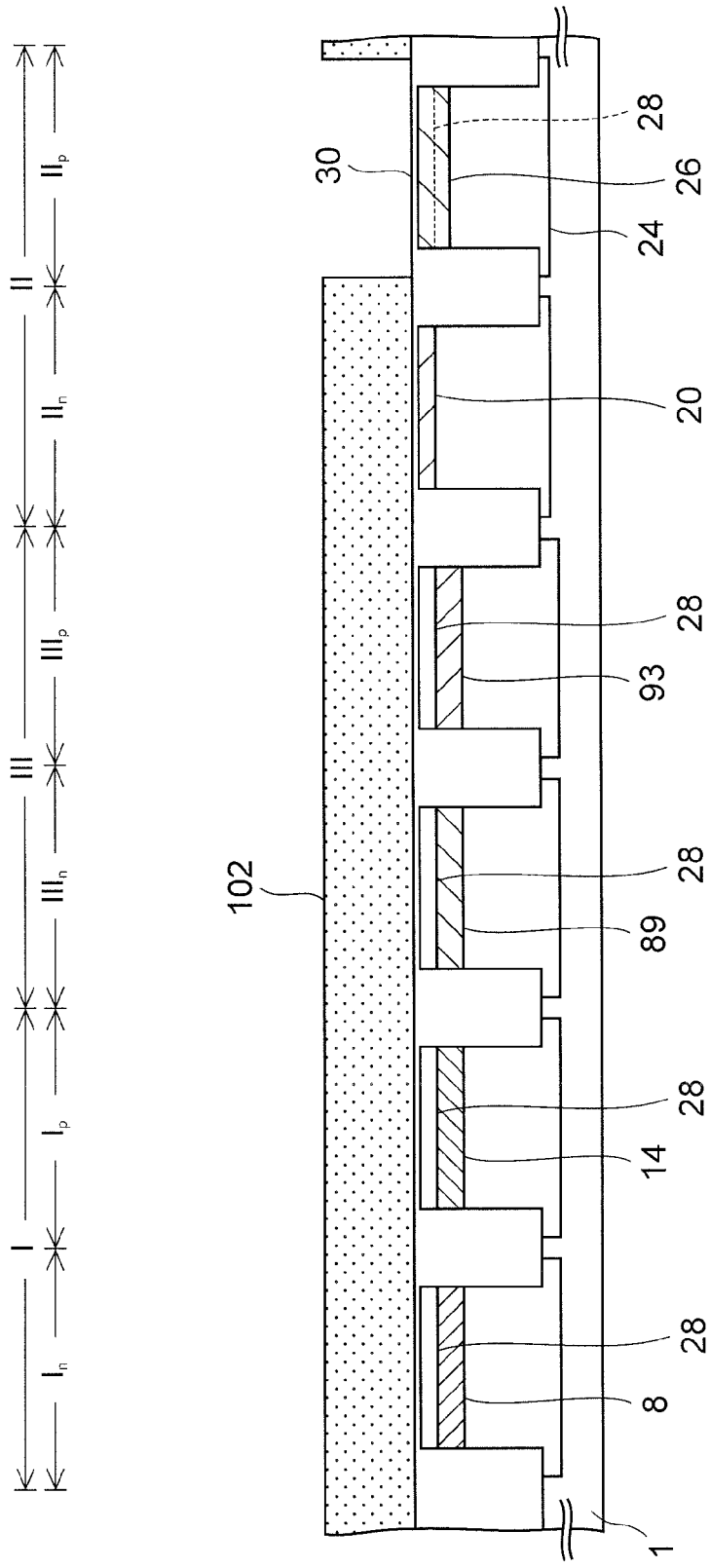
Figure 13J:
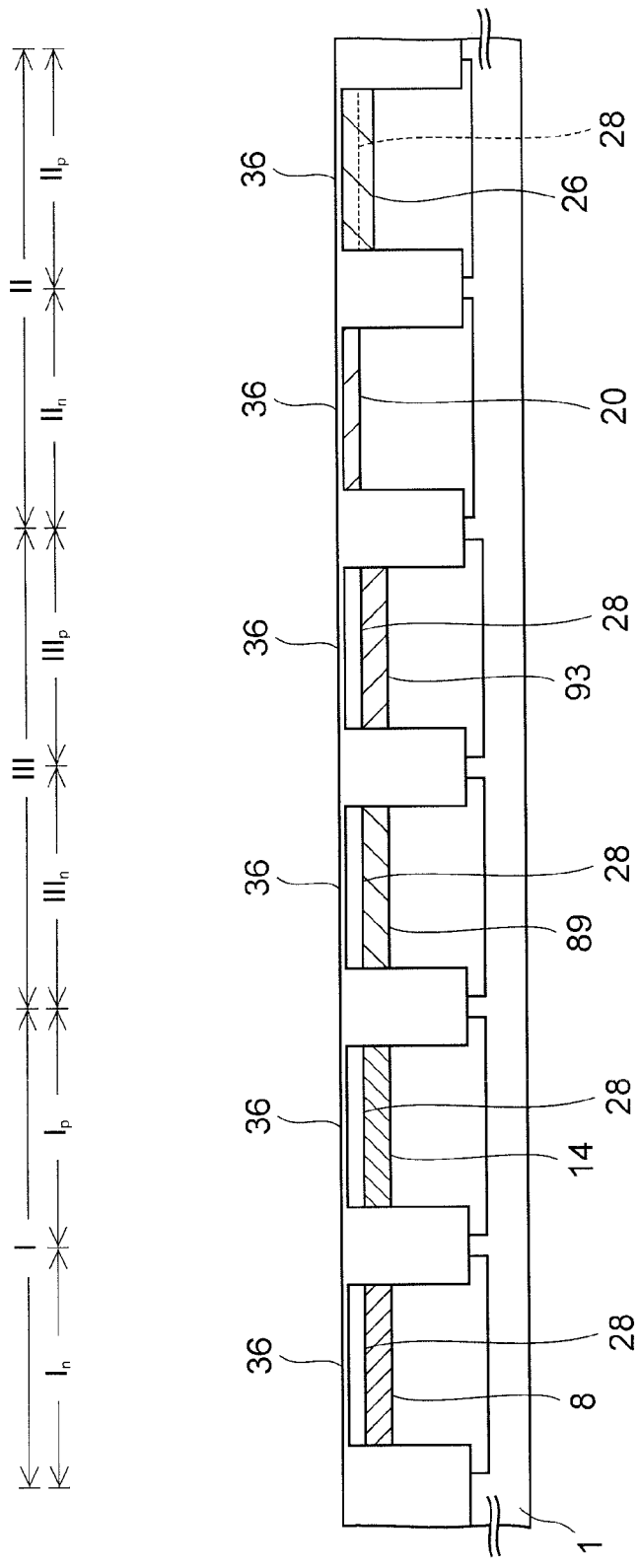
Figure 13K:
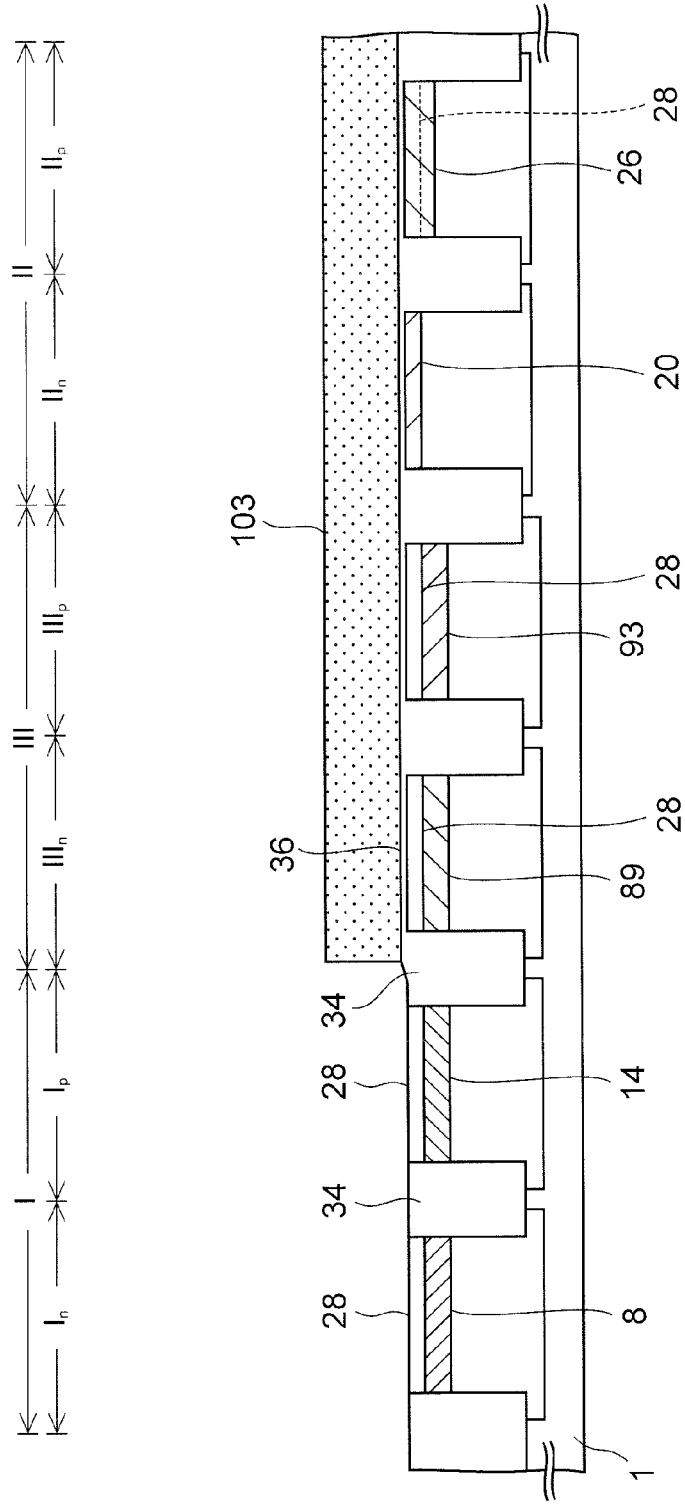
Figure 13L:
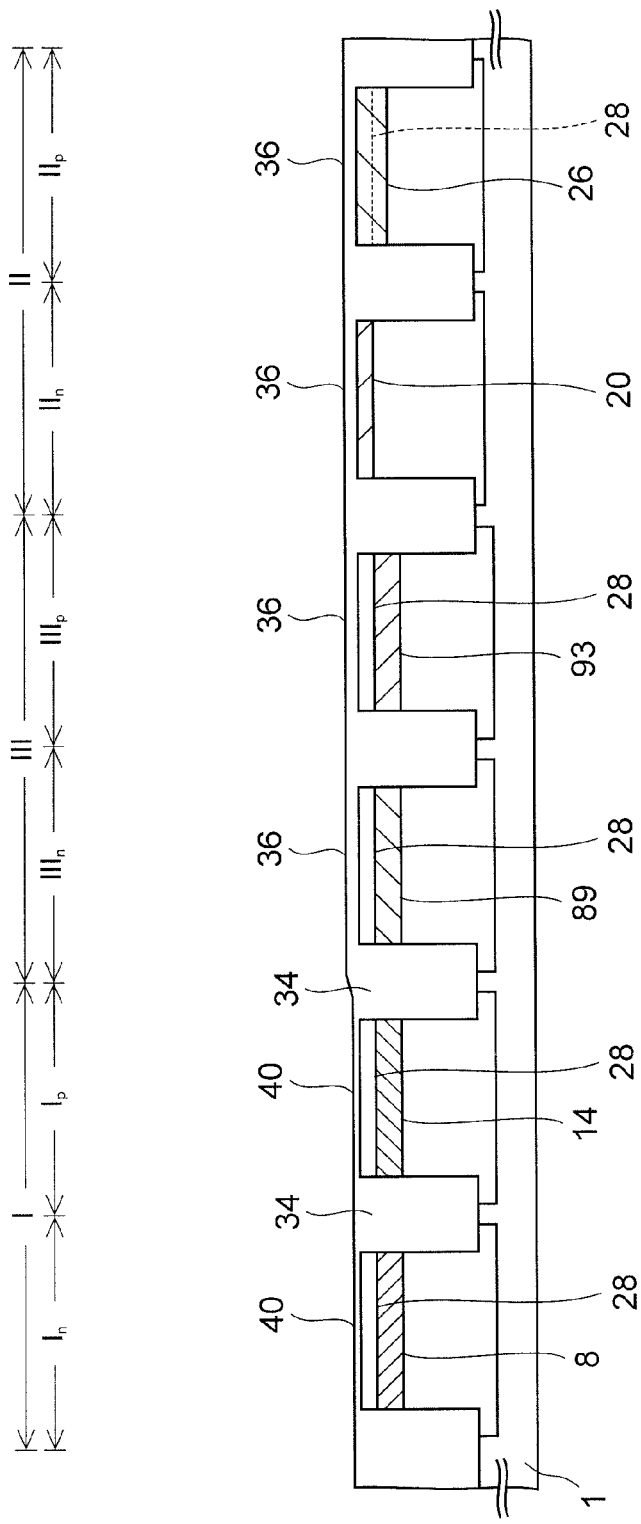
Figure 13M:
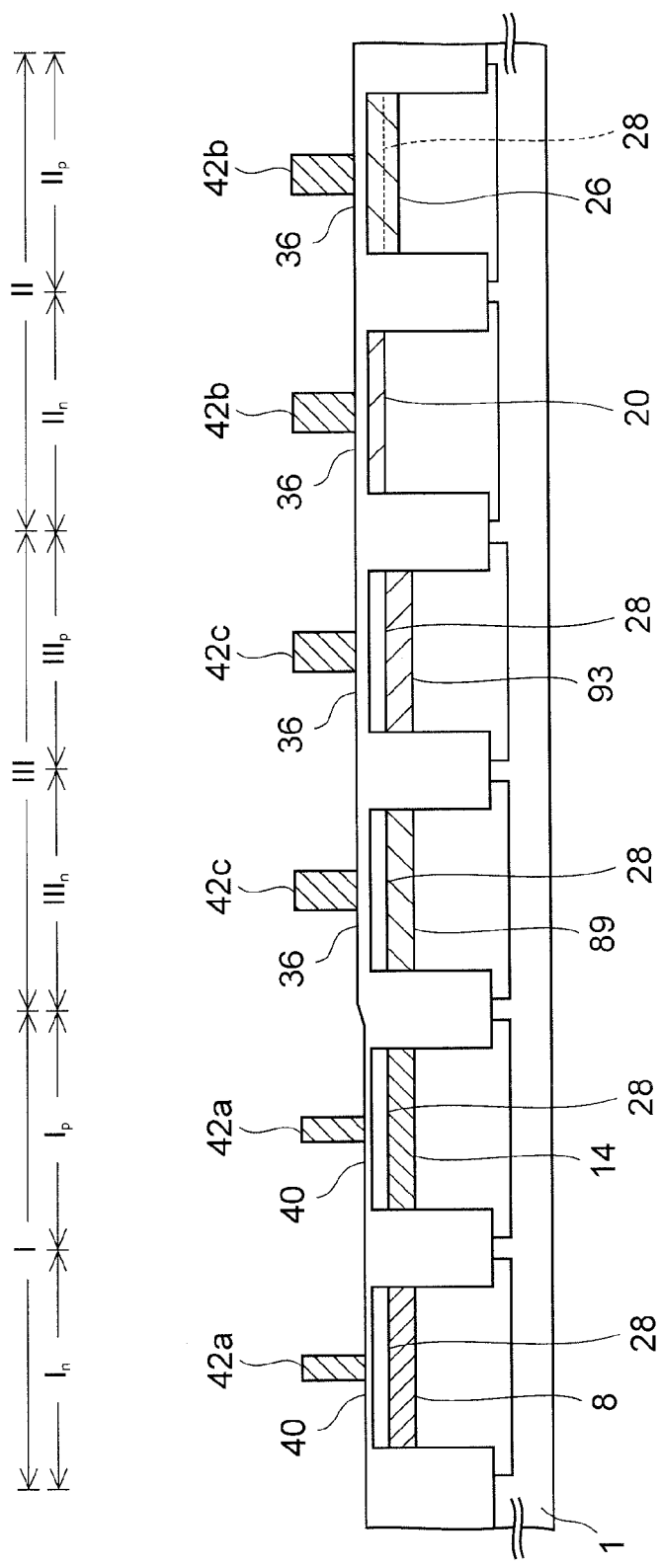
Figure 13N:
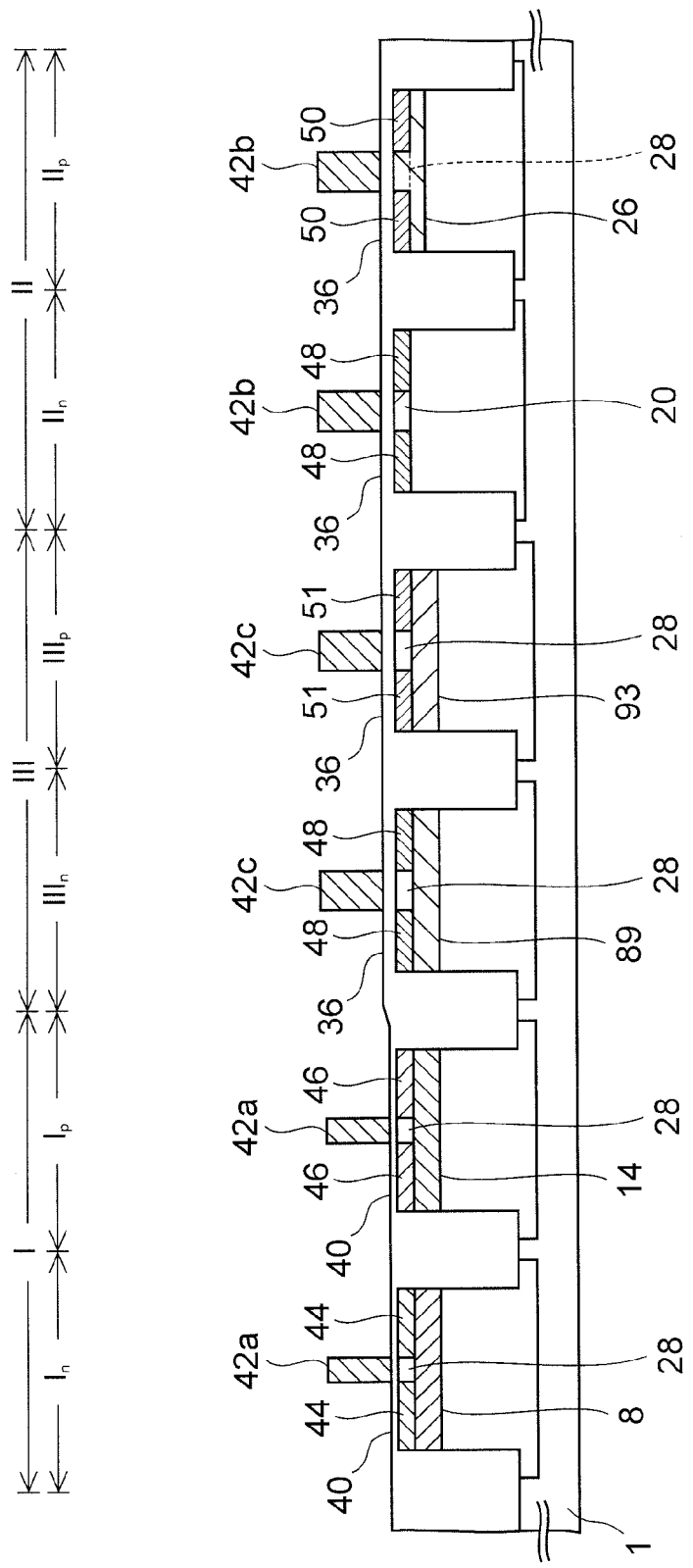
Figure 130:
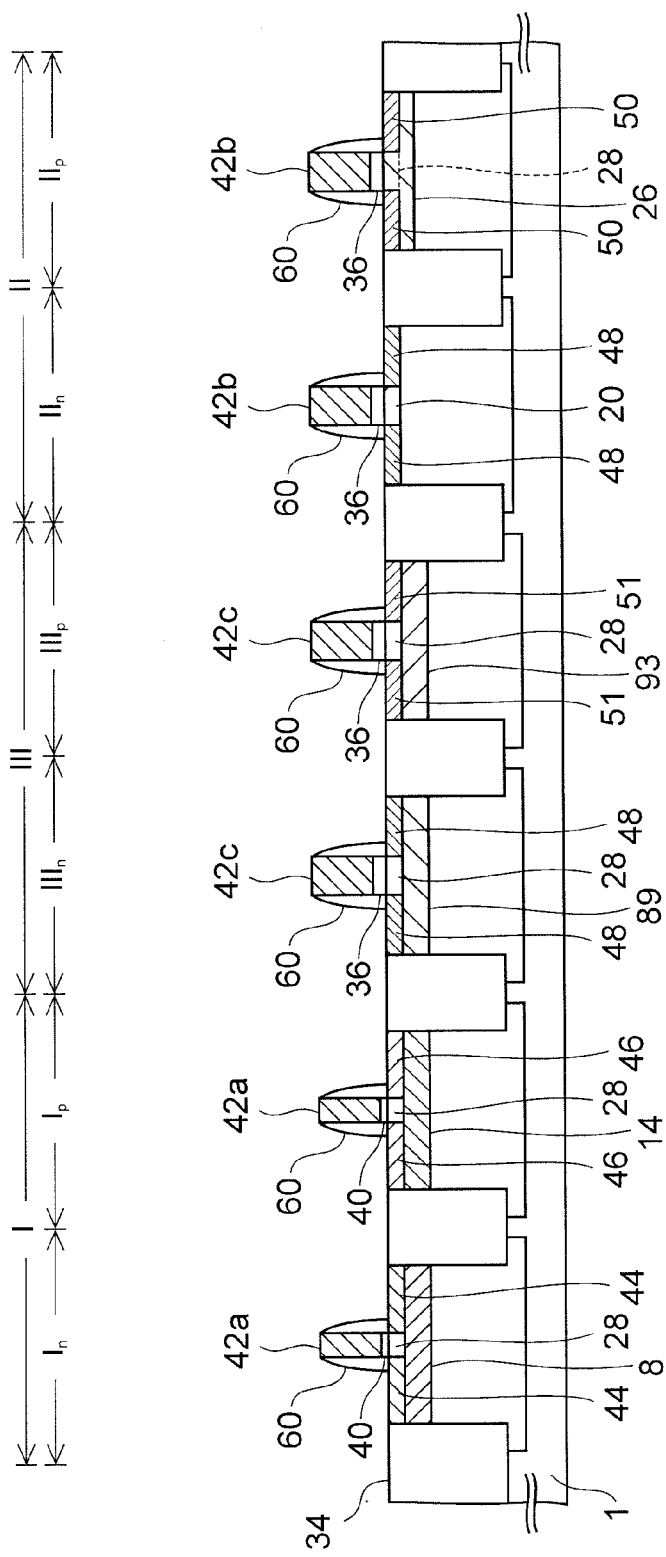
Figure 13P:
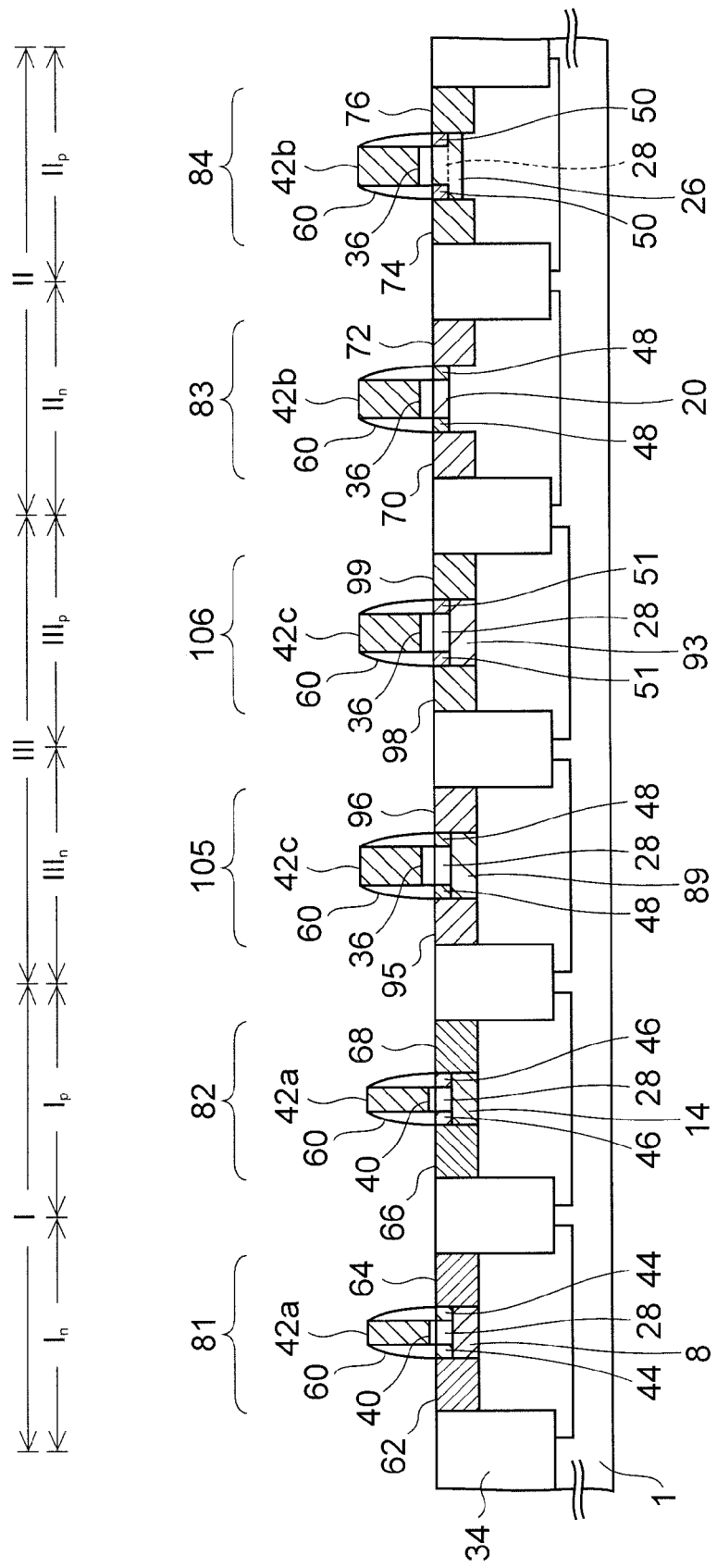
Figure 13Q:
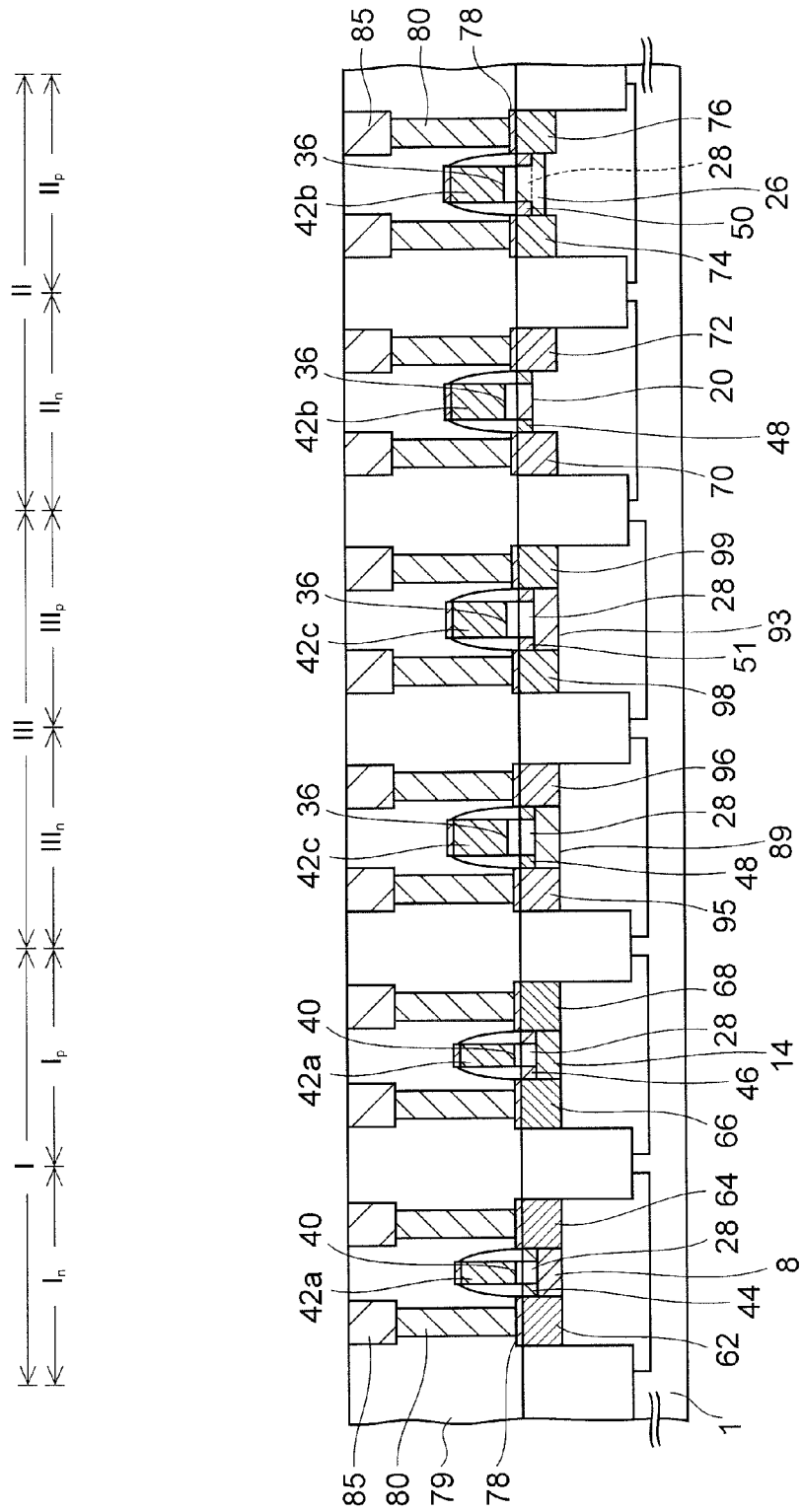

FIGS. 13A to 13Q are cross-sectional views of semiconductor devices in the course of manufacturing semiconductor devices according to the present embodiment. Note that, in FIGS. 13A to 13Q, like numerals refer to like components which have been explained in FIGS. 1A to 1R, and explanations are omitted below.

Firstly, as illustrated in FIG. 13A, a silicon substrate provided with first to third regions I to III is prepared as the semiconductor substrate 1.

Among these regions, the third region III is a region where an MOS transistor which uses a non-doped semiconductor layer as a channel and is driven at a high voltage is to be formed, and is subdivided into a third p-type transistor formation region $III_p$ and a third n-type transistor formation region $III_n$.

Further, the oxide film 2 is formed on the upper surface 1x of the semiconductor substrate 1 in a similar manner to the first embodiment.

Next, as illustrated in FIG. 13B, a sixth resist film 87 is formed on the oxide film 2 by photolithography.

Further, the first p well 6 is formed in the first n-type transistor formation region $I_n$ and a third p well 88 is simultaneously formed in the third n-type transistor formation region $III_n$ by ion implantation using the sixth resist film 87 as a mask.

The condition of the ion implantation is not specially limited. In the present embodiment, boron as a p-type impurity is ion implanted into the semiconductor substrate 1 from the four directions tilted with respect to the substrate normal direction under the condition where the acceleration energy is 150 keV and the dose amount is $7.5 \times 10^{12}$ cm$^{-2}$.

Thereafter, the sixth resist film 87 is continuously used as a mask to form the first p-type impurity region 8 and a third p-type impurity region 89 in the first n-type transistor formation region $I_n$ and the third n-type transistor formation region $III_n$ respectively.

These p-type impurity regions 8 and 89 function to adjust the threshold voltage of the transistors, and are formed by ion implantation of germanium, carbon, and a p-type impurity in this order.

Among them, the ion implantation of germanium is performed under the condition where the acceleration energy is 50 keV and the dose amount is $5 \times 10^{14}$ cm$^{-2}$, for example, and the ion implantation of carbon is performed under the condition where the acceleration energy is 5 keV and the dose amount is $5 \times 10^{14}$ cm$^{-2}$, for example. Further, in the ion implantation of the p-type impurity, for example, boron is implanted under the condition where the acceleration energy is 20 keV and the dose amount is $0.9 \times 10^{13}$ cm$^{-2}$, and successively, boron is implanted under the condition where the acceleration energy is 10 keV and the dose amount is $1 \times 10^{13}$ cm$^{-2}$. In addition, as the p-type impurity, boron difluoride ($BF_2$) is implanted at under the condition where the acceleration energy is 10 keV and the dose amount is $0.7 \times 10^{13}$ cm$^{-2}$.

As described earlier, the carbon which is ion implanted in this step functions to prevent boron included in each of the first p-type impurity region 8 and the third p-type impurity region 89 from being diffused. Note that, as an alternative to the boron, $BF_2$ may be used as a p-type impurity.

Thereafter, the sixth resist film 87 is removed.

Next, as illustrated in FIG. 13C, a seventh resist film 90 is formed on the oxide film 2 by photolithography, and boron difluoride is ion implanted into the first n-type transistor formation region $I_n$ using the seventh resist film 90 as a mask to increase the impurity concentration in the first p-type impurity region 8.

As for the condition of the ion implantation, for example, the condition where the acceleration energy is 10 keV and the dose amount is $0.4 \times 10^{13}$ cm$^{-2}$ may be employed.

Thereafter, the seventh resist film 90 is removed.

Subsequently, as illustrated in FIG. 13D, an eighth resist film 91 is formed on the oxide film 2 by photolithography.

Further, the first n well 12 is formed in the first p-type transistor formation region $I_p$ and a third n well 92 is simultaneously formed in the third p-type transistor formation region $III_p$, by ion implantation using the eighth resist film 91 as a mask.

The condition of the ion implantation is not specially limited. Phosphorus as an n-type impurity is ion implanted into the semiconductor substrate 1 from the four directions tilted with respect to the substrate normal direction under the condition where the acceleration energy is 360 keV and the dose amount is $7.5 \times 10^{12}$ cm$^{-2}$.

Thereafter, the n-type impurity is ion implanted into the semiconductor layer 28 continuously using the eighth resist film 91 as a mask to form the first n-type impurity region 14 and a third n-type impurity region 93 in the first p-type transistor formation region $I_p$ and the third p-type transistor formation region $III_p$, respectively.

Of these impurity regions, the third n-type impurity region 93 functions to adjust the threshold voltage of a transistor to be formed later in the third p-type transistor formation region $III_p$, and is formed by ion implantation of antimony as an n-type impurity. The antimony is implanted at a plurality of times under the following conditions. The first implantation condition is that the acceleration energy is 130 keV and the dose amount is $0.6 \times 10^{13}$ cm$^{-2}$, and the second implantation condition is that the acceleration energy is 80 keV and the dose amount is $0.9 \times 10^{13}$ cm$^{-2}$. Further, the third implantation condition is that the acceleration energy is 20 keV and the dose amount is $0.8 \times 10^{13}$ cm$^{-2}$.

Thereafter, the eighth resist film 91 is removed.

Next, as illustrated in FIG. 13E, after a ninth resist film 100 is formed on the oxide film 2 by photolithography, the concentration of an n-type impurity in the first n-type impurity region 14 is increased by ion implantation using the ninth resist film 100 as a mask. As the n-type impurity, for example, antimony may be implanted at the acceleration energy of 20 keV and the dose amount of $5 \times 10^{12}$ cm$^{-2}$.

Thereafter, the ninth resist film 100 is removed.

Next, thermal treatment is performed at 600° C. for 150 seconds in a nitrogen atmosphere on the semiconductor substrate 1 to recrystallize an amorphous layer generated in the semiconductor substrate 1 by the ion implantation of the germanium described above. Next, in a nitrogen atmosphere, thermal treatment is performed on the semiconductor substrate 1 at 1000° C. for 0.1 second or less.

Next, as illustrated in FIG. 13F, the oxide film 2 is removed by wet etching with a hydrofluoric acid solution. Further, on the upper surface 1x of the semiconductor substrate 1, a silicon layer serving as the semiconductor layer 28 is formed in such a manner to have a thickness of about 25 nm by an epitaxial growth method. In the epitaxial growth method, a mixed gas of a silane gas and a hydrogen gas is used as a deposition gas.

Subsequently, as illustrated in FIG. 13G, the same steps as FIGS. 1G to 1J stated above are performed to form an oxidized silicon film serving as the element isolation insulating film 34 in the element isolation trenches 1b of the semiconductor substrate 1, and to be in a state where the oxide film 30 having a thickness about 3 nm is remained on the semiconductor layer 28.

Note that, because the element isolation trenches 1b are provided in order to electrically isolate the regions $I_n$, $I_p$, $II_n$, $II_p$, $III_n$, and $III_p$ from one another, the element isolation trenches 1b are formed between the regions $I_n$, $I_p$, $II_n$, $II_p$, $III_n$, and $III_p$.

Thereafter, as illustrated in FIG. 13H, a tenth resist film 101 is formed on the oxide film 30 by photolithography. Further, the second p well 18 and the second p-type impurity region 20 are formed in the second n-type transistor formation region $II_n$ by ion implantation using the tenth resist film 101 as a mask.

The second p well 18 is formed by ion implantation of boron as a p-type impurity into the semiconductor substrate 1 from the four directions tilted with respect to the substrate normal direction under the condition where the acceleration energy is 150 keV and the dose amount is $7.5 \times 10^{12}$ cm$^{-2}$ under the condition.

Meanwhile, the second p-type impurity region 20 is formed by ion implantation of $BF_2$ as a p-type impurity into the semiconductor layer 28. The condition of the ion implantation is that, for example, the acceleration energy is 15 keV and the dose amount is $3 \times 10^{12}$ cm$^{-2}$.

The acceleration energy (15 keV) to $BF_2$ is identical with the acceleration energy used in the examination of FIG. 8. As having explained with reference to FIG. 8, using this acceleration energy makes it possible to effectively suppress a hump of the third MOS transistor 83 formed later in the second n-type transistor formation region $II_n$.

Thereafter, the tenth resist film 101 is removed.

Next, as illustrated in FIG. 13I, an eleventh resist film 102 is formed on the oxide film 30 by photolithography. Thereafter, the second n well 24 and the second n-type impurity region 26 are formed in the second p-type transistor formation region $II_p$ by ion implantation using the eleventh resist film 102 as a mask.

The second n well 24 is formed by ion implantation of phosphorus as an n-type impurity into the semiconductor substrate 1 from the four directions tilted with respect to the substrate normal direction under the condition where the acceleration energy is 360 keV and the dose amount is $7.5 \times 10^{12}$ cm$^{-2}$.

Moreover, the second n-type impurity region 26 is formed by ion implantation of arsenic as an n-type impurity into the semiconductor layer 28. The implantation condition of the arsenic is that, for example, the acceleration energy is 100 keV and the dose amount is $1 \times 10^{12}$ cm$^{-2}$.

Thereafter, the eleventh resist film 102 is removed.

Next, as illustrated in FIG. 13J, after the oxide film 30 is wet etched with a hydrofluoric acid solution, the surface of the semiconductor layer 28 is thermal oxidized to form the first thermal oxide film 36 having a thickness of approximately 7 nm. The condition of the thermal oxidization is not specially limited. In the present embodiment, the first thermal oxide film 36 is formed under the condition where the substrate temperature is at 750° C. and the thermal treatment time is for 52 minutes.

Next, as illustrated in FIG. 13K, a twelfth resist film 103 which covers the second region II and the third region III is formed on the first thermal oxide film 36. Further, the twelfth resist film 103 is used as a mask to remove the first thermal oxide film 36 in the first region I by wet etching with a hydrofluoric acid solution.

After completion of the wet etching, the twelfth resist film 103 is removed.

Thereafter, as illustrated in FIG. 13L, the surface of the semiconductor layer 28 is thermally oxidized again by RTO to from the second thermal oxide film 40 having a thickness of about 2 nm in the first region I. As for the deposition condition of the second thermal oxide film 40, for example, the condition where the substrate temperature is at 810° C. and the thermal treatment time is for eight seconds may be employed.

In this step, the thickness of the first thermal oxide film 36 is increased due to the thermal oxidization. Accordingly, the first thermal oxide film 36 having a film thickness thicker than the second thermal oxide film 40 is obtained. Note that, a portion of the first thermal oxide film 36 which is formed in the third region III is an example of a third gate insulating film.

Next, as illustrated in FIG. 13M, each polycrystalline silicon film having a film thickness of about 100 nm is formed on each of the first thermal oxide film 36 and the second thermal oxide film 40 by the CVD method. Further, the polycrystalline silicon films are patterned to form first to third gate electrodes 42a to 42c in the first to third regions I to III, respectively.

Next, steps to obtain a cross-sectional structure illustrated in FIG. 13N will be explained.

Firstly, phosphorus as an n-type impurity is ion implanted into the second n-type transistor formation region $II_n$ to form the second n-type extensions 48 at both sides of the second gate electrode 42b in the semiconductor layer 28.

In the ion implantation, phosphorus is ion implanted also into the third n-type transistor formation region $III_n$. Accordingly, the second n-type extensions 48 are also formed at both sides of the third gate electrode 42c in the semiconductor layer 28 in the region $III_n$.

The condition of the ion implantation is not specially limited. In the present embodiment, the ion implantation is performed under the condition where the acceleration energy is 35 keV and the dose amount is $3 \times 10^{13}$ cm$^{-2}$.

Next, arsenic as an n-type impurity is ion implanted into the first n-type transistor formation region I, to form the first n-type extensions 44 at both sides of the first gate electrode 42a in the semiconductor layer 28. The condition of the ion implantation is that, for example, the acceleration energy is 1 keV and the dose amount is $8 \times 10^{14}$ cm$^{-2}$.

Subsequently, boron as a p-type impurity is ion implanted into the first p-type transistor formation region $I_p$, the second p-type transistor formation region $II_p$, and the third p-type transistor formation region $III_p$ under the condition where the acceleration energy is 0.3 keV and the dose amount is $4 \times 10^{14}$ cm$^{-2}$. With this manner, the first p-type extensions 46, the second p-type extensions 50, and third p-type extensions 51 are formed to at both sides of the first gate electrode 42a, the second gate electrode 42b, and the third gate electrode 42c in the semiconductor layer 28, respectively.

Note that, the p-type impurity and the n-type impurity described above are separately ion implanted using resist films which are not illustrated.

Next, as illustrated in FIG. 13O, an insulating film is formed in each of the first to third regions I to III, and the insulating film is etched back by RIE leaving the insulating film on sides of each of the first to third gate electrodes 42a to 42c as the insulating side walls 60. The insulating film is, for example, an oxidized silicon film having a film thickness of approximately 80 nm and formed at the substrate temperature of 520° C.

Note that, in the etching back, portions of the first thermal oxide film 36 and the second thermal oxide film 40 which are not covered by the first to third gate electrodes 42a to 42c and the insulating side walls 60 are also etched. Accordingly, after the completion of the etching back, the surface of the semiconductor layer 28 is exposed.

Next, steps to obtain a cross-sectional structure illustrated in FIG. 13P will be explained.

Firstly, phosphorus as an n-type impurity is ion implanted into each of the first n-type transistor formation region $I_n$, the second n-type transistor formation region $II_n$, and the third n-type transistor formation region $III_n$.

With this manner, first to third n-type source regions 62, 70, and 95 and first to third n-type drain regions 64, 72, and 96 are formed in the respective regions $I_n$ to $III_n$ of the semiconductor substrate 1.

As for the condition of the ion implantation, for example, the condition where the acceleration energy is 8 keV and the dose amount is $1.2 \times 10^{16}$ cm$^{-2}$ may be employed.

Next, boron as a p-type impurity is ion implanted into each of the first p-type transistor formation region $I_p$, the second p-type transistor formation region $II_p$, and the third p-type transistor formation region $III_p$.

With this manner, first to third p-type source regions 66, 74, and 98 and first to third p-type drain regions 68, 76, and 99 are formed in the respective regions $I_p$ to $III_p$ of the semiconductor substrate 1.

As for the condition of the ion implantation, for example, the condition where the acceleration energy is 4 KeV and the dose amount is $6 \times 10^{15}$ cm$^{-2}$ may be employed.

Thereafter, the semiconductor substrate 1 is subjected to RTA (Rapid Thermal Anneal) under the condition where the substrate temperature is at 1025° C. to activate the impurities.

With the foregoing steps, the basic structures of fifth and sixth transistors 105 and 106 provided with the third gate electrodes 42c in the third region III, together with the first to fourth MOS transistors 81 to 84 explained in the first embodiment, are completed.

Among these transistors, the fifth MOS transistor 105 is an NMOS transistor, and the sixth MOS transistor 106 is a PMOS transistor.

Moreover, the fifth and sixth MOS transistors 105 and 106 are driven at a voltage higher than that of the first and second MOS transistors 81 and 82. Accordingly, the first thermal oxide film 36 provided for these gate insulating films has a film thickness thicker than the second thermal oxide film 40.

Then, the contact plug 80 and the copper wiring 85 are formed as illustrated in FIG. 13Q by performing the same steps as FIG. 1R to complete the basic structure of the semiconductor device according to the present embodiment.

With the present embodiment explained above, as illustrated in FIG. 13P, the fifth MOS transistor 105 serving as an NMOS transistor is formed in the third region III.

Although the fifth MOS transistor 105 is provided with the third p-type impurity region 89, carbon to suppress diffusion of boron is also ion implanted when the third p-type impurity region 89 is formed. Accordingly, the slightly small amount of boron is diffused into the third p-type impurity region 89.

In addition, in the third region III, the step of ion implanting the impurity into the semiconductor layer 28 is not performed between the period after the semiconductor layer 28 is formed and before the third gate electrodes 42c are formed. Accordingly, the fifth MOS transistor 105 in the third region III uses the semiconductor layer 28 with the upper surface 28x in which boron is not substantially included and with the low impurity concentration, as a channel.

Figure 14:
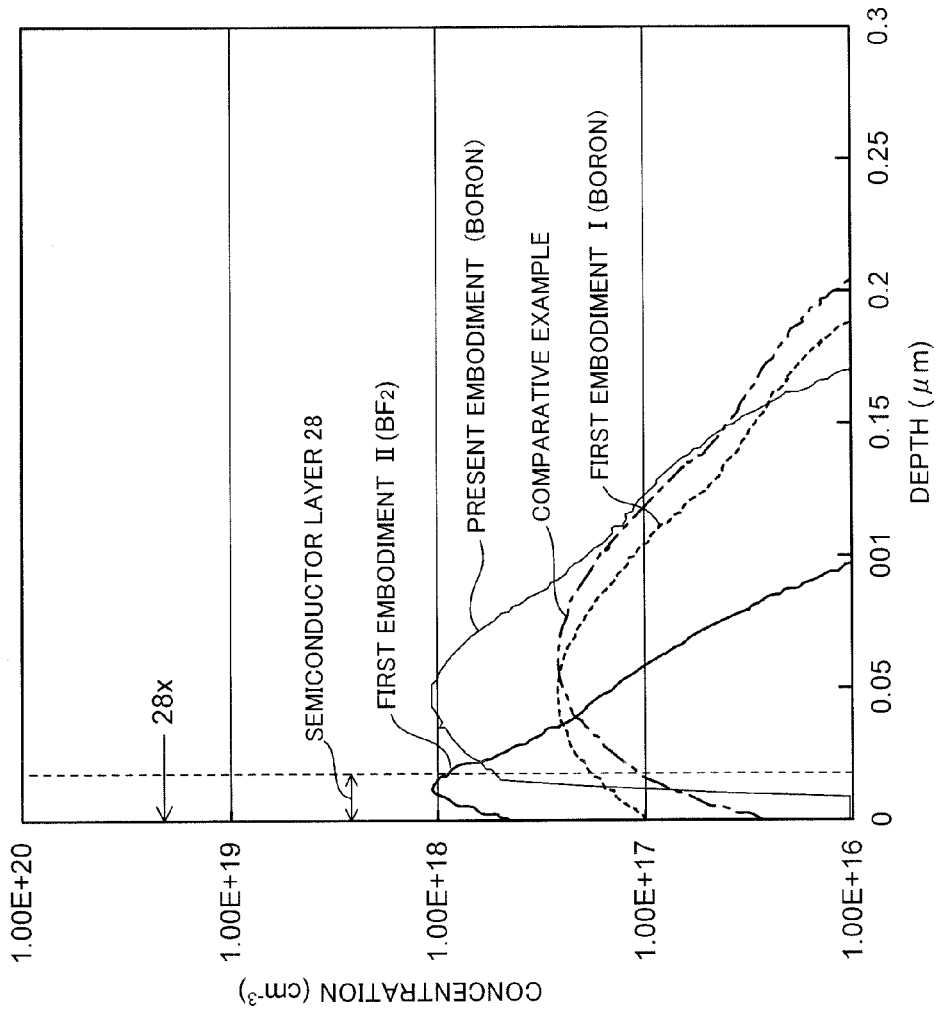
FIG. 14 illustrates a concentration profile of impurity in a third n-type transistor formation region in the second embodiment.

FIG. 14 illustrates a concentration profile of impurity of the semiconductor layer 28 in the third n-type transistor formation region $III_n$, and is a graph indicating a relation between the depth from the upper surface 28x of the semiconductor layer 28 and the concentration of a p-type impurity.

Note that, in FIG. 14, the concentration profiles of the first embodiment I, the first embodiment II, and the comparative example which are illustrated in FIG. 9 are also illustrated for comparison, in addition to the concentration profile of boron according to the present embodiment.

As illustrated in FIG. 14, the concentration profile of the present embodiment has the lowest impurity concentration in the upper surface 28x of the semiconductor layer 28 among the concentration profiles, and the p-type impurity is not substantially included in the upper surface 28x in the present embodiment.

In this manner, the semiconductor layer 28 with the low impurity concentration is used as a channel. Accordingly, a hump is less likely to be generated in the fifth MOS transistor 105 according to the present embodiment, as similar to the first MOS transistor in the first embodiment. In particular, because an analog circuit is affected by the variation of the threshold voltage of the MOS transistor, it is effective to use the MOS transistor 105 in which both of impurity variation (RDF) and a hump are suppressed.

Meanwhile, in the third MOS transistor 83 and the fourth MOS transistor 84 which are mounted together with the fifth MOS transistor 105, an impurity is implanted into the semiconductor layer 28 used as a channel. The structure in which the impurity is implanted into the channel in this manner is identical with that of an MOS transistor in which the semiconductor layer 28 is not formed, and an impurity is implanted into the surface layer of the semiconductor substrate 1 to use the surface layer portion as a channel. Such MOS transistors are widely used. Therefore, an advantage of capable of using the third MOS transistor 83 and the fourth MOS transistor 84 in an existing circuit without the design of the circuit being changed may be obtained in the present embodiment.

All examples and conditional language recited herein are intended for the pedagogical purposes of aiding the reader in understanding the invention and the concepts contributed by the inventor to further the art, and are not to be construed as limitations to such specifically recited examples and conditions, nor does the organization of such examples in the specification relate to a showing of the superiority and inferiority of the invention. Although one or more embodiments of the present invention have been described in detail, it should be understood that the various changes, substitutions, and alterations could be made hereto without departing from the spirit and scope of the invention.

What is claimed is:

1. A manufacturing method of a semiconductor device, comprising:
    implanting a first impurity into a first region of a semiconductor substrate including the first region and a second region;
    forming a semiconductor layer on the upper surface of the semiconductor substrate;
    forming a trench in the semiconductor layer and the semiconductor substrate;
    forming an isolation insulating film in the trench;
    implanting a second impurity into the semiconductor layer in the second region;
    forming a first gate insulating film on the semiconductor layer in the first region;
    forming a second gate insulating film on the semiconductor layer in the second region;
    forming a first gate electrode on the first gate insulating film;
    forming a second gate electrode on the second gate insulating film;
    forming a first source region and a first drain region in the semiconductor layer at both sides of the first gate electrode, the first source region and the first drain region having a conductivity type opposite to a conductivity type of the first impurity; and
    forming a second source region and a second drain region in the semiconductor layer at both sides of the second gate electrode, the second source region and the second drain region having a conductivity type opposite to a conductivity type of the second impurity, wherein implanting the first impurity is performed before forming the isolation insulating film and implanting the second impurity is performed after forming the isolation insulating film.

2. The manufacturing method of the semiconductor device according to claim 1, wherein in the implanting of the second impurity, a concentration peak of the second impurity is positioned in the semiconductor layer.

3. The manufacturing method of the semiconductor device according to claim 2, wherein implanting the second impurity includes implanting of $BF_2$ into the semiconductor layer at the acceleration energy of 15 keV or less.

4. The manufacturing method of the semiconductor device according to claim 2, wherein implanting the second impurity includes implanting boron into the semiconductor layer at the acceleration energy of 10 keV or less.

5. The manufacturing method of the semiconductor device according to claim 1, wherein between the formation of the semiconductor layer and the formation of the first gate electrode, implanting an impurity into the semiconductor layer in the first region is not performed.

6. The manufacturing method of the semiconductor device according to claim 5, wherein
the first impurity is boron or $BF_2$, and
the manufacturing method of the semiconductor device further comprise:
implanting carbon into the first region of the semiconductor substrate.

7. The manufacturing method of the semiconductor device according to claim 1, wherein in the forming of the second gate insulating film, the second gate insulating film is thicker than the first gate insulating film.

8. The manufacturing method of the semiconductor device according to claim 1, wherein the semiconductor layer is a silicon layer formed by an epitaxial growth method.

9. The manufacturing method of the semiconductor device according to claim 8, wherein the semiconductor layer has a thickness of 25 nm or more.

10. The manufacturing method of the semiconductor device according to claim 1, wherein the trench is formed between the first region and the second region.

* * * * *